US012575308B2

(12) United States Patent
Kim et al.

(10) Patent No.: US 12,575,308 B2
(45) Date of Patent: Mar. 10, 2026

(54) DISPLAY DEVICE

(71) Applicant: Samsung Display Co., LTD., Yongin-si (KR)

(72) Inventors: Ji Sun Kim, Seoul (KR); Young Wan Seo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 659 days.

(21) Appl. No.: 17/962,357

(22) Filed: Oct. 7, 2022

(65) Prior Publication Data

US 2023/0225178 A1 Jul. 13, 2023

(30) Foreign Application Priority Data

Jan. 10, 2022 (KR) ........................ 10-2022-0003184

(51) Int. Cl.
| | |
|---|---|
| *H10K 59/88* | (2023.01) |
| *G09G 3/3233* | (2016.01) |
| *H10K 59/131* | (2023.01) |
| *H10K 59/35* | (2023.01) |

(52) U.S. Cl.
CPC ........... *H10K 59/88* (2023.02); *G09G 3/3233* (2013.01); *G09G 2300/0413* (2013.01); *G09G 2300/0426* (2013.01); *G09G 2300/0452* (2013.01); *G09G 2300/0819* (2013.01);
(Continued)

(58) Field of Classification Search
CPC .... H10K 59/88; H10K 59/131; H10K 59/351;
H10K 59/35; G09G 3/3233; G09G
2300/0413; G09G 2300/0426; G09G
2300/0452; G09G 2300/0819; G09G
2300/0842; G09G 2300/0861; G09G
2320/0233; H10D 86/40; H10D 86/60
See application file for complete search history.

(56) References Cited

U.S. PATENT DOCUMENTS

| | | |
|---|---|---|
| 11,599,213 B2 | 3/2023 | Joo et al. |
| 11,922,843 B2 * | 3/2024 | Wang ..................... G09G 3/035 |
| 12,019,819 B2 | 6/2024 | Joo et al. |

(Continued)

FOREIGN PATENT DOCUMENTS

| | | |
|---|---|---|
| CN | 111863897 A | 10/2020 |
| KR | 10-2019-0027986 A | 3/2019 |

(Continued)

*Primary Examiner* — David Tung
(74) *Attorney, Agent, or Firm* — Womble Bond Dickinson (US) LLP

(57) ABSTRACT

A display device includes a substrate including a front portion, a first side portion extending from a first side of the front portion, a second side portion extending from a second side of the front portion, and a corner portion between the first side portion and the second side portion and having a cutout pattern, a first display area including first pixels in the front portion, and a second display area including second pixels and dummy pixel driving units in the cutout pattern of the corner portion. Each of the second pixels includes a subpixel light emitting unit emitting light and a subpixel driving unit connected to the subpixel light emitting unit. Any one of the dummy pixel driving units is closer to an edge of the cutout pattern than the subpixel driving unit of any one of the second pixels is the edge of the cutout pattern.

14 Claims, 35 Drawing Sheets

(52) U.S. Cl.
CPC .............. *G09G 2300/0842* (2013.01); *G09G 2300/0861* (2013.01); *H10K 59/131* (2023.02); *H10K 59/351* (2023.02)

(56) References Cited

U.S. PATENT DOCUMENTS

| | | | | |
|---|---|---|---|---|
| 12,144,232 B2 * | 11/2024 | He | ..................... | H10K 77/111 |
| 12,147,269 B2 * | 11/2024 | Gao | ..................... | G06F 1/1652 |
| 2005/0225708 A1 * | 10/2005 | Oke | ..................... | G09G 3/3607 |
| | | | | 349/139 |
| 2015/0211707 A1 * | 7/2015 | Watanabe | ................ | F21V 5/04 |
| | | | | 362/330 |
| 2019/0265824 A1 * | 8/2019 | Abe | ..................... | G06F 3/0412 |
| 2019/0269011 A1 * | 8/2019 | Lee | ..................... | H05K 3/0014 |
| 2020/0170126 A1 * | 5/2020 | Ahn | ..................... | G06F 1/1637 |
| 2020/0176696 A1 * | 6/2020 | Dai | ..................... | H10K 50/841 |
| 2020/0342816 A1 * | 10/2020 | Bok | ..................... | G09G 3/32 |
| 2022/0102462 A1 * | 3/2022 | Zhou | ................ | H10K 59/1201 |
| 2023/0044811 A1 | 2/2023 | Kim et al. | | |
| 2024/0319812 A1 | 9/2024 | Joo et al. | | |

FOREIGN PATENT DOCUMENTS

| | | | |
|---|---|---|---|
| KR | 10-2019-0121419 A | 10/2019 | |
| KR | 10-20210127281 A | 10/2021 | |

* cited by examiner

PX1 : SP1,SP2,SP3,SP4

ACT: DTCH, DTS, DTD, CH2, S2, D2, CH6, S6, D6
GTL1: DTG, G1, G6
GTL2: HVDL
DTL1: BE1, BE2, DL, VVDL
DTL2: BE3

ACT: CH6, S6, D6
GTL1: G6
DTL1: BE2
DTL2: BE3

ACT: CH6, S6, D6
GTL1: G6
DTL1: BE2
DTL2: BE3

VDL: HVDL, VVDL
ST3: ST3-1, ST3-2

DR7 — DR3
DR6

VDL: HVDL, VVDL
ST3: ST3-1, ST3-2

VDL: HVDL, VVDL, CVDL
ST3: ST3-1, ST3-2

FIG. 28

SPEU1_1
CL1
CL2
PEU2
C

SPEU2_1

SPEU3_1

CL3

SPDU1_1

SPDU2_1

SPDU3_1

DPU

DR7
DR6
DR3

▢ : DDA
▨ : DMA
▨ : SPEU1_1
▨ : SPEU2_1
▨ : SPEU3_1

VDL: HVDL, VVDL
ST1: ST1-1, ST1-2

VDL: HVDL, VVDL
ST1: ST1-1, ST1-2

DISPLAY DEVICE

CROSS-REFERENCE TO RELATED APPLICATION

This application claims priority to and the benefit of, Korean Patent Application No. 10-2022-0003184 filed on Jan. 10, 2022, in the Korean Intellectual Property Office (KIPO), the entire content of which is incorporated by reference herein.

BACKGROUND

1. Field

The present disclosure relates to a display device.

2. Description of the Related Art

As the information society develops, demands for display devices for displaying images are increasing in various forms. For example, display devices are being applied to various electronic devices such as smartphones, digital cameras, notebook computers, navigation devices, and smart televisions.

The display devices may be flat panel display devices such as liquid crystal display devices, field emission display devices, and light emitting display devices. The light emitting display devices include an organic light emitting display device including an organic light emitting element, an inorganic light emitting display device including an inorganic light emitting element such as an inorganic semiconductor, and a micro-light emitting display device including a micro-light emitting element.

As display devices are applied to various electronic devices, display devices having various designs may be desirable.

SUMMARY

One or more aspects of one or more embodiments of the present disclosure are directed toward a display device capable of displaying an image even in a corner portion due to pixels disposed in the corner portion. For example, the display device may display an image not only on a front portion but also on a bent portion at each of four edges of the front portion. In one or more embodiments, the display device may include a corner portion disposed between a first side portion bent at a first edge of the front portion and a second side portion bent at a second edge of the front portion.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate including a front portion, a first side portion extending from a first side of the front portion, a second side portion extending from a second side of the front portion, and a corner portion between the first side portion and the second side portion and having a cutout pattern, a first display area including first pixels in the front portion, and a second display area including second pixels and dummy pixel driving units in the cutout pattern of the corner portion.

Each of the second pixels includes a subpixel light emitting unit emitting light and a subpixel driving unit connected to the subpixel light emitting unit. Any one of the dummy pixel driving units is closer to an edge of the cutout pattern than the subpixel driving unit of any one of the second pixels is to the edge of the cutout pattern.

The second display area may include a driving area in which the subpixel driving units of the second pixels are located and a dummy area in which the dummy pixel driving units are located. The dummy area may surround the driving area.

Each of the dummy pixel driving units may overlap the subpixel light emitting unit.

The display device may further include a connection line connecting the subpixel light emitting unit and the subpixel driving unit.

The connection line may overlap one or more of the dummy pixel driving units.

Each of the dummy pixel driving units may include a driving transistor, a first transistor connected to a first electrode of the driving transistor, a second transistor between a gate electrode and a second electrode of the driving transistor, a third transistor between the gate electrode of the driving transistor and an initialization voltage line to which an initialization voltage is to be applied, a fourth transistor between the second electrode of the driving transistor and the initialization voltage line, and a fifth transistor between the first electrode of the driving transistor and a first power line to which a first power supply voltage is to be applied.

At least one of a gate electrode of the first transistor, a gate electrode of the second transistor, a gate electrode of the third transistor, a gate electrode of the fourth transistor, and a gate electrode of the fifth transistor may be connected to the first power line.

The gate electrode of the first transistor, the gate electrode of the second transistor, the gate electrode of the third transistor, the gate electrode of the fourth transistor, and the gate electrode of the fifth transistor may be connected to the first power line.

A first electrode of the first transistor may be connected to a data line to which a data voltage is to be applied.

The first electrode of the first transistor may be connected to a dummy data line to which no voltage is to be applied.

The first electrode of the first transistor may be connected to the first power line.

An area of the subpixel driving unit may be the same as an area of any one of the dummy pixel driving units.

A length of the subpixel driving unit in one direction may be the same as a length of any one of the dummy pixel driving units in the one direction.

A length of the subpixel driving unit in another direction may be the same as a length of any one of the dummy pixel driving units in the other direction. The other direction is orthogonal to the one direction.

According to one or more embodiments of the present disclosure, there is provided a display device including a substrate including a front portion, a first side portion extending from a first side of the front portion, a second side portion extending from a second side of the front portion, and a corner portion between the first side portion and the second side portion and having a cutout pattern, a first display area including first pixels in the front portion, and a second display area including second pixels, first dummy pixel driving units, and second dummy pixel driving units in the cutout pattern of the corner portion. An area of any one of the first dummy pixel driving units is different from an area of any one of the second dummy pixel driving units.

Any one of the first dummy pixel driving units may be disposed closer to an edge of the cutout pattern than a second pixel driving unit of any one of the second pixels is to the edge of the cutout pattern. Any one of the second dummy pixel driving units may be closer to the other edge of the cutout pattern than the second pixel driving unit is to the edge of the cutout pattern.

A length of any one of the first dummy pixel driving units in one direction may be longer than a length of any one of the second dummy pixel driving units in the one direction.

A length of any one of the first dummy pixel driving units in another direction may be the same as a length of any one of the second dummy pixel driving units in the other direction. The other direction may be orthogonal to the one direction.

The second display area may further include third dummy pixel driving units. An area of any one of the third dummy pixel driving units may be different from an area of any one of the first dummy pixel driving units or an area of any one of the second dummy pixel driving units.

A length of any one of the third dummy pixel driving units in the one direction may be the same as the length of any one of the first dummy pixel driving units in the one direction.

A length of any one of the third dummy pixel driving units in the other direction may be shorter than the length of any one of the first dummy pixel driving units in the other direction.

The second display area may further include a fourth dummy pixel driving unit. An area of the fourth dummy pixel driving unit may be different from the area of any one of the first dummy pixel driving units, the area of any one of the second dummy pixel driving units, and the area of any one of the third dummy pixel driving units.

A length of the fourth dummy pixel driving unit in the one direction may be shorter than the length of any one of the first dummy pixel driving units in the one direction. A length of the fourth dummy pixel driving unit in the other direction may be shorter than the length of any one of the first dummy pixel driving units in the other direction.

According to the aforementioned and other embodiments of the present disclosure, display areas may be disposed on a front portion of a display panel, a first side portion, a second side portion, and a corner portion where the first side portion and the second side portion meet. Therefore, an image can be displayed on the front portion, the first side portion, the second side portion, and the corner portion of the display panel.

According to the aforementioned and other embodiments of the present disclosure, a second display area includes dummy pixel driving units. Therefore, the density of circuit patterns of a first pixel driving area of the second display area may be similar to the density of circuit patterns of a second pixel driving area of a third display area. In this case, there may be little difference between a line width of the circuit patterns of the first pixel driving area and a line width of the circuit patterns of the second pixel driving area formed by an etching process. Therefore, it is possible to prevent or reduce a difference between the luminance of light emitted from subpixel light emitting units of second pixels and the luminance of light emitted from subpixel light emitting units of third pixels.

BRIEF DESCRIPTION OF THE DRAWINGS

The above and other embodiments and features of the present disclosure will become more apparent by describing embodiments thereof with reference to the attached drawings, in which:

FIG. 28 is a detailed layout view of an example of a dummy pixel driving unit of FIG. 27);

DETAILED DESCRIPTION

Figure 1:
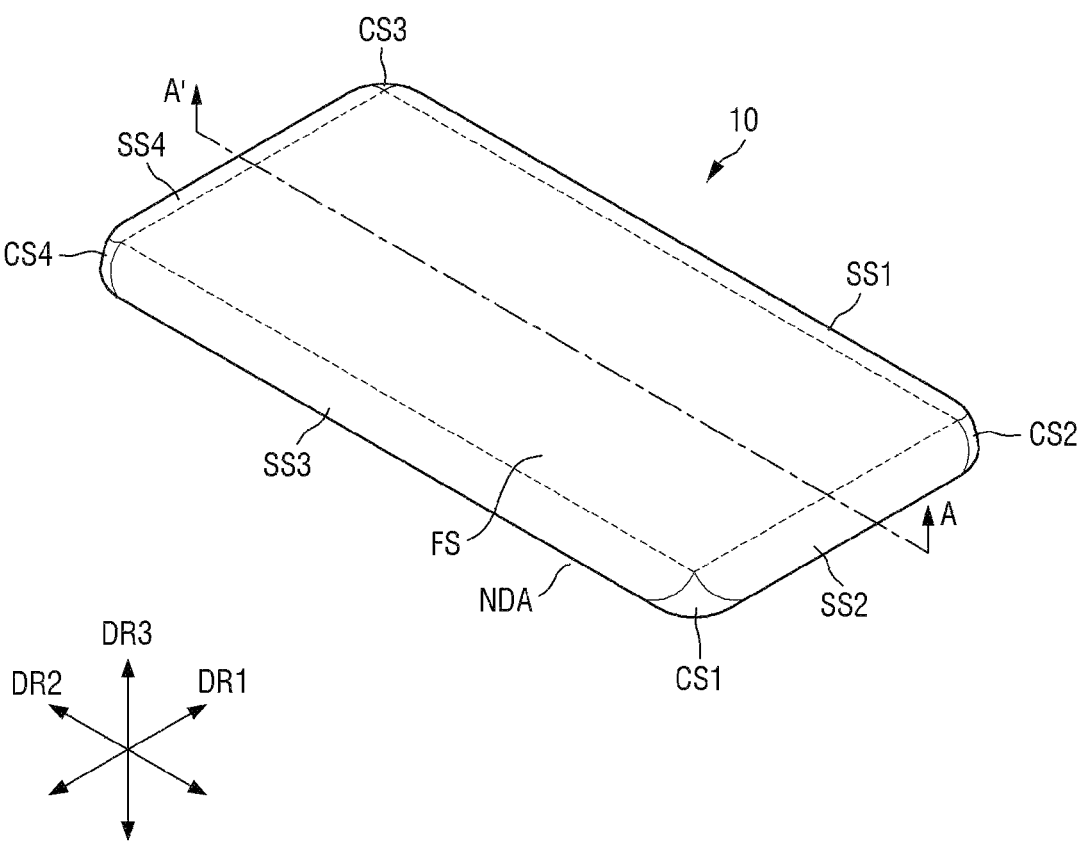
FIG. 1 is a perspective view of a display device according to an embodiment.

One or more aspects of one or more embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof may not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It should be apparent, however, that various embodiments may be practiced without these specific details or with one or more equivalent arrangements. In other instances, well-known structures and devices may be shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," refers to viewing a target portion from the top, and the phrase "on a cross-section" or "cross-sectional view" refers to viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component therebetween. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

Further, the use of "may" when describing embodiments of the present disclosure refers to "one or more embodiments of the present disclosure."

For the purposes of this disclosure, expressions such as "at least one of," "one of," "at least one selected from," and the like, when preceding a list of elements, modify the entire list of elements and do not modify the individual elements of the list. For example, "at least one of X, Y, and/or Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and/or B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to or different from the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of one or more embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

FIG. 1 is a perspective view of a display device 10 according to an embodiment.

Referring to FIG. 1, the display device 10 according to the embodiment may be applied to portable electronic devices such as mobile phones, smartphones, tablet personal computers (PCs), mobile communication terminals, electronic notebooks, electronic books, portable multimedia players (PMPs), navigation devices, and/or ultra-mobile PCs (UMPCs). Alternatively, the display device 10 according to the embodiment may be applied as a display unit of a television, a notebook computer, a monitor, a billboard, or an Internet of things (IoT) device. Alternatively, the display device 10 according to the embodiment may be applied to wearable devices such as smart watches, watch phones, glass-like displays, and head-mounted displays (HMDs). Alternatively, the display device 10 according to the embodiment may be applied to a dashboard of a vehicle, a center fascia of a vehicle, a center information display (CID) disposed on a dashboard of a vehicle, a room mirror display replacing a side mirror of a vehicle, or a display disposed on the back of a front seat as an entertainment for rear-seat passengers of a vehicle.

The display device 10 according to the embodiment may include a display panel 100 including a front portion FS, a first side portion SS1, a second side portion SS2, a third side portion SS3, a fourth side portion SS4, a first corner portion CS1, a second corner portion CS2, a third corner portion CS3, and a fourth corner portion CS4.

In the present disclosure, a short side direction of the display panel 100 may extend in a first direction DR1, for example, a horizontal direction of the display panel 100. A long side direction of the display panel 100 may extend in a second direction DR2, for example, a vertical direction of the display panel 100. A third direction DR3 may be a thickness direction of the display panel 100.

In one or more embodiments, the display panel 100 may be a light emitting display panel including a light emitting element. For example, the display panel 100 may be an organic light emitting display panel using an organic light emitting diode including an organic light emitting layer, a micro-light emitting diode display panel using a micro-light emitting diode, a quantum dot light emitting display panel using a quantum dot light emitting diode including a quantum dot light emitting layer, or an inorganic light emitting display panel using an inorganic light emitting element including an inorganic semiconductor. Hereinafter, the display panel 100 will be mainly described as an organic light emitting display panel.

The front portion FS may have a quadrilateral planar shape having short sides extending in the first direction DR1 and long sides extending in the second direction DR2, but the present disclosure is not limited thereto. The front portion FS also may have other polygonal, circular, or elliptical planar shape. In FIG. 1, the front portion FS is formed to be flat, but the present disclosure is not limited thereto. The front portion FS also may include a curved surface.

The first side portion SS1 may extend from a first side of the front portion FS. The first side portion SS1 may be bent along a first bending line (BL1 of FIG. 2) on the first side of the front portion FS and thus may have a first curvature. The first side of the front portion FS may be a right side of the front portion FS as illustrated in FIG. 1.

The second side portion SS2 may extend from a second side of the front portion FS. The second side portion SS2 may be bent along a second bending line (BL2 of FIG. 2) on the second side of the front portion FS and thus may have a second curvature. The second curvature may be different from the first curvature, but the present disclosure is not limited thereto. The second side of the front portion FS may be a lower side of the front portion FS as illustrated in FIG. 1.

The third side portion SS3 may extend from a third side of the front portion FS. The third side portion SS3 may be bent along a third bending line (BL3 of FIG. 2) on the third side of the front portion FS and thus may have a third curvature. The third curvature may be the same as the second curvature, but the present disclosure is not limited thereto.

The third side of the front portion FS may be a left side of the front portion FS as illustrated in FIG. 1.

The fourth side portion SS4 may extend from a fourth side of the front portion FS. The fourth side portion SS4 may be bent along a fourth bending line (BL4 of FIG. 2) on the fourth side of the front portion FS and thus may have a fourth curvature. The fourth curvature may be the same as the first curvature, but the present disclosure is not limited thereto. The fourth side of the front portion FS may be an upper side of the front portion FS as illustrated in FIG. 1.

The first corner portion CS1 may be disposed between the first side portion SS1 and the second side portion SS2. For example, the first corner portion CS1 may be in contact with a lower side of the first side portion SS1 and a left side of the second side portion SS2. The first corner portion CS1 may be a double curvature area bent by the first curvature of the first side portion SS1 and the second curvature of the second side portion SS2. Therefore, strain may be applied to the first corner portion CS1 by a bending force of the first curvature of the first side portion SS1 and a bending force of the second curvature of the second side portion SS2.

The second corner portion CS2 may be disposed between the second side portion SS2 and the third side portion SS3. For example, the second corner portion CS2 may be in contact with a right side of the second side portion SS2 and a lower side of the third side portion SS3. The second corner portion CS2 may be a double curvature area bent by the second curvature of the second side portion SS2 and the third curvature of the third side portion SS3. Therefore, strain may be applied to the second corner portion CS2 by a bending force of the second curvature of the second side portion SS2 and a bending force of the third curvature of the third side portion SS3.

The third corner portion CS3 may be disposed between the third side portion SS3 and the fourth side portion SS4. For example, the third corner portion CS3 may be in contact with an upper side of the third side portion SS3 and a right side of the fourth side portion SS4. The third corner portion CS3 may be a double curvature area bent by the third curvature of the third side portion SS3 and the fourth curvature of the fourth side portion SS4. Therefore, strain may be applied to the third corner portion CS3 by a bending force of the third curvature of the third side portion SS3 and a bending force of the fourth curvature of the fourth side portion SS4.

The fourth corner portion CS4 may be disposed between the first side portion SS1 and the fourth side portion SS4. For example, the fourth corner portion CS4 may be in contact with an upper side of the first side portion SS1 and a left side of the fourth side portion SS4. The fourth corner portion CS4 may be a double curvature area bent by the first curvature of the first side portion SS1 and the fourth curvature of the fourth side portion SS4. Therefore, strain may be applied to the fourth corner portion CS4 by a bending force of the first curvature of the first side portion SS1 and a bending force of the fourth curvature of the fourth side portion SS4.

Figure 4:
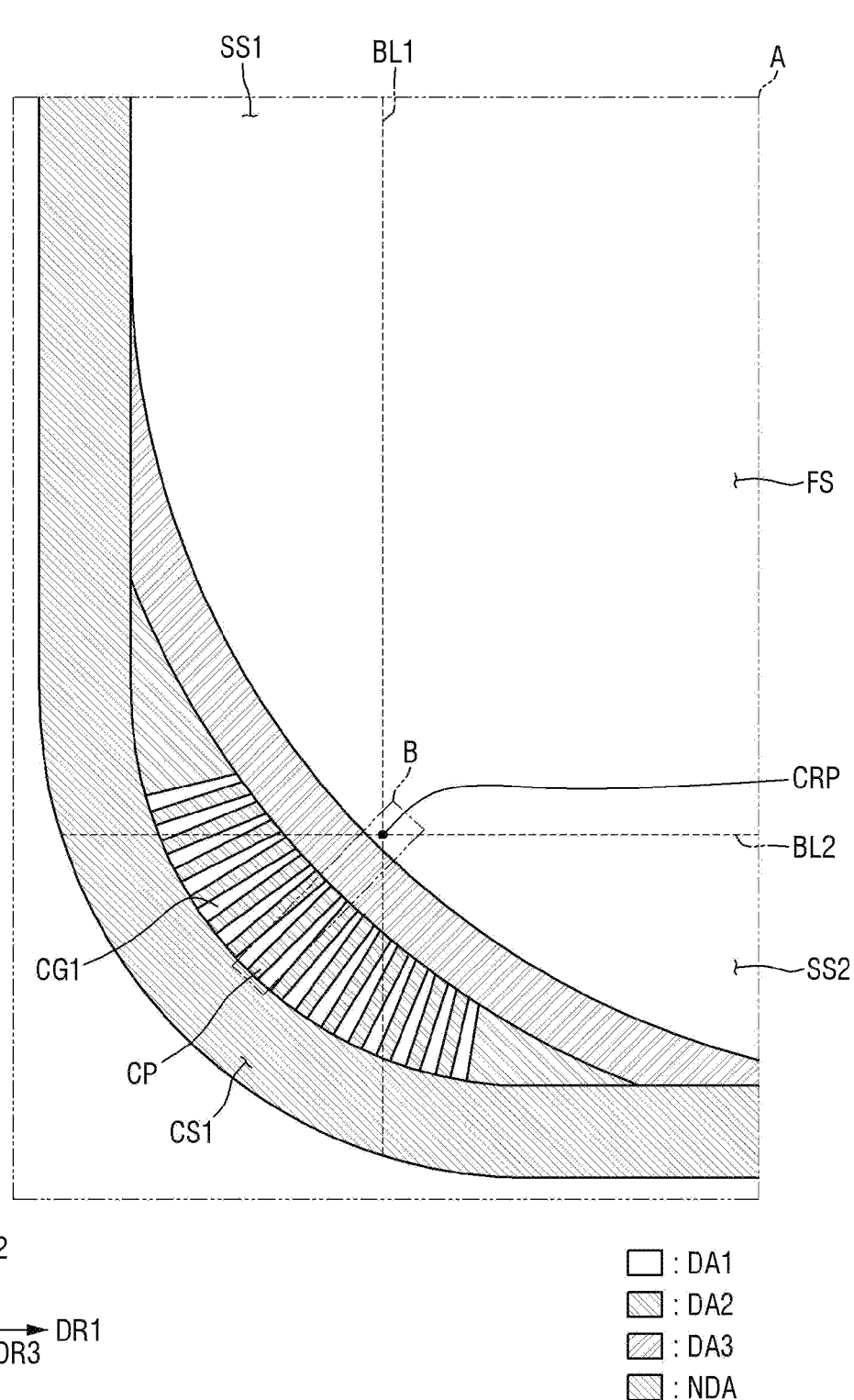
FIG. 4 is a layout view illustrating, in more detail, first through third display areas and a non-display area disposed in a first corner portion of a display panel according to an embodiment.

Each of the first corner portion CS1, the second corner portion CS2, the third corner portion CS3, and the fourth corner portion CS4 may include cutout patterns separated by cutout portions as illustrated in FIG. 4 to reduce strain due to the double curvature. The cutout patterns will be described later with reference to FIG. 4.

Figure 2:
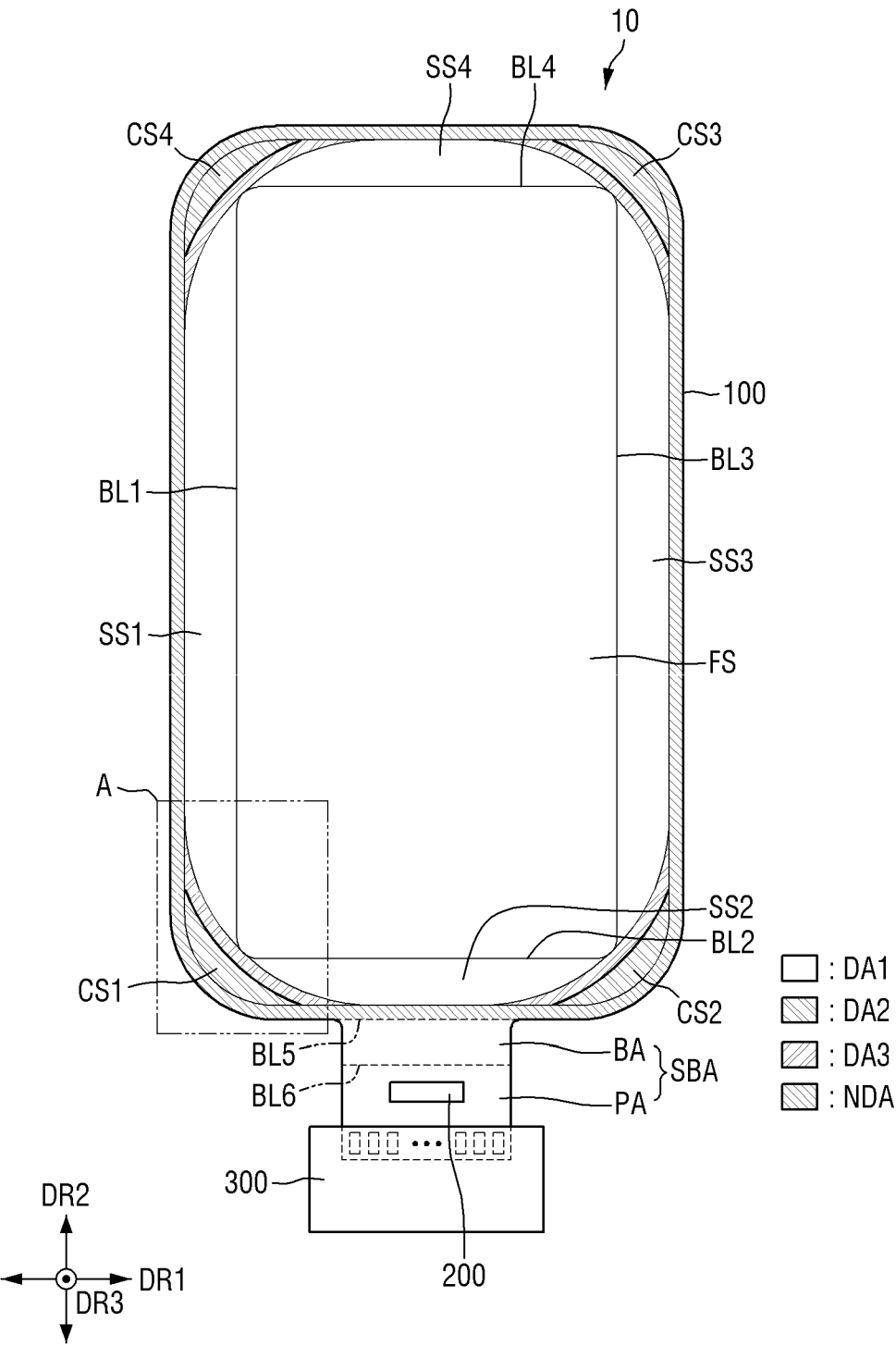
FIG. 2 is an illustrative view of the display device according to the embodiment.

FIG. 2 is an illustrative view of the display device 10 according to the embodiment.

Referring to FIG. 2, the display panel 100 may further include a bending portion BA and a pad portion PA. The display panel 100 may include first through third display areas DA1 through DA3, a non-display area NDA, the bending portion BA, and the pad portion PA.

The first through third display areas DA1 through DA3 refer to areas that include pixels or light emitting areas to display an image. The non-display area NDA refers to an area that does not display an image because it does not include pixels or light emitting areas. Signal wirings or a scan driving unit for driving pixels or light emitting areas may be disposed in the non-display area NDA.

The first display area DA1 may be a main display area of the display panel 100 and may be disposed in the front portion FS, the first side portion SS1, the second side portion SS2, the third side portion SS3, and the fourth side portion SS4. Each corner of the first display area DA1 may be rounded with a set curvature (e.g., a predetermined curvature).

The second display area DA2 may be a second auxiliary display area assisting the first display area DA1 which is the main display area. The resolution of the second display area DA2 may be different from the resolution of the first display area DA1. For example, because the second display area DA2 serves to assist the first display area DA1, the resolution of the second display area DA2 may be lower than the resolution of the first display area DA1. For example, the number of pixels per unit area in the second display area DA2 may be less than the number of pixels per unit area in the first display area DA1. In one or more embodiments, the number of pixels per inch (PPI) in the second display area DA2 may be less than the number of pixels per inch in the first display area DA1. However, the present disclosure is not limited thereto, and the resolution of the second display area DA2 also may be substantially the same as the resolution of the first display area DA1.

The second display area DA2 may be disposed outside any one of the corners of the first display area DA1. The second display area DA2 may be disposed in any one of the corner portions CS1 through CS4.

For example, the second display area DA2 disposed outside a corner where a lower side and a left side of the first display area DA1 meet may be disposed in the first corner portion CS1. The second display area DA2 disposed outside a corner where the lower side and a right side of the first display area DA1 meet may be disposed in the second corner portion CS2. The second display area DA2 disposed outside a corner where an upper side and the right side of the first display area DA1 meet may be disposed in the third corner portion CS3. The second display area DA2 disposed outside a corner where the upper side and the left side of the first display area DA1 meet may be disposed in the fourth corner portion CS4.

The third display area DA3 may be a second auxiliary display area assisting the first display area DA1 which is the main display area. The resolution of the third display area DA3 may be different from the resolution of the first display area DA1. For example, because the third display area DA3 serves to assist the first display area DA1, the resolution of the third display area DA3 may be lower than the resolution of the first display area DA1. For example, the number of pixels per unit area in the third display area DA3 may be less than the number of pixels per unit area in the first display area DA1. In one or more embodiments, the number of pixels per inch in the third display area DA3 may be less than the number of pixels per inch in the first display area DA1. However, the present disclosure is not limited thereto, and the resolution of the third display area DA3 also may be substantially the same as the resolution of the first display area DA1.

The third display area DA3 may be disposed between the first display area DA1 and the second display area DA2. The third display area DA3 may be disposed in any one of the corner portions CS1 through CS4. In one or more embodiments, a third display area DA3 may be disposed between the first display area DA1 and the second display area DA2 at each of the corner portions CS1 through CS4 as shown in FIG. 2.

For example, the third display area DA3 disposed outside a corner where the lower side and the left side of the first display area DA1 meet may be disposed in the first corner portion CS1. The third display area DA3 disposed outside a corner where the upper side and the left side of the first display area DA1 meet may be disposed in the fourth corner portion CS4. The third display area DA3 disposed outside a corner where the lower side and the right side of the first display area DA1 meet may be disposed in the second corner portion CS2. The third display area DA3 disposed outside a corner where the upper side and the right side of the first display area DA1 meet may be disposed in the third corner area CS3.

In one or more embodiments, the non-display area NDA may be around (e.g., surround) the first through third display areas DA1 through DA3. The non-display area NDA may be disposed in the first side portion SS1, the second side portion SS2, the third side portion SS3, the fourth side portion SS4, the first corner portion CS1, the second corner portion CS2, the third corner portion CS3, and the fourth corner portion CS4. The non-display area NDA may be disposed outside the first display area DA1 in the side portions SS1 through SS4. For example, the non-display area NDA may be disposed at a left edge of the first side portion SS1, a lower edge of the second side portion SS2, a right edge of the third side portion SS3, and an upper edge of the fourth side portion SS4.

The non-display area NDA may be disposed outside the second display area DA2 in the corner portions CS1 through CS4. For example, the non-display area NDA may be disposed at an edge of a corner where an upper side and a left side of the first corner portion CS1 meet, an edge of a corner where a lower side and a right side of the second corner portion CS2 meet, an edge of a corner where an upper side and a right side of the third corner portion CS3 meet, and an edge of a corner where an upper side and a left side of the fourth corner portion CS4 meet.

In one or more embodiments, a side bending area SBA includes a pending portion BA and a pad portion PA. The bending portion BA may extend from a lower side of the second side portion SS2. The bending portion BA may be disposed between the second side portion SS2 and the pad portion PA. A length of the bending portion BA in the first direction DR1 may be shorter than a length of the second side portion SS2 in the first direction DR1. The bending portion BA may be bent along a fifth bending line BL5 on the lower side of the second side portion SS2.

The pad portion PA may extend from a lower side of the bending portion BA. A length of the pad portion PA in the first direction DR1 may be longer than the length of the bending portion BA in the first direction DR1, but the present disclosure is not limited thereto. The length of the pad portion PA in the first direction DR1 also may be substantially the same as the length of the bending portion BA in the first direction DR1. The pad portion PA may be bent along a sixth bending line BL6 on the lower side of the bending portion BA. The pad portion PA may be disposed on a lower surface of the front portion FS.

A display driving circuit 200 and pads DP may be disposed on the pad portion PA. The display driving circuit 200 may be formed as an integrated circuit. The display driving circuit 200 may be attached onto the pad portion PA using a chip on plastic (COP) method or an ultrasonic bonding method. In one or more embodiments, the display driving circuit 200 may be disposed on a display circuit board 300 disposed on the pads DP of the pad portion PA.

The display circuit board 300 may be attached onto the pads DP of the pad portion PA using an anisotropic conductive film. Accordingly, the pads DP of the pad portion PA may be connected (e.g., electrically connected) to the display circuit board 300.

As illustrated in FIG. 2, the display areas DA1 through DA3 may be disposed in the front portion FS, the first side portion SS1, the second side portion SS2, the third side portion SS3, the fourth side portion SS4, the first corner portion CS1, the second corner portion CS2, the third corner portion CS3, and the fourth corner portion CS4 of the display panel 100. Therefore, an image may be displayed not only on the front portion FS, the first side portion SS1, the second side portion SS2, the third side portion SS3, and the fourth side portion SS4 of the display panel 100, but also on the first corner portion CS1, the second corner portion CS2, the third corner portion CS3, and the fourth corner portion CS4.

Figure 3:
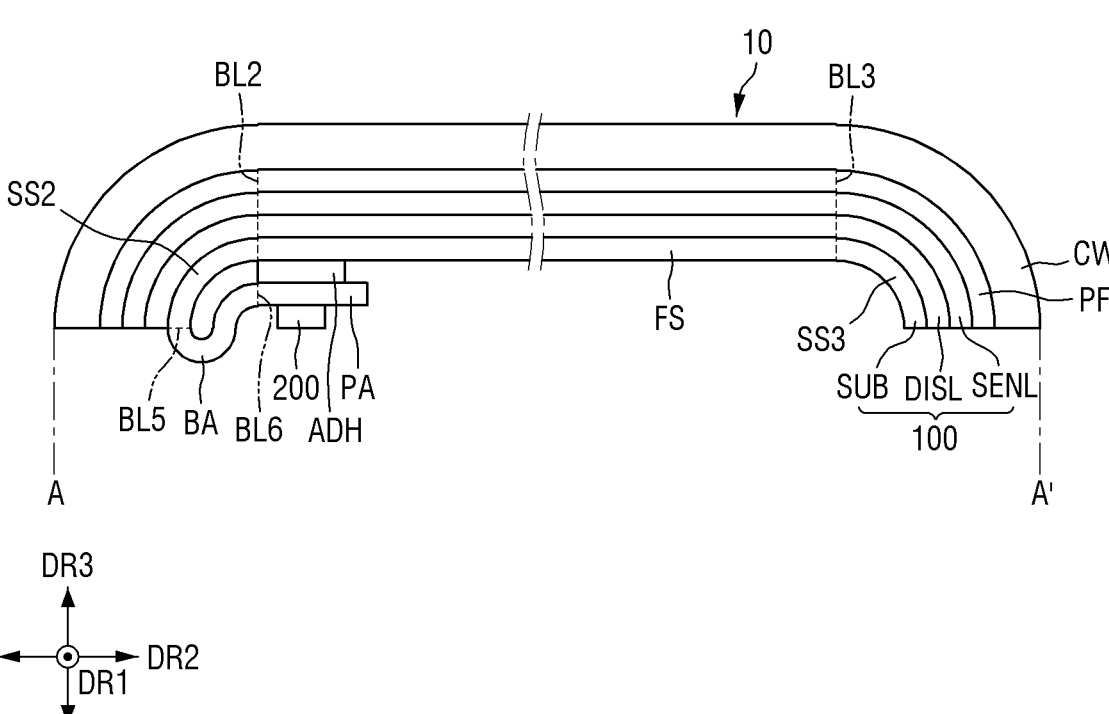
FIG. 3 is a cross-sectional view of the display device according to the embodiment.

FIG. 3 is a cross-sectional view of the display device 10 according to the embodiment. FIG. 3 illustrates an example of the display device 10 cut along the line A-A' of FIG. 1.

Referring to FIG. 3, the display device 10 may further include a cover window CW and a polarizing film PF in addition to the display panel 100. The display panel 100 may include a substrate SUB, a display layer DISL, and a sensor electrode layer SENL. The polarizing film PF may be disposed on the display panel 100, and the cover window CW may be disposed on the polarizing film PF.

The display layer DISL may be disposed on the substrate SUB. The display layer DISL may include the display areas DA1 through DA3 (e.g., see FIG. 2) and the non-display area NDA. The display layer DISL may include a thin-film transistor layer TFTL (e.g., see FIG. 15), a light emitting element layer EML (e.g., see FIG. 15) in which light emitting elements emitting light are disposed, and an encapsulation layer TFE (e.g., see FIG. 15) for encapsulating the light emitting element layer EML.

The sensor electrode layer SENL, the polarizing film PF, and the cover window CW may be disposed on the second side portion SS2 and the third side portion SS3. In one or more embodiments, the sensor electrode layer SENL, the polarizing film PF, and the cover window CW may be disposed on the first side portion SS1 and the fourth side portion SS4.

The bending portion BA may be bent at the fifth bending line BL5 to lie on a lower surface of the second side portion SS2. The pad portion PA may be bent at the sixth bending line BL6 to lie on the lower surface of the front portion FS. The pad portion PA may be attached to the lower surface of the front portion FS by an adhesive member ADH. The adhesive member ADH may be a pressure sensitive adhesive.

FIG. 4 is a layout view illustrating, in more detail, the first through third display areas DA1 through DA3 and the non-display area NDA disposed in the first corner portion CS1 of the display panel 100 according to an embodiment. FIG. 4 is an enlarged view of area A of FIG. 2.

Referring to FIG. 4, an intersection point CRP of the first bending line BL1 and the second bending line BL2 may be disposed in the first display area DA1. In this case, the first display area DA1 may be disposed in the front portion FS, the first side portion SS1, the second side portion SS2, and the first corner portion CS1. In this case, the second display area DA2 and the third display area DA3 may be disposed in the first corner portion CS1. The non-display area NDA may be disposed in the first side portion SS1, the second side portion SS2, and the first corner portion CS1.

The location of the intersection point CRP of the first bending line BL1 and the second bending line BL2 is not limited to that illustrated in FIG. 4, and the intersection point CRP also may be disposed in the second display area DA2 or the third display area DA3.

The first display area DA1 may include first pixels PX1 displaying an image. The second display area DA2 may be disposed outside the third display area DA3. In one or more embodiments, the second display area DA2 may be between the third display area DA3 and the non-display area NDA. The second display area DA2 may include second pixels PX2 displaying an image. The third display area DA3 may be disposed between the first display area DA1 and the second display area DA2. The third display area DA3 may include third pixels PX3 (e.g., see FIG. 7) displaying an image.

When a non-display area, instead of the third display area DA3, is disposed at the location of the third display area DA3, a user may recognize the non-display area between the first display area DA1 and the second display area DA2. For example, the user may recognize a gap between an image displayed by the first display area DA1 and an image displayed by the second display area DA2. When the third display area DA3 including the third pixels PX3 (e.g., see FIG. 7) is disposed between the first display area DA1 and the second display area DA2, it is possible to prevent or substantially prevent the gap between the image displayed by the first display area DA1 and the image displayed by the second display area DA2 from being recognized by the user.

The second display area DA2 may include cutout patterns CP and cutout portions CG. The second pixels PX2 (e.g., see FIG. 6) may be disposed on the cutout patterns CP. The cutout patterns CP may be formed by various suitable processes, for example, by cutting a part or all of the display panel 100 with a laser or by etching the display panel 100 through an etching process. For example, the cutout patterns CP may be formed by etching the thin-film transistor layer TFTL (e.g., see FIG. 15), the light emitting element layer EML (e.g., see FIG. 15), and the encapsulation layer TFE (e.g., see FIG. 15) of the display panel 100.

One end of each of the cutout patterns CP may be connected to the third display area DA3, and the other end may be connected to the non-display area NDA. For example, an inner end of each of the cutout patterns CP may be connected to the third display area DA3 and an outer end of each of the cutout patterns CP may be connected to the non-display area NDA. The cutout patterns CP adjacent to each other may be spaced apart (e.g., spaced from each other) by a cutout portion CG. A space may be provided between the cutout patterns CP adjacent to each other by the cutout portion CG. Therefore, even if the first corner portion CS1 has a double curvature, strain applied to the first corner portion CS1 by the cutout portions CG may be reduced because the first corner portion CS1 can stretch and contract.

A scan driving unit for transmitting scan signals to the first pixels PX1 (e.g., see FIG. 5) of the first display area DA1, the second pixels PX2 (e.g., see FIG. 6) of the second display area DA2, and the third pixels PX3 (e.g., see FIG. 7) of the third display area DA3 may be disposed in the third display area DA3.

The display areas DA1 through DA3 and the non-display area NDA disposed in the second corner portion CS2, the third corner portion CS3, and the fourth corner portion CS4 illustrated in FIG. 2 may be similar to those described with reference to FIG. 4. Therefore, a detailed description of the second corner portion CS2, the third corner portion CS3, and the fourth corner portion CS4 may not be provided.

Figure 5:
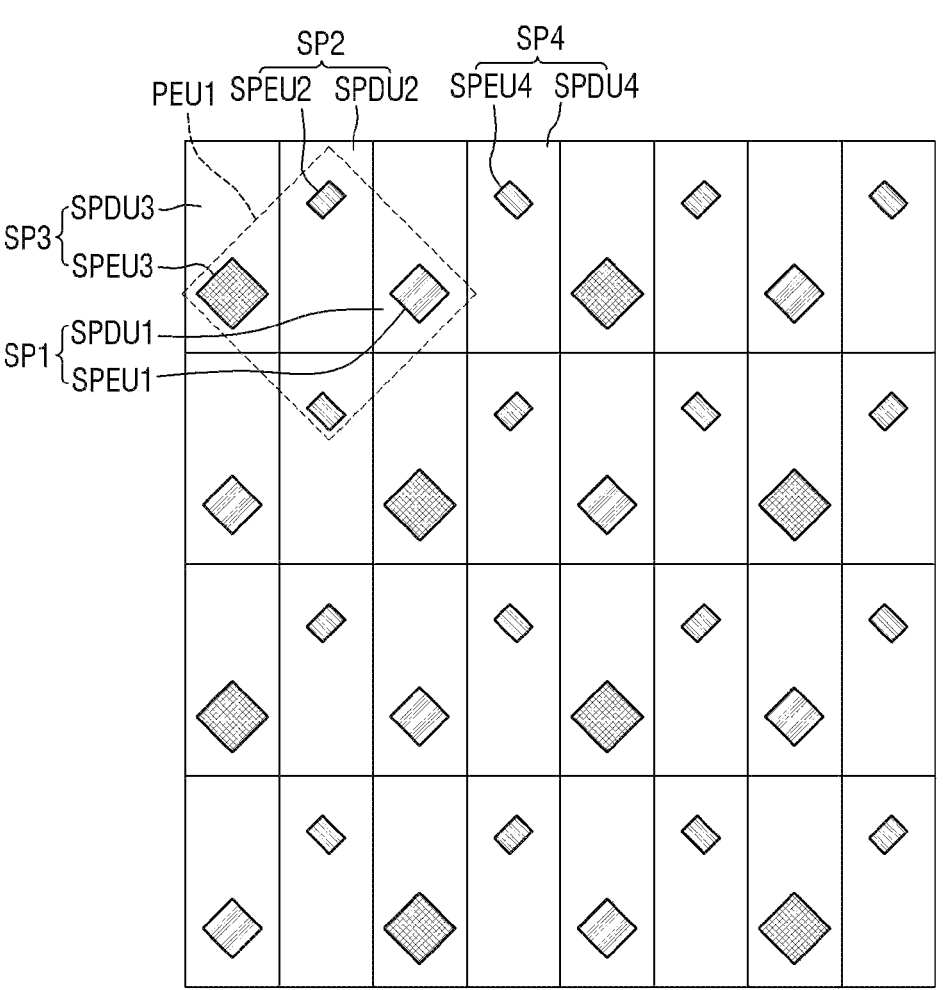
FIG. 5 is a detailed layout view illustrating an example of the first display area of FIG. 4.
Figure 5:
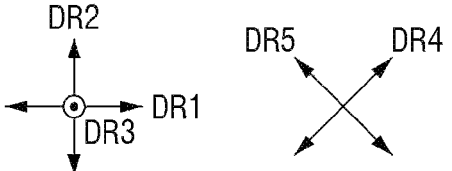

FIG. 5 is a detailed layout view of an example of the first display area DA1 of FIG. 4.

Referring to FIG. 5, the first display area DA1 may include the first pixels PX1. Each of the first pixels PX1 may include first through fourth subpixels SP1 through SP4. The first subpixel SP1 may include a first subpixel light emitting unit SPEU1 emitting light of a first color and a first subpixel driving unit SPDU1 connected to the first subpixel light emitting unit SPEU1 to apply a driving current or a driving voltage. The second subpixel SP2 may include a second subpixel light emitting unit SPEU2 emitting light of a second color and a second subpixel driving unit SPDU2 connected to the second subpixel light emitting unit SPEU2 to apply a driving current or a driving voltage. The third subpixel SP3 may include a third subpixel light emitting unit SPEU3 emitting light of a third color and a third subpixel driving unit SPDU3 connected to the third subpixel light emitting unit SPEU3 to apply a driving current or a driving voltage. The fourth subpixel SP4 may include a fourth subpixel light emitting unit SPEU4 emitting light of a fourth color and a fourth subpixel driving unit SPDU4 connected to the fourth subpixel light emitting unit SPEU4 to apply a driving current or a driving voltage.

The first subpixel driving unit SPDU1 and the first subpixel light emitting unit SPEU1 may overlap each other in the third direction DR3 (e.g., the thickness direction of the display panel 100). The area (e.g., the planar area) of the first subpixel driving unit SPDU1 may be larger than the area (e.g., the planar area) of the first subpixel light emitting unit SPEU1. The first subpixel driving unit SPDU1 may have a rectangular planar shape having short sides extending in the first direction DR1 and long sides extending in the second direction DR2. The first subpixel light emitting unit SPEU1 may have a rectangular or rhombus planar shape having sides extending in a fourth direction DR4 and sides extending in a fifth direction DR5. The fourth direction DR4 and the fifth direction DR5 may be directions orthogonal to each other. The fourth direction DR4 may be a diagonal direction inclined by 45 degrees with respect to the first direction DR1.

The second subpixel driving unit SPDU2 and the second subpixel light emitting unit SPEU2 may overlap each other in the third direction DR3 (e.g., the thickness direction of the display panel 100). The area (e.g., the planar area) of the second subpixel driving unit SPDU2 may be larger than the area (e.g., the planar area) of the second subpixel light emitting unit SPEU2. The second subpixel driving unit SPDU2 may have a rectangular planar shape having short sides extending in the first direction DR1 and long sides extending in the second direction DR2, and the second subpixel light emitting unit SPEU2 may have a rectangular planar shape having short sides extending in the fifth direction DR5 and long sides extending in the fourth direction DR4.

The third subpixel driving unit SPDU3 and the third subpixel light emitting unit SPEU3 may overlap each other in the third direction DR3 (e.g., the thickness direction of the display panel 100). The area (e.g., the planar area) of the third subpixel driving unit SPDU3 may be larger than the area (e.g., the planar area) of the third subpixel light emitting unit SPEU3. The third subpixel driving unit SPDU3 may have a rectangular planar shape having short sides extending in the first direction DR1 and long sides extending in the second direction DR2. The third subpixel light emitting unit SPEU3 may have a rectangular or rhombus planar shape having sides extending in the fourth direction DR4 and sides extending in the fifth direction DR5.

The fourth subpixel driving unit SPDU2 and the fourth subpixel light emitting unit SPEU4 may overlap each other in the third direction DR3 (e.g., the thickness direction of the display panel 100). The area (e.g., the planar area) of the fourth subpixel driving unit SPDU4 may be larger than the area (e.g., the planar area) of the fourth subpixel light emitting unit SPEU4. The fourth subpixel driving unit SPDU4 may have a rectangular planar shape having short sides extending in the first direction DR1 and long sides extending in the second direction DR2, and the fourth subpixel light emitting unit SPEU4 may have a rectangular planar shape having long sides extending in the fifth direction DR5 and short sides extending in the fourth direction DR4.

The first subpixel light emitting unit SPEU1, the second subpixel light emitting unit SPEU2, the third subpixel light emitting unit SPEU3, and the fourth subpixel light emitting unit SPEU4 of each of the first pixels PX1 may be defined as a first light emitting unit PEU1. In the first light emitting unit PEU1, the area of the third subpixel light emitting unit SPEU3 may be relatively larger (e.g., the largest), and the area of the second subpixel light emitting unit SPEU2 and the area of the fourth subpixel light emitting unit SPEU4 may be relatively smaller (e.g., the smallest). The area of the second subpixel light emitting unit SPEU2 and the area of the fourth subpixel light emitting unit SPEU4 may be substantially the same.

At least any two of the first through fourth subpixel light emitting units SPEU1 through SPEU4 may emit light of the same color. For example, the second subpixel light emitting unit SPEU2 and the fourth subpixel light emitting unit SPEU4 may emit light of the same color. In this case, the first color may be red, the second color and the fourth color may be green, and the third color may be blue. In one or more embodiments, the first through fourth subpixel light emitting units SPEU1 through SPEU4 may emit light of different colors.

Figure 6:
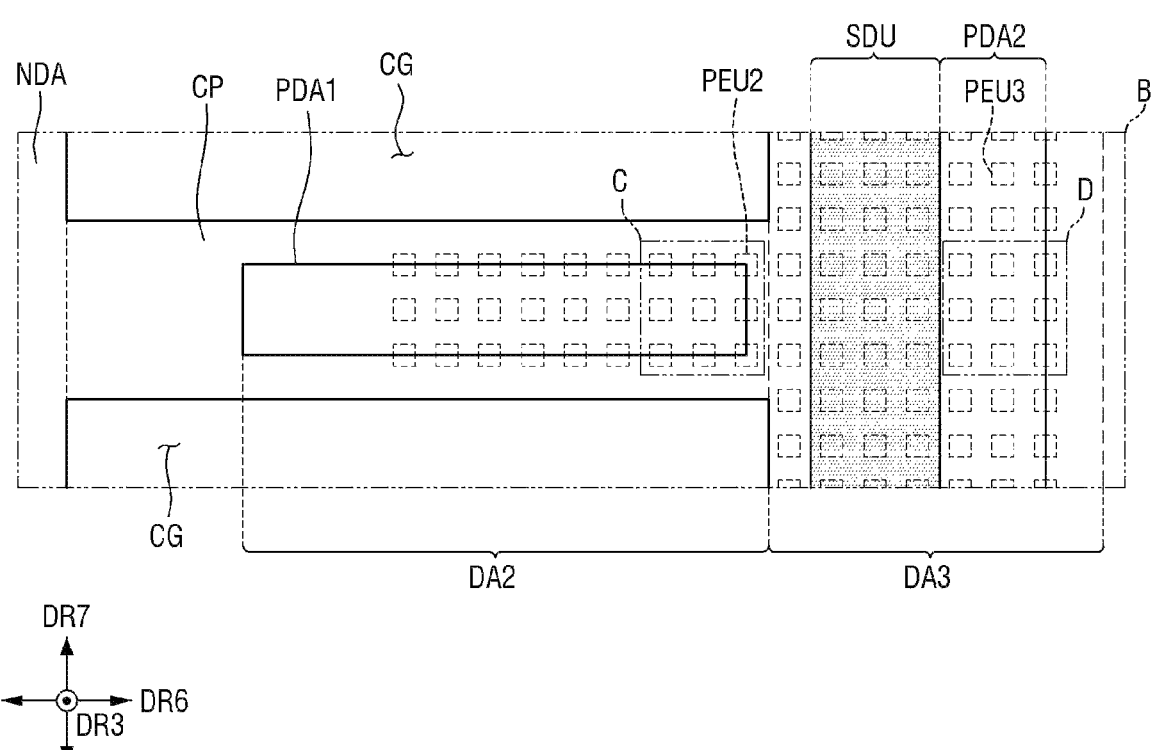
FIG. 6 is a layout view illustrating an example of the second display area and the third display area of FIG. 4 in more detail.
Figure 7:
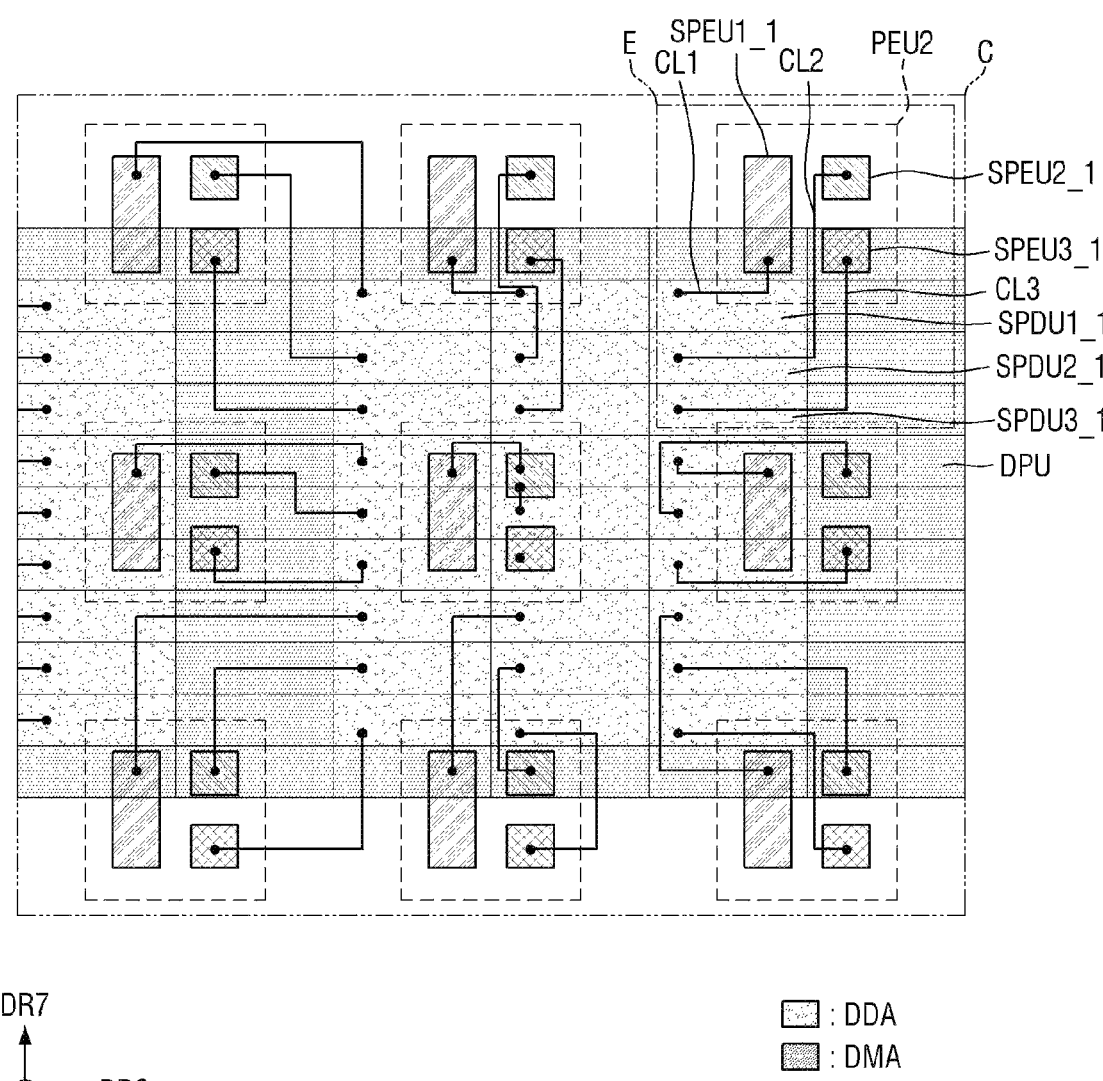
FIG. 7 is a detailed layout view of an example of the second display area of FIG. 6.
Figure 7:
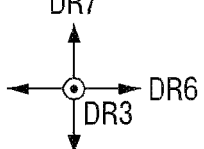
Figure 8:
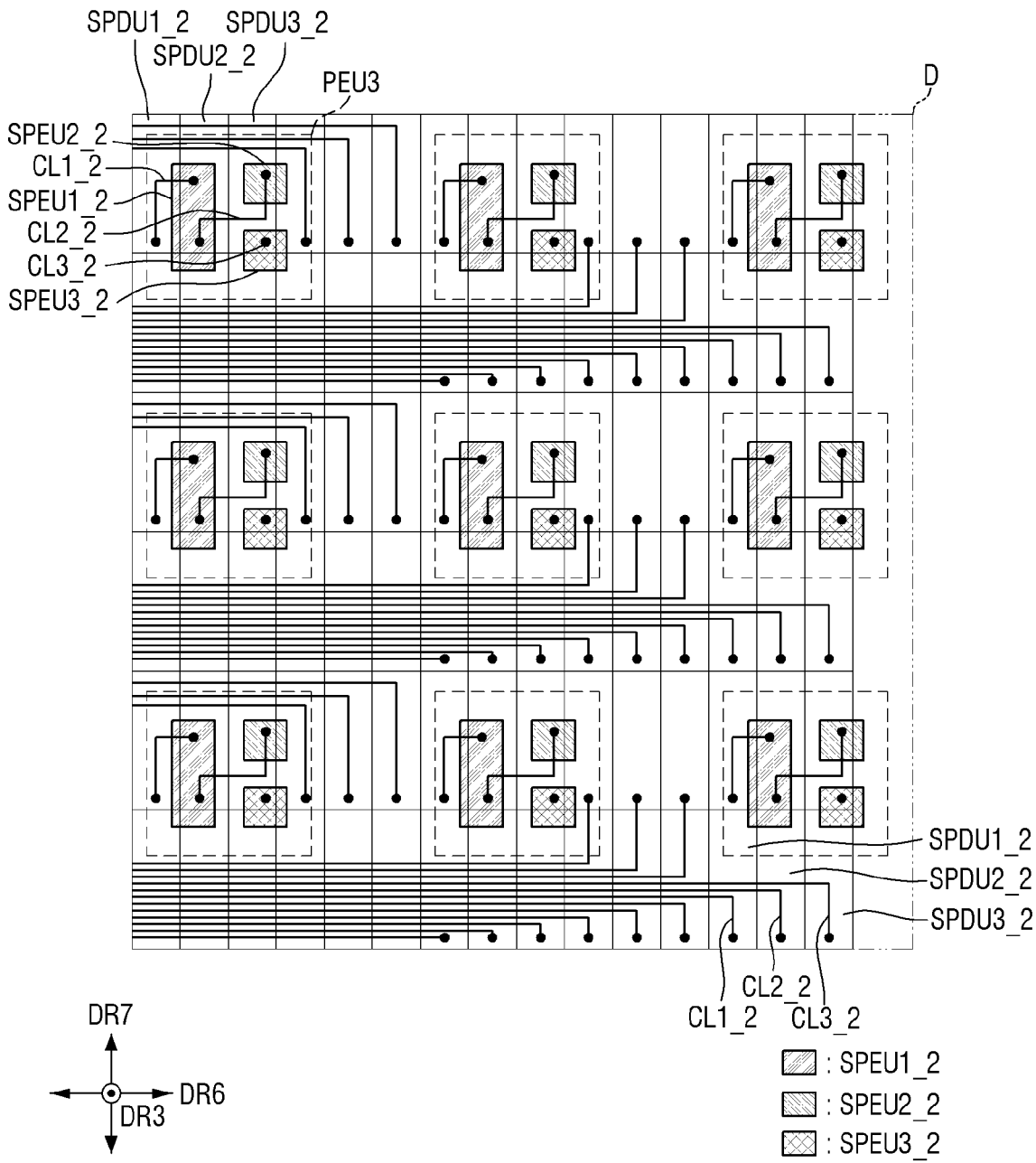
FIG. 8 is a detailed layout view of an example of the third display area of FIG. 6.

FIG. 6 is a layout view illustrating an example of the second display area DA2 and the third display area DA3 of FIG. 4 in more detail. FIG. 7 is a detailed layout view of an example of the second display area DA2 of FIG. 6. FIG. 8 is a detailed layout view of an example of the third display area DA3 of FIG. 6.

FIG. 6 is an enlarged layout view of an example of area B of FIG. 4. FIG. 7 is an enlarged layout view of an example of area C of FIG. 6. FIG. 8 is an enlarged layout view of an example of area D of FIG. 6.

Referring to FIGS. 6 through 8, the second display area DA2 may include the second pixels PX2 and dummy pixel driving units DPU. Each of the second pixels PX2 may include first through third subpixels SP1_1 through SP3_1. The first subpixel SP1_1 may include a first subpixel light emitting unit SPEU1_1 emitting light of a first color and a first subpixel light emitting unit SPDU1_1 connected to the first subpixel light emitting unit SPEU1_1 to apply a driving current or a driving voltage. The second subpixel SP2_1 may include a second subpixel light emitting unit SPEU2_1 emitting light of a second color and a second subpixel driving unit SPDU2_1 connected to the second subpixel light emitting unit SPEU2_1 to apply a driving current or a driving voltage. The third subpixel SP3_1 may include a third subpixel light emitting unit SPEU3_1 emitting light of a third color and a third subpixel driving unit SPDU3_1 connected to the third subpixel light emitting unit SPEU3_1 to apply a driving current or a driving voltage. In this case, the first color may be red, the second color may be green, and the third color may be blue.

The first subpixel driving unit SPDU1_1 may have a rectangular planar shape having long sides extending in a sixth direction DR6 and short sides extending in a seventh direction DR7. The first subpixel light emitting unit SPEU1_1 may have a rectangular planar shape having short sides extending in the sixth direction DR6 and long sides extending in the seventh direction DR7. The area (e.g., the planar area) of the first subpixel driving unit SPDU1_1 may be larger than the area (e.g., the planar area) of the first subpixel light emitting unit SPEU1_1.

The first subpixel driving unit SPDU1_1 may not overlap the first subpixel light emitting unit SPEU1_1 connected thereto in the third direction DR3. Accordingly, the second display area DA2 may further include a first connection line CL1 connecting the first subpixel driving unit SPDU1_1 and the first subpixel light emitting unit SPEU1_1. In one or more embodiments, the first subpixel driving unit SPDU1_1 may overlap the first subpixel light emitting unit SPEU1_1 connected thereto in the third direction DR3. In this case, the first connection line CL1 may not be provided.

The second subpixel driving unit SPDU2_1 may have a rectangular planar shape having long sides extending in the sixth direction DR6 and short sides extending in the seventh direction DR7. The second subpixel light emitting unit SPEU2_1 may have a square or rectangular planar shape having sides extending in the sixth direction DR6 and sides extending in the seventh direction DR7. The area (e.g., the planar area) of the second subpixel driving unit SPDU2_1 may be larger than the area (e.g., the planar area) of the second subpixel light emitting unit SPEU2_1.

The second subpixel driving unit SPDU2_1 may not overlap the second subpixel light emitting unit SPEU2_1 connected thereto in the third direction DR3. Accordingly, the second display area DA2 may further include a second connection line CL2 connecting the second subpixel driving unit SPDU2_1 and the second subpixel light emitting unit SPEU2_1. In one or more embodiments, the second subpixel driving unit SPDU2_1 may overlap the second subpixel light emitting unit SPEU2_1 connected thereto in the third direction DR3. In this case, the second connection line CL2 may not be provided.

The third subpixel driving unit SPDU3_1 may have a rectangular planar shape having long sides extending in the sixth direction DR6 and short sides extending in the seventh direction DR7. The third subpixel light emitting unit SPEU3_1 may have a square or rectangular planar shape having sides extending in the sixth direction DR6 and sides extending in the seventh direction DR7. The area (e.g., the planar area) of the third subpixel driving unit SPDU3_1 may be larger than the area (e.g., the planar area) of the third subpixel light emitting unit SPEU3_1.

The third subpixel driving unit SPDU3_1 may not overlap the third subpixel light emitting unit SPEU3_1 connected thereto in the third direction DR3. Accordingly, the second display area DA2 may further include a third connection line CL3 connecting the third subpixel driving unit SPDU3_1 and the third subpixel light emitting unit SPEU3_1. In one or more embodiments, the third subpixel driving unit SPDU3_1 may overlap the third subpixel light emitting unit SPEU3_1 connected thereto in the third direction DR3. In this case, the third connection line CL3 may not be provided.

The first subpixel light emitting unit SPEU1_1, the second subpixel light emitting unit SPEU2_1, and the third subpixel light emitting unit SPEU3_1 of each of the second pixels PX2 may be defined as a second light emitting unit PEU2. In the second light emitting unit PEU2, the area (e.g., the planar area) of the first subpixel light emitting unit SPEU1_1 may be larger than the area (e.g., the planar area) of the second subpixel light emitting unit SPEU2_1 or the area of the third subpixel light emitting unit SPEU3_1. In the second light emitting unit PEU2, the area of the second subpixel light emitting unit SPEU2_1 and the area of the third subpixel light emitting unit SPEU3_1 may be substantially the same.

The area (e.g., the planar area) of the first subpixel light emitting unit SPEU1_1 of each of the second pixels PX2 may be larger than the area (e.g., the planar area) of the first subpixel light emitting unit SPEU1 of each of the first pixels PX1. The area (e.g., the planar area) of the second subpixel light emitting unit SPEU2_1 of each of the second pixels PX2 may be larger than the area (e.g., the planar area) of the second subpixel light emitting unit SPEU2 or the area (e.g., the planar area) of the fourth subpixel light emitting unit SPEU4 of each of the first pixels PX1. The area (e.g., the planar area) of the third subpixel light emitting unit SPEU3_1 of each of the second pixels PX2 may be larger than the area (e.g., the planar area) of the third subpixel light emitting unit SPEU3 of each of the first pixels PX1.

Each of the dummy pixel driving units DPU may be a pixel driving unit not connected to the first subpixel light emitting unit SPEU1_1, the second subpixel light emitting unit SPEU1_2, and the third subpixel light emitting unit SPEU1_3. Each of the dummy pixel driving units DPU may have a rectangular planar shape having long sides extending in the sixth direction DR6 and short sides extending in the seventh direction DR7. Each of the dummy pixel driving units DPU may have a square or rectangular planar shape having sides extending in sixth direction DR6 and sides extending in the seventh direction DR7.

The area of each of the dummy pixel driving units DPU may be substantially the same as the area of the first subpixel driving unit SPDU1_1, the area of the second subpixel driving unit SPDU2_1, or the area of the third subpixel driving unit SPDU3_1. A length of each of the dummy pixel driving units DPU in the sixth direction DR6 may be substantially the same as a length of the first subpixel driving unit SPDU1_1 in the sixth direction DR6, a length of the second subpixel driving unit SPDU2_1 in the sixth direction DR6, or a length of the third subpixel driving unit SPDU3_1 in the sixth direction DR6. In one or more embodiments, a length of each of the dummy pixel driving units DPU in the seventh direction DR7 may be substantially the same as a length of the first subpixel driving unit SPDU1_1 in the seventh direction DR7, a length of the second subpixel driving unit SPDU2_1 in the seventh direction DR7, or a length of the third subpixel driving unit SPDU3_1 in the seventh direction DR7.

Any one of the dummy pixel driving units DPU may overlap at least one of the first subpixel light emitting unit SPEU1_1, the second subpixel light emitting unit SPEU2_1, and the third subpixel light emitting unit SPEU3_1 in the third direction DR3 (e.g., the thickness direction of the display panel 100). In one or more embodiments, any one of the dummy pixel driving units DPU may overlap the first connecting line CL1, the second connecting line CL2, or the third connecting line CL3 in the third direction DR3 (e.g., the thickness direction of the display panel 100).

The second display area DA2 may include a first pixel driving area PDA1 disposed on each of the cutout patterns CP. The first pixel driving area PDA1 may extend in the sixth direction DR6 on each of the cutout patterns CP. For example, a length of the first pixel driving area PDA1 in the sixth direction DR6 may be longer than a length thereof in the seventh direction DR7 intersecting the sixth direction DR6. The sixth direction DR6 may be a direction in which the cutout patterns CP extend.

The first pixel driving area PDA1 may include driving areas DDA in which the first subpixel driving units SPDU1_1, the second subpixel driving units SPDU2_1, and the third subpixel driving units SPDU3_1 of the second pixels PX2 are disposed and a dummy area DMA in which the dummy pixel driving units DPU are disposed. The dummy area DMA may surround each of the driving areas DDA. For example, the dummy area DMA may be disposed outside an upper side, a lower side, a left side, and a right side of each of the driving areas DDA. Therefore, any one dummy pixel driving unit DPU of the dummy area DMA may be disposed closer to an edge of a cutout pattern CP than the first subpixel driving units SPDU1_1, the second subpixel driving units SPDU2_1, or the third subpixel driving units SPDU3_1 of the driving areas DDA is to the edge of the cutout pattern CP.

In FIG. 7, each of the driving areas DDA includes twenty-seven subpixel driving units SPDU1_1 through SPDU3_1 arranged in nine rows and three columns. In this case, each of the driving areas DDA may include nine first subpixel driving units SPDU1_1, nine second subpixel driving units SPDU2_1, and nine third subpixel driving units SPDU3_1.

Figure 29:
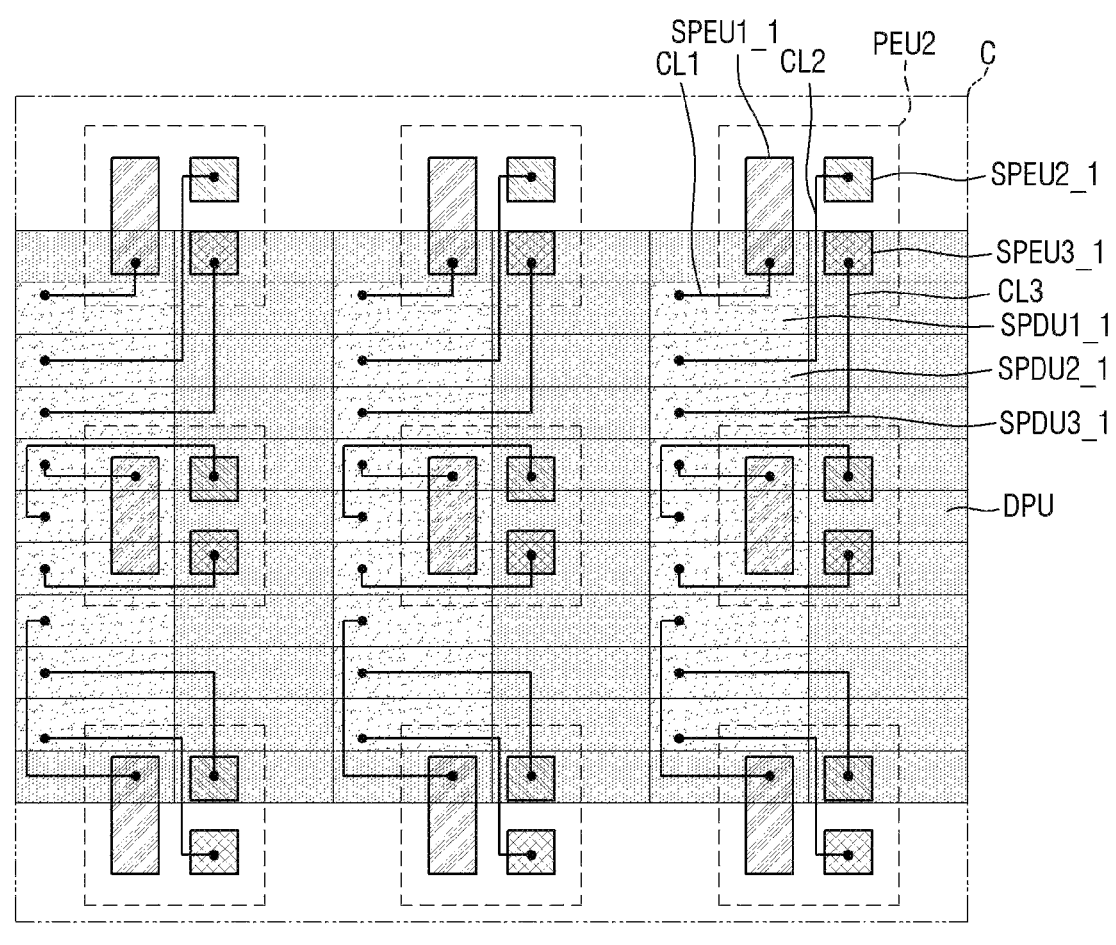
FIG. 29 is a detailed layout view of an example of the second display area of FIG. 6.
Figure 29:
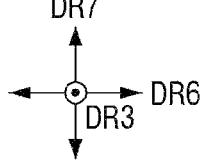
Figure 30:
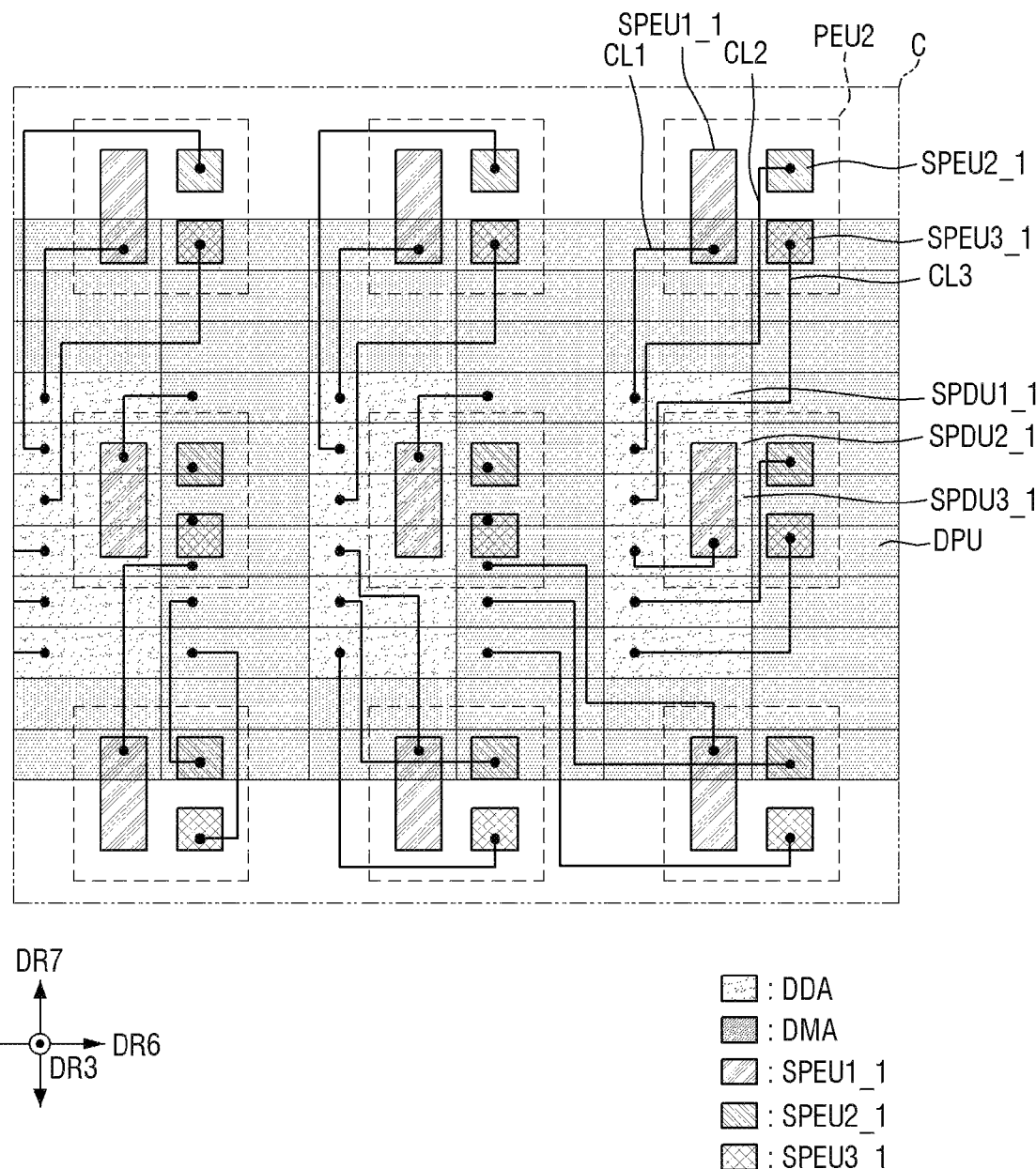
FIG. 30 is a detailed layout view of an example of the second display area of FIG. 6.

However, the driving areas DDA and the dummy area DMA are not limited to those illustrated in FIG. 7. For example, as illustrated in FIG. 29, each of the driving areas DDA may include nine subpixel driving units SPDU1_1 through SPDU3_1 arranged in nine rows and one column, and the dummy area DMA may surround each of the driving areas DDA. In one or more embodiments, as illustrated in FIG. 30, the first pixel driving area PDA1 may include one driving area DDA and one dummy area DMA. In this case, the driving area DDA may include subpixel driving units SPDU1_1 through SPDU3_1 arranged in six rows and Q (Q is a positive integer) columns.

The third display area DA3 may include the third pixels PX3 and a scan driving unit SDU. Each of the third pixels PX3 may include first through third subpixels SP1_2 through SP3_2. The first subpixel SP1_2 may include a first subpixel light emitting unit SPEU1_2 emitting light of a first color and a first subpixel driving unit SPDU1_2 connected to the first subpixel light emitting unit SPEU1_2 to apply a driving current or a driving voltage. The second subpixel SP2_2 may include a second subpixel light emitting unit SPEU2_2 emitting light of a second color and a second subpixel driving unit SPDU2_2 connected to the second subpixel light emitting unit SPEU2_2 to apply a driving current or a driving voltage. The third subpixel SP3_2 may include a third subpixel light emitting unit SPEU3_2 emitting light of a third color and a third subpixel driving unit SPDU3_2 connected to the third subpixel light emitting unit SPEU3_2 to apply a driving current or a driving voltage. In this case, the first color may be red, the second color may be green, and the third color may be blue.

The first subpixel driving unit SPDU1_2 may have a rectangular planar shape having long sides extending in the seventh direction DR7 and short sides extending in the sixth direction DR6. The first subpixel light emitting unit SPEU1_2 may have a rectangular planar shape having short sides extending in the sixth direction DR6 and long sides extending in the seventh direction DR7. The area (e.g., the planar area) of the first subpixel driving unit SPDU1_2 may be larger than the area (e.g., the planar area) of the first subpixel light emitting unit SPEU1_2.

The first subpixel driving unit SPDU1_2 may not overlap the first subpixel light emitting unit SPEU1_2 connected thereto in the third direction DR3. Accordingly, the third display area DA3 may further include a first connection line CL1_2 connecting the first subpixel driving unit SPDU1_2 and the first subpixel light emitting unit SPEU1_2. In one or more embodiments, the first subpixel driving unit SPDU1_2 may overlap the first subpixel light emitting unit SPEU1_2 connected thereto in the third direction DR3. In this case, the first connection line CL1_2 may not be provided.

The second subpixel driving unit SPDU2_2 may have a rectangular planar shape having long sides extending in the seventh direction DR7 and short sides extending in the sixth direction DR6. The second subpixel light emitting unit SPEU2_2 may have a square or rectangular planar shape having sides extending in the sixth direction DR6 and sides extending in the seventh direction DR7. The area (e.g., the planar area) of the second subpixel driving unit SPDU2_2 may be larger than the area (e.g., the planar area) of the second subpixel light emitting unit SPEU2_2.

The second subpixel driving unit SPDU2_2 may not overlap the second subpixel light emitting unit SPEU2_2 connected thereto in the third direction DR3. Accordingly, the third display area DA3 may further include a second connection line CL2_2 connecting the second subpixel driving unit SPDU2_2 and the second subpixel light emitting unit SPEU2_2. In one or more embodiments, the second subpixel driving unit SPDU2_1 may overlap the second subpixel light emitting unit SPEU2_1 connected thereto in the third direction DR3. In this case, the second connection line CL2_2 may not be provided.

The third subpixel driving unit SPDU3_2 may have a rectangular planar shape having long sides extending in the seventh direction DR7 and short sides extending in the sixth direction DR6. The third subpixel light emitting unit SPEU3_2 may have a square or rectangular planar shape having sides extending in the sixth direction DR6 and sides extending in the seventh direction DR7. The area (e.g., the planar area) of the third subpixel driving unit SPDU3_2 may be larger than the area (e.g., the planar area) of the third subpixel light emitting unit SPEU3_2.

The third subpixel driving unit SPDU3_2 may not overlap the third subpixel light emitting unit SPEU3_2 connected thereto in the third direction DR3. Accordingly, the third display area DA3 may further include a third connection line CL3_2 connecting the third subpixel driving unit SPDU3_2 and the third subpixel light emitting unit SPEU3_2. In one or more embodiments, the third subpixel driving unit SPDU3_2 may overlap the third subpixel light emitting unit SPEU3_2 connected thereto in the third direction DR3. In this case, the third connection line CL3_2 may not be provided.

The area (e.g., the planar area) of the first subpixel light emitting unit SPEU1_2 may be larger than the area (e.g., the planar area) of the second subpixel light emitting unit SPEU2_2 or the area (e.g., the planar area) of the third subpixel light emitting unit SPEU3_2. The area of the second subpixel light emitting unit SPEU2_2 may be substantially the same (e.g., substantially the same in size) as the area of the third subpixel light emitting unit SPEU3_2.

The first subpixel SP1_2 may include the first subpixel light emitting unit SPEU1_2 and the first subpixel driving unit SPDU1_2, the second subpixel SP2_2 may include the second subpixel light emitting unit SPEU2_2 and the second subpixel driving unit SPDU2_2, and the third subpixel SP3_2 may include the third subpixel light emitting unit SPEU3_2 and the third subpixel driving unit SPDU3_2. The first through third subpixel light emitting units SPEU1_2 through SPEU3_2 and the first through third subpixel driving units SPDU1_2 through SPDU3_2 of each of the third pixels PX3 are substantially the same as the first through third subpixel light emitting units SPEU1_1 through SPEU3_1 and the first through third subpixel driving units SPDU1_1 through SPDU3_1 of each of the second pixels PX2, and thus a detailed description thereof may not be provided.

The third display area DA3 may include a second pixel driving area PDA2 disposed adjacent to the first display area DA1. The second pixel driving area PDA2 may extend in the third display area DA3 along an edge of the first display area DA1. The second pixel driving area PDA2 may include the first subpixel driving units SPDU1_2, the second subpixel driving units SPDU2_2, and the third subpixel driving units SPDU3_2 of the third pixels PX3.

The area of the first subpixel driving unit SPDU1_2 of each of the third pixels PX3 may be different from the area of the first subpixel driving unit SPDU1_1 of each of the second pixels PX2 and the area of each of the dummy pixel driving units DPU. In one or more embodiments, while the first subpixel driving unit SPDU1_2 of each of the third pixels PX3 extends in the seventh direction DR7, the first subpixel driving unit SPDU1_1 of each of the second pixels PX2 and the dummy pixel driving units DPU extend in the sixth direction DR6. Therefore, a length of the first subpixel driving unit SPDU1_2 of each of the third pixels PX3 in the sixth direction DR6 may be shorter than the length of the first subpixel driving unit SPDU1_1 of each of the second pixels PX2 in the sixth direction DR6 or the length of each of the dummy pixel driving units DPU in the sixth direction DR6. In one or more embodiments, a length of the first subpixel driving unit SPDU1_2 of each of the third pixels PX3 in the seventh direction DR7 may be longer than the length of the first subpixel driving unit SPDU1_1 of each of the second pixels PX2 in the seventh direction DR7 or the length of each of the dummy pixel driving units DPU in the seventh direction DR7.

The area of the second subpixel driving unit SPDU2_2 of each of the third pixels PX3 may be different from the area of the second subpixel driving unit SPDU2_1 of each of the second pixels PX2 and the area of each of the dummy pixel driving units DPU. In one or more embodiments, while the second subpixel driving unit SPDU2_2 of each of the third pixels PX3 extends in the seventh direction DR7, the second subpixel driving unit SPDU2_1 of each of the second pixels PX2 and the dummy pixel driving units DPU extend in the sixth direction DR6. Therefore, a length of the second subpixel driving unit SPDU2_2 of each of the third pixels PX3 in the sixth direction DR6 may be shorter than the length of the second subpixel driving unit SPDU2_1 of each of the second pixels PX2 in the sixth direction DR6 or the length of each of the dummy pixel driving units DPU in the sixth direction DR6. In one or more embodiments, a length of the second subpixel driving unit SPDU2_2 of each of the third pixels PX3 in the seventh direction DR7 may be longer than the length of the second subpixel driving unit SPDU2_1 of each of the second pixels PX2 in the seventh direction DR7 or the length of each of the dummy pixel driving units DPU in the seventh direction DR7.

The area of the first subpixel light emitting unit SPEU1_2 of each of the third pixels PX3 may be substantially the same as the area of the first subpixel light emitting unit SPEU1_1 of each of the second pixels PX2. The area of the second subpixel light emitting unit SPEU2_2 of each of the third pixels PX3 may be substantially the same as the area of the second subpixel light emitting unit SPEU2_1 of each of the second pixels PX2. The area of the third subpixel light emitting unit SPEU3_2 of each of the third pixels PX3 may be substantially the same as the area of the third subpixel light emitting unit SPEU3_1 of each of the second pixels PX2.

The area of the third subpixel driving unit SPDU3_2 of each of the third pixels PX3 may be different from the area of the third subpixel driving unit SPDU3_1 of each of the second pixels PX2 and the area of each of the dummy pixel driving units DPU. In one or more embodiments, while the third subpixel driving unit SPDU3_2 of each of the third pixels PX3 extends in the seventh direction DR7, the third subpixel driving unit SPDU3_1 of each of the second pixels PX2 and the dummy pixel driving units DPU extend the sixth direction DR6. Therefore, a length of the third subpixel driving unit SPDU3_2 of each of the third pixels PX3 in the sixth direction DR6 may be shorter than the length of the third subpixel driving unit SPDU3_1 of each of the second pixels PX2 in the sixth direction DR6 or the length of each of the dummy pixel driving units DPU in the sixth direction DR6. In one or more embodiments, a length of the third subpixel driving unit SPDU3_2 of each of the third pixels PX3 in the seventh direction DR7 may be longer than the length of the third subpixel driving unit SPDU3_1 of each of the second pixels PX2 in the seventh direction DR7 or the length of each of the dummy pixel driving units DPU in the seventh direction DR7.

The scan driving unit SDU may be disposed adjacent to the second display area DA2. The scan driving unit SDU may extend in the third display area DA3 along the edge of the first display area DA1.

The scan driving unit SDU may transmit scan signals to scan lines. For example, the scan driving unit SDU may transmit write scan signals to write scan lines GWL (e.g., see FIG. 9), transmit control scan signals to control scan lines GCL (e.g., see FIG. 9), transmit initialization scan signals to initialization scan lines GIL (e.g., see FIG. 9), and transmit bias scan signals to bias scan lines GBL (e.g., see FIG. 9). In one or more embodiments, the scan driving unit SDU may transmit emission signals to emission lines EL (e.g., see FIG. 9). Each of the subpixel driving units SPDU1 through SPDU4 of the first pixels PX1, the subpixel driving units SPDU1_1 through SPDU3_1 of the second pixels PX2, and the subpixel driving units SPDU1_2 through SPDU3_2 of the third pixels PX3 may be connected to any one write scan line GWL, any one control scan line GCL, any one initialization scan line GIL, any one bias scan line GBL, and any one emission line EL.

The scan driving unit SDU may overlap the first subpixel light emitting units SPEU1_2, the second subpixel light emitting units SPEU2_2, and the third subpixel light emitting units SPEU3_2 of some of the third pixels PX3. The scan driving unit SDU may overlap the first connection lines CL1_2, the second connection lines CL2_2, and the third connection lines CL3_2 connected to the first subpixel light emitting units SPEU1_2, the second subpixel light emitting units SPEU2_2, and the third subpixel light emitting units SPEU3_2 of the third pixels PX3 overlapping the scan driving unit SDU.

When the second display area DA2 does not include the dummy pixel driving units DPU, the density of circuit patterns of the first pixel driving area PDA1 may be significantly different from the density of circuit patterns of the second pixel driving area PDA2. In this case, due to etching deviation, there may be a difference between a line width of the circuit patterns of the first pixel driving area PDA1 and a line width of the circuit patterns of the second pixel driving area PDA2 formed by an etching process. In this case, even when the same data voltage is applied, the luminance of light emitted from the subpixel light emitting units SPEU1_1 through SPEU3_1 of the second pixels PX2 may be different from the luminance of light emitted from the subpixel light emitting units SPEU1_2 through SPEU3_2 of the third pixels PX3.

When the second display area DA2 includes the dummy pixel driving units DPU as illustrated in FIGS. 6 through 8, the density of the circuit patterns of the first pixel driving area PDA1 may be similar to the density of the circuit patterns of the second pixel driving area PDA2. In this case, there may be little difference between the line width of circuit patterns of the first pixel driving area PDA1 and the line width of the circuit patterns of the second pixel driving area PDA2 formed by an etching process. Therefore, it is possible to prevent or reduce a difference between the luminance of light emitted from the subpixel light emitting units SPEU1_1 through SPEU3_1 of the second pixels PX2 and the luminance of light emitted from the subpixel light emitting units SPEU1_2 through SPEU3_2 of the third pixels PX3.

Figure 9:
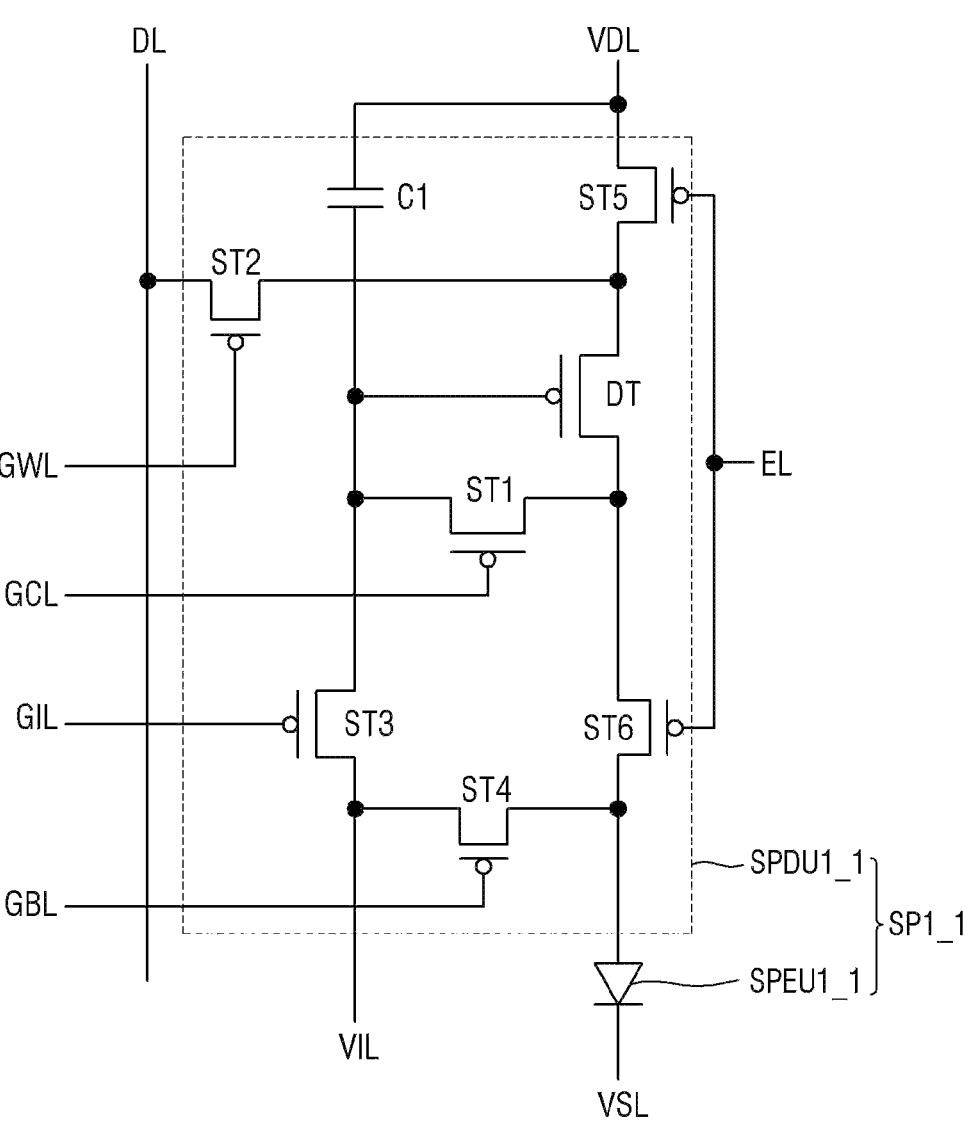
FIG. 9 is a circuit diagram of a first subpixel of a second pixel according to an embodiment.

FIG. 9 is a circuit diagram of the first subpixel SP1_1 of a second pixel PX2 according to an embodiment.

Referring to FIG. 9, the first subpixel SP1_1 of the second pixel PX2 according to the embodiment may include the first subpixel driving unit SPDU1_1 and the first subpixel light emitting unit SPEU1_1.

The first subpixel driving unit SPDU1_1 may be connected to scan lines GWL, GIL, GCL and GBL, an emission line EL, and a data line. For example, a subpixel SPX may be connected to a write scan line GWL, an initialization scan line GIL, a control scan line GCL, a bias scan line GBL, an emission line EL, and a data line DL. Here, the write scan line GWL may be a $k^{th}$ (k is a positive integer) write scan line, the initialization scan line GIL may be a $k^{th}$ initialization scan line, the control scan line GCL may be a $k^{th}$ control scan line, the bias scan line GBL may be a $k^{th}$ bias scan line, and the emission line EL may be a $k^{th}$ emission line. The $k^{th}$ write scan line refers to the write scan line GWL connected to the first subpixel driving unit SPDU1_1 of the second pixel PX2 disposed in a $k^{th}$ column, and the $k^{th}$ initialization scan line refers to the initialization scan line GIL connected to the first subpixel driving unit SPDU1_1 of the second pixel PX2 disposed in the $k^{th}$ column. In one or more embodiments, the $k^{th}$ control scan line refers to the control scan line GCL connected to the first subpixel driving unit SPDU1_1 of the second pixel PX2 disposed in the $k^{th}$ column, and the $k^{th}$ bias scan line refers to the bias scan line GBL connected to the first subpixel driving unit SPDU1_1 of the second pixel PX2 disposed in the $k^{th}$ column. In one or more embodiments, the $k^{th}$ emission line refers to the emission line EL connected to the first subpixel driving unit SPDU1_1 of the second pixel PX2 disposed in the $k^{th}$ column. In this case, the $k^{th}$ write scan line may be substantially the same as the $k^{th}$ control scan line. In one or more embodiments, the $k^{th}$ write scan line may be the same as a $(k+1)^{th}$ initialization scan line. In one or more embodiments, the $k^{th}$ bias scan line may be the same as the $(k+1)^{th}$ initialization scan line.

The first subpixel driving unit SPDU1_1 according to an embodiment includes a driving transistor DT, switch elements, and a capacitor C1. The switch elements include first through sixth transistors ST1 through ST6.

The driving transistor DT includes a gate electrode, a first electrode, and a second electrode. The driving transistor DT controls a drain-source current Ids (hereinafter, referred to as a "driving current") flowing between the first electrode and the second electrode according to a data voltage applied to the gate electrode.

The first subpixel light emitting unit SPEU1_1 may be an organic light emitting diode including an anode (or pixel electrode), a cathode (or a common electrode), and an organic light emitting layer disposed between the anode and the cathode. In one or more embodiments, the first subpixel light emitting unit SPEU1_1 may be an inorganic light emitting element including an anode, a cathode, and an inorganic semiconductor disposed between the anode and the cathode. In one or more embodiments, the first subpixel light emitting unit SPEU1_1 may be a quantum dot light emitting element including an anode, a cathode, and a quantum dot light emitting layer disposed between the anode and the cathode. In one or more embodiments, the first subpixel light emitting unit SPEU1_1 may be a micro-light emitting diode. The first subpixel light emitting unit SPEU1_1 emits light according to the driving current Ids. The amount of light emitted from the first subpixel light emitting unit SPEU1_1 may be proportional to the driving current Ids.

The anode of the first subpixel light emitting unit SPEU1_1 may be connected to a first electrode of the fourth transistor ST4 and a second electrode of the sixth transistor ST6, and the cathode may be connected to a second power line VSL to which a second power supply voltage is applied.

The capacitor C1 is formed between the second electrode of the driving transistor DT and a first power line VDL to which a first power supply voltage is applied. The first power supply voltage may be a voltage of a higher level than the second power supply voltage. One electrode of the capacitor C1 may be connected to the second electrode of the driving transistor DT, and the other electrode may be connected to the first power line VDL.

As illustrated in FIG. 9, the first through sixth transistors ST1 through ST6 and the driving transistor DT may all be formed as p-type metal oxide semiconductor field effect transistors (MOSFETs). In this case, an active layer of each of the first through sixth transistors ST1 through ST6 and the driving transistor DT may be made of polysilicon or an oxide semiconductor.

A gate electrode of the second transistor ST2 may be connected to the write scan line GWL, and a gate electrode of the first transistor ST1 may be connected to the control scan line GCL. A gate electrode of the third transistor ST3 may be connected to the initialization scan line GIL, and a gate electrode of the fourth transistor ST4 may be connected to the bias scan line GBL. Because the first through sixth transistors ST1 through ST6 are formed as p-type MOSFETs, they may be turned on when scan signals and an emission signal having a gate low voltage are transmitted to the control scan line GCL, the initialization scan line GIL, the write scan line GWL, the bias scan line GBL, and the emission line EL, respectively. One electrode of the third transistor ST3 and one electrode of the fourth transistor ST4 may be connected to the initialization voltage line VIL.

A circuit diagram of the second subpixel SP2_1 and a circuit diagram of the third subpixel SP3_1 of the second pixel PX2 may be substantially the same as the circuit diagram of the first subpixel SP1_1 of the second pixel PX2 described with reference to FIG. 9. Therefore, a detailed description of the circuit diagram of the second subpixel SP2_1 and the circuit diagram of the third subpixel SP3_1 of the second pixel PX2 may not be provided.

In one or more embodiments, a circuit diagram of the first subpixel SP1, a circuit diagram of the second subpixel SP2, a circuit diagram of the third subpixel SP3, and a circuit diagram of the fourth subpixel SP4 of a first pixel PX1 may be substantially the same as the circuit diagram of the first subpixel SP1_1 of the second pixel PX2 described with reference to FIG. 9. Therefore, a detailed description of the circuit diagram of the first subpixel SP1, the circuit diagram of the second subpixel SP2, the circuit diagram of the third subpixel SP3, and the circuit diagram of the fourth subpixel SP4 of the first pixel PX1 may not be provided.

In one or more embodiments, a circuit diagram of the first subpixel SP1_2, a circuit diagram of the second subpixel SP2_2, and a circuit diagram of the third subpixel SP3_2 of a third pixel PX3 may be substantially the same as the circuit diagram of the first subpixel SP1_1 of the second pixel PX2 described with reference to FIG. 9. Therefore, a detailed description of the circuit diagram of the first subpixel SP1_2, the circuit diagram of the second subpixel SP2_2, and the circuit diagram of the third subpixel SP3_2 of the third pixel PX3 may not be provided.

Figure 10:
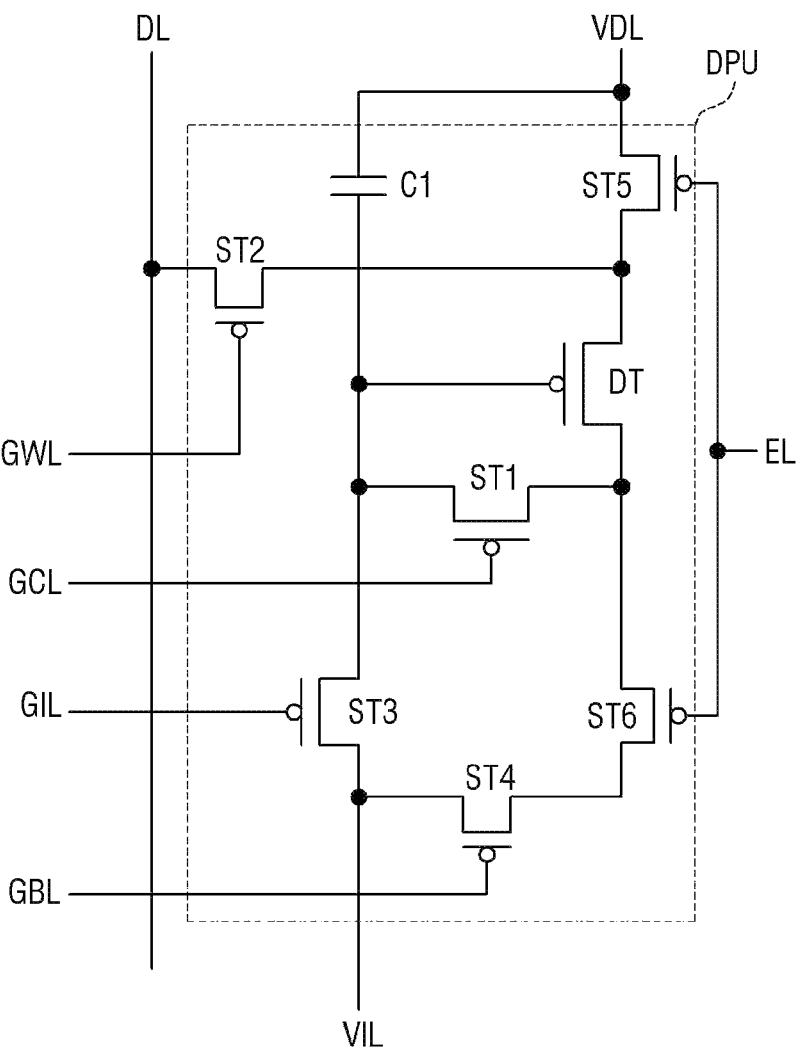
FIG. 10 is a circuit diagram of a dummy pixel driving unit according to an embodiment.

FIG. 10 is a circuit diagram of a dummy pixel driving unit DPU according to an embodiment.

Referring to FIG. 10, the circuit diagram of the dummy pixel driving unit DPU is only different from the circuit diagram of the first subpixel SP1_1 of the second pixel PX2 of FIG. 9 in that a first electrode of a fourth transistor ST4 and a second electrode of a sixth transistor ST6 are not connected to any subpixel light emitting unit. For example, a driving current Ids of a driving transistor DT in the dummy pixel driving unit DPU may not flow to any subpixel light emitting unit.

Figure 11:
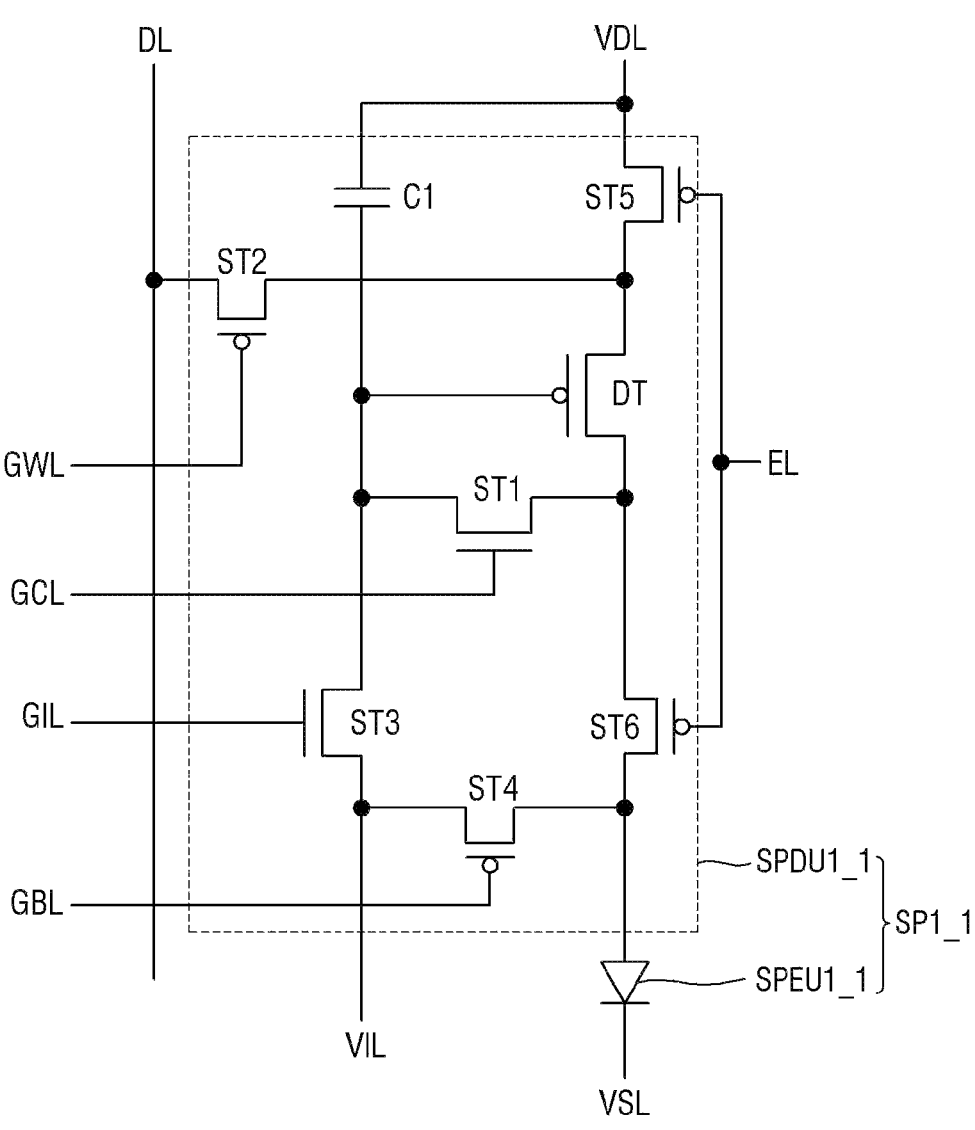
FIG. 11 is a circuit diagram of a first subpixel of a second pixel according to an embodiment.

FIG. 11 is a circuit diagram of a first subpixel SP1_1 of a second pixel PX2 according to an embodiment.

Referring to FIG. 11, a driving transistor DT, a second transistor ST2, a fourth transistor ST4, a fifth transistor ST5, and a sixth transistor ST6 may be formed as p-type MOS-FETs, and a first transistor ST1 and a third transistor ST3 may be formed as n-type MOSFETs. An active layer of each of the driving transistor DT, the second transistor ST2, the fourth transistor ST4, the fifth transistor ST5, and the sixth transistor ST6 formed as p-type MOSFETs may be made of polysilicon, and an active layer of each of the first transistor ST1 and the third transistor ST3 formed as n-type MOSFETs may be made of an oxide semiconductor. In this case, transistors made of polysilicon and transistors made of an oxide semiconductor may be disposed on or at different layers.

Because the first transistor ST1 and the third transistor ST3 are formed as n-type MOSFETs, the first transistor ST1 may be turned on when a control scan signal having a gate high voltage is transmitted to a control scan line GCL, and the third transistor ST3 may be turned on when an initialization scan signal is transmitted to an initialization scan line GIL. In contrast, because the second transistor ST2, the fourth transistor ST4, the fifth transistor ST5, and the sixth transistor ST6 are formed as p-type MOSFETs, they may be turned on when a scan signal having a gate low voltage and an emission signal are transmitted to a write scan line GWL and an emission line EL, respectively.

In one or more embodiments, in FIG. 11, the fourth transistor ST4 may be formed as an n-type MOSFET. In this case, the active layer of the fourth transistor ST4 may be made of an oxide semiconductor. When the fourth transistor ST4 is formed as an n-type MOSFET, it may be turned on when a bias scan signal having a gate high voltage is transmitted to a bias scan line GBL.

In one or more embodiments, although not illustrated in FIGS. 9 and 11, all of the first through sixth transistors ST1 through ST6 and the driving transistor DT may be formed as n-type MOSFETs.

Figure 12:
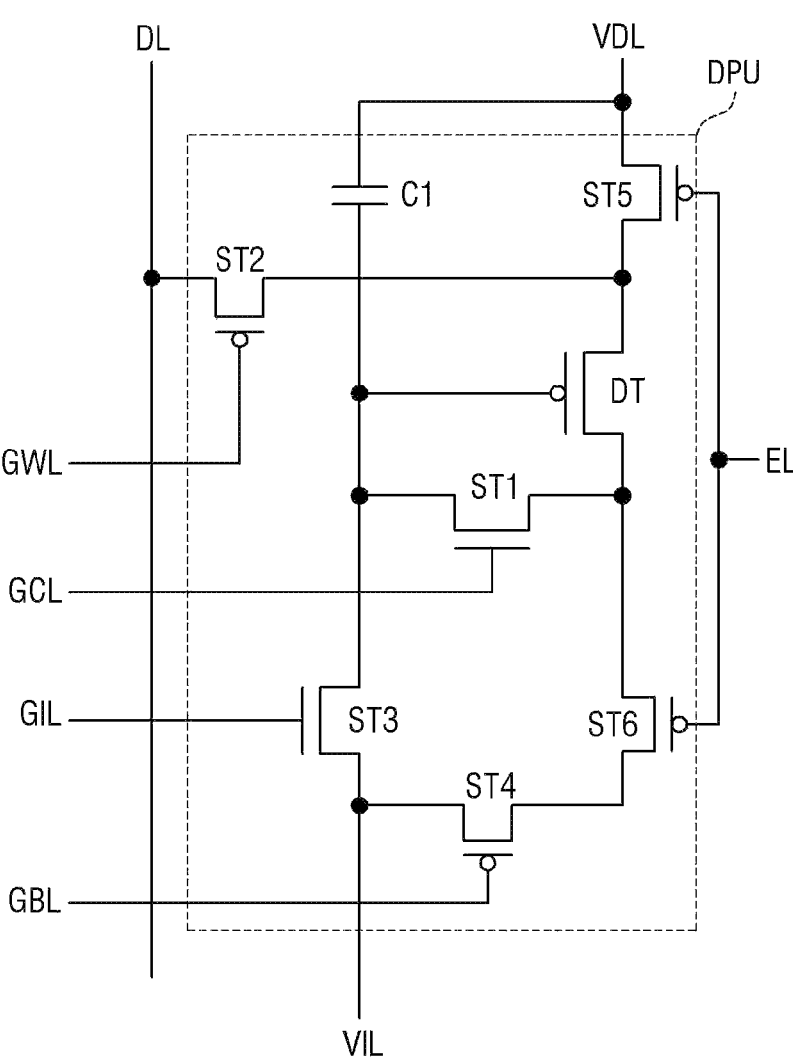
FIG. 12 is a circuit diagram of a dummy pixel driving unit according to an embodiment.

FIG. 12 is a circuit diagram of a dummy pixel driving unit DPU according to an embodiment.

Referring to FIG. 12, the circuit diagram of the dummy pixel driving unit DPU is only different from the circuit diagram of the first subpixel SP1_1 of the second pixel PX2 of FIG. 11 in that a first electrode of a fourth transistor ST4 and a second electrode of a sixth transistor ST6 are not connected to any subpixel light emitting unit. For example, a driving current Ids of a driving transistor DT in the dummy pixel driving unit DPU may not flow to any subpixel light emitting unit.

Figure 13:
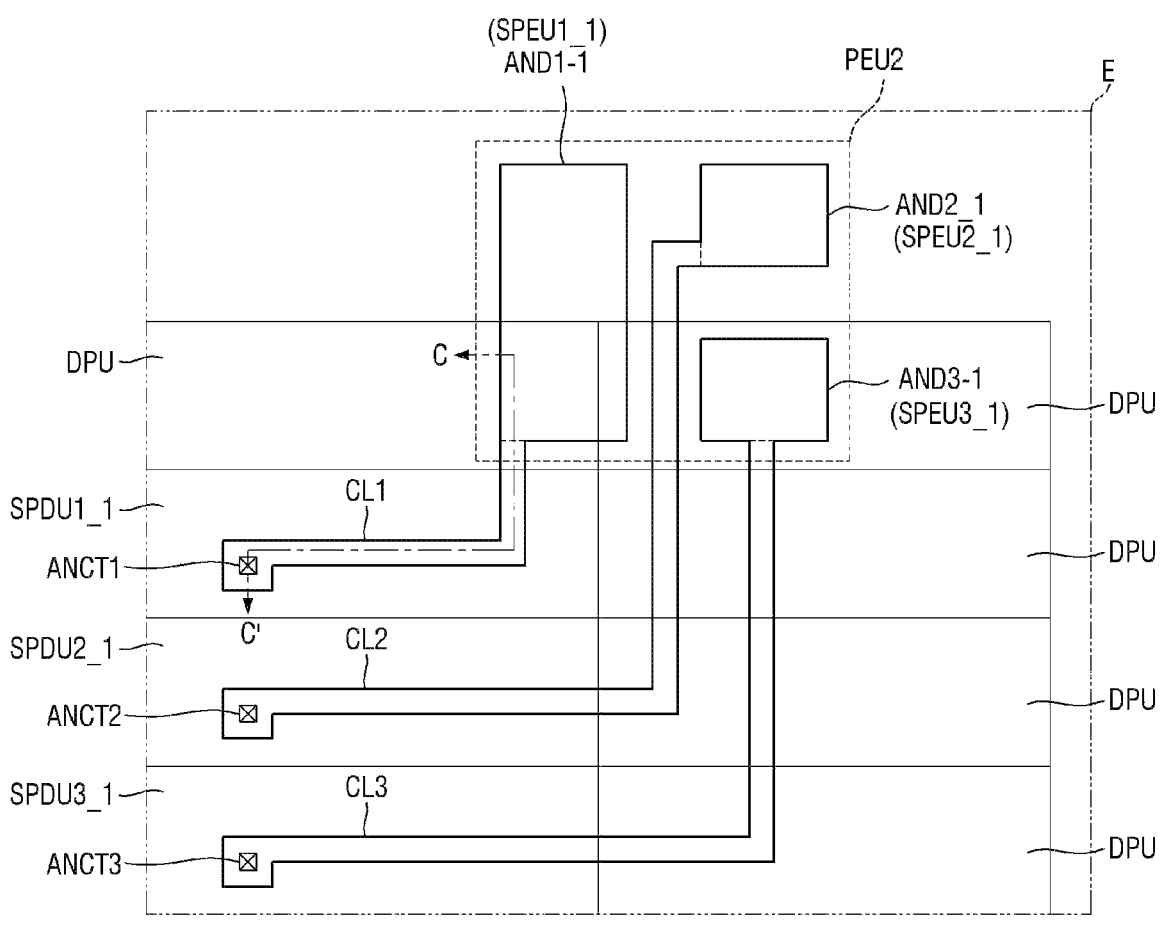
FIG. 13 is a layout view illustrating an example of a second pixel and dummy pixel driving units of FIG. 7 in more detail.

FIG. 13 is a layout view illustrating an example of a second pixel PX2 and the dummy pixel driving units DPU of FIG. 7 in more detail. FIG. 13 is a detailed layout view of area E of FIG. 7.

Referring to FIG. 13, a second light emitting unit PEU2 includes a first anode AND1_1 of the first subpixel light emitting unit SPEU1_1, a second anode AND2_1 of the second subpixel light emitting unit SPEU2_1, and a third anode AND3_1 of the third subpixel light emitting unit SPEU3_1. The first anode AND1_1 may be connected to the first connection line CL1, the second anode AND2_1 may be connected to the second connection line CL2, and the third anode AND3_1 may be connected to the third connection line CL3. The first anode AND1_1 and the first connection line CL1 may be integrally formed, the second anode AND2_1 and the second connection line CL2 may be integrally formed, and the third anode AND3_1 and the third connection line CL3 may be integrally formed. For example, the first anode AND1_1 and the first connection line CL1 may be formed as a monolithic structure, the second anode AND2_1 and the second connection line CL2 may be formed as a monolithic structure, and the third anode AND3_1 and the third connection line CL3 may be formed as a monolithic structure.

The first connection line CL1 may be connected to the first subpixel driving unit SPDU1_1 of the second pixel PX2 through a first anode contact hole ANCT1. The second connection line CL2 may be connected to the second subpixel driving unit SPDU2_1 of the second pixel PX2 through a second anode contact hole ANCT2. The third connection line CL3 may be connected to the third subpixel driving unit SPDU3_1 of the second pixel PX2 through a third anode contact hole ANCT3.

As illustrated in FIG. 13, the first subpixel light emitting unit SPEU1_1 of the second pixel PX2 does not overlap the first subpixel driving unit SPDU1_1 in the third direction DR3. Therefore, the first anode AND1_1 of the first subpixel light emitting unit SPEU1_1 and the first subpixel driving unit SPDU1_1 may be connected to each other by the first connection line CL1. In this case, because the first anode AND1_1 is disposed above the first subpixel driving unit SPDU1_1, the first connection line CL1 may overlap a dummy pixel driving unit DPU disposed above the first subpixel driving unit SPDU1_1.

In one or more embodiments, the second subpixel light emitting unit SPEU2_1 of the second pixel PX2 does not overlap the second subpixel driving unit SPDU2_1 in the third direction DR3. Therefore, the second anode AND2_1 of the second subpixel light emitting unit SPEU2_1 and the second subpixel driving unit SPDU2_1 may be connected to each other by the second connection line CL2. In this case, because the second anode AND2_1 is disposed above a dummy pixel driving unit DPU disposed on a right side of the second subpixel driving unit SPDU2_1, the second connection line CL2 may overlap the dummy pixel driving unit DPU disposed on the right side of the second subpixel driving unit SPDU2_1. The second connection line CL2 may overlap a plurality of dummy pixel driving units DPU. The number of the dummy pixel driving units DPU overlapped by the second connection line CL2 may be greater than the number of the dummy pixel driving units DPU overlapped by the first connection line CL1.

In one or more embodiments, the third subpixel light emitting unit SPEU3_1 of the second pixel PX2 does not overlap the third subpixel driving unit SPDU3_1 in the third direction DR3. Therefore, the third anode AND3_1 of the third subpixel light emitting unit SPEU3_1 and the third subpixel driving unit SPDU3_1 may be connected to each other by the third connection line CL3. In this case, because the third anode AND3_1 is disposed above a dummy pixel driving unit DPU disposed on a right side of the third subpixel driving unit SPDU3_1, the third connection line CL3 may overlap the dummy pixel driving unit DPU disposed on the right side of the third subpixel driving unit SPDU3_1. The third connection line CL3 may overlap a plurality of dummy pixel driving units DPU. The number of the dummy pixel driving units DPU overlapped by the third connection line CL3 may be greater than the number of the dummy pixel driving units DPU overlapped by the second connection line CL2.

Figure 14:
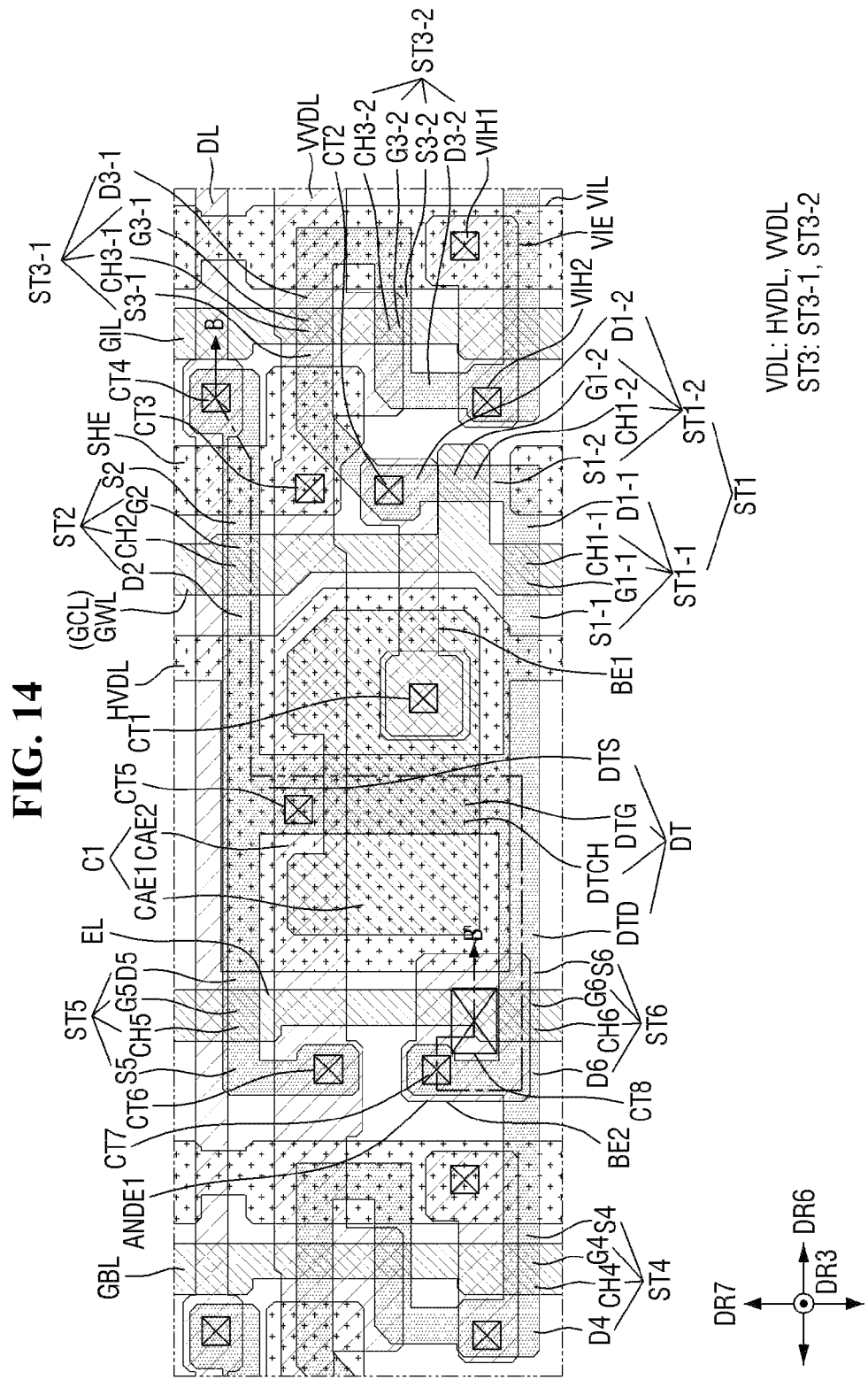
FIG. 14 is a detailed layout view of an example of a first subpixel driving unit of the second pixel of FIG. 13.

FIG. 14 is a detailed layout view of an example of the first subpixel driving unit SPDU1_1 of the second pixel PX2 of FIG. 13.

In FIG. 14, a case where the first subpixel driving unit SPDU1_1 of the second pixel PX2 includes a driving transistor DT and first through sixth transistors ST1 through ST6 formed as p-type MOSFETs as illustrated in FIG. 9 will be mainly described.

Referring to FIG. 14, in the first subpixel driving unit SPDU1_1 of the second pixel PX2, a write scan line GWL, an initialization scan line GIL, a bias scan line GBL, and an emission line EL may extend in the seventh direction DR7. In one or more embodiments, in the first subpixel driving unit SPDU1_1 of the second pixel PX2, an initialization voltage line VIL and a first horizontal voltage line HVDL may extend in the seventh direction DR7. In one or more embodiments, in the first subpixel driving unit SPDU1_1 of the second pixel PX2, a first vertical voltage line and a data line DL may extend in the sixth direction DR6.

The first subpixel driving unit SPDU1_1 of the second pixel PX2 may include the driving transistor DT, the first through sixth transistors ST1 through ST6, a capacitor C1, connection electrodes BE1 and BE2, and a shielding electrode SHE. The first transistor ST1 may include a $(1-1)^{th}$ transistor ST1-1 and a $(1-2)^{th}$ transistor ST1-2. The third transistor ST3 may include a $(3-1)^{th}$ transistor ST3-1 and a $(3-2)^{th}$ transistor ST3-2.

The driving transistor DT may include a channel layer DTCH, a gate electrode DTG, a first electrode DTS, and a second electrode DTD. The channel layer DTCH of the driving transistor DT may overlap the gate electrode DTG of the driving transistor DT. The gate electrode DTG of the driving transistor DT may be disposed on the channel layer DTCH of the driving transistor DT.

The gate electrode DTG of the driving transistor DT may be connected to a first connection electrode BE1 through a first contact hole CT1. The first connection electrode BE1 may be connected to a second electrode D1-2 of the $(1-2)^{th}$ transistor ST1-2 through a second contact hole CT2. The first connection electrode BE1 may cross a control scan line GCL.

The first electrode DTS of the driving transistor DT may be connected to a second electrode D2 of the second transistor ST2 and a second electrode D5 of the fifth transistor ST5.

The second electrode DTD of the driving transistor DT may be connected to a first electrode S1-1 of the $(1-1)^{th}$ transistor ST1-1 and a first electrode S6 of the sixth transistor ST6.

The $(1-1)^{th}$ transistor ST1-1 may include a channel layer CH1-1, a gate electrode G1-1, the first electrode S1-1, and a second electrode D1-1. The channel layer CH1-1 of the $(1-1)^{th}$ transistor ST1-1 may overlap the gate electrode G1-1 of the $(1-1)^{th}$ transistor ST1-1. The gate electrode G1-1 of the $(1-1)^{th}$ transistor ST1-1 may be integrally formed with the write scan line GWL. The gate electrode G1-1 of the $(1-1)^{th}$ transistor ST1-1 may be a portion of the write scan line GWL. The first electrode S1-1 of the $(1-1)^{th}$ transistor ST1-1 may be connected to the second electrode DTD of the driving transistor DT. The second electrode D1-1 of the $(1-1)^{th}$ transistor ST1-1 may be connected to a first electrode S1-2 of the $(1-2)^{th}$ transistor ST1-2.

The $(1-2)^{th}$ transistor ST1-2 may include a channel layer CH1-2, a gate electrode G1-2, the first electrode S1-2, and the second electrode D1-2. The channel layer CH1-2 of the $(1-2)^{th}$ transistor ST1-2 may overlap the gate electrode G1-2 of the $(1-2)^{th}$ transistor ST1-2. The gate electrode G1-2 of the $(1-2)^{th}$ transistor ST1-2 may be integrally formed with the write scan line GWL. The gate electrode G1-2 of the $(1-2)^{th}$ transistor ST1-2 may protrude from the write scan line GWL in the sixth direction DR6. The first electrode S1-2 of the $(1-2)^{th}$ transistor ST1-2 may be connected to the second electrode D1-1 of the $(1-1)^{th}$ transistor ST1-1. The second electrode D1-2 of the $(1-2)^{th}$ transistor ST1-2 may be connected to the first connection electrode BE1.

The second transistor ST2 may include a channel layer CH2, a gate electrode G2, a first electrode S2, and the second electrode D2. The channel layer CH2 of the second transistor ST2 may overlap the gate electrode G2 of the second transistor ST2. The gate electrode G2 of the second transistor ST2 may be integrally formed with the write scan line GWL. The gate electrode G2 of the second transistor ST2 may be a portion of the write scan line GWL. The first electrode S1 of the second transistor ST2 may be connected to the data line DL through a fourth contact hole CT4. The second electrode D2 of the second transistor ST2 may be connected to the first electrode DTS of the driving transistor DT.

The $(3-1)^{th}$ transistor ST3-1 may include a channel layer CH3-1, a gate electrode G3-1, a first electrode S3-1, and a second electrode D3-1. The channel layer CH3-1 of the $(3-1)^{th}$ transistor ST3-1 may overlap the gate electrode G3-1 of the $(3-1)^{th}$ transistor ST3-1. The gate electrode G3-1 of the $(3-1)^{th}$ transistor ST3-1 may be integrally formed with the initialization scan line GIL. The gate electrode G3-1 of the $(3-1)^{th}$ transistor ST3-1 may be a portion of the initialization scan line GIL. The first electrode S3-1 of the $(3-1)^{th}$ transistor ST3-1 may be connected to the first connection electrode BE1. The second electrode D3-1 of the $(3-1)^{th}$ transistor ST3-1 may be connected to a first electrode S3-2 of the $(3-2)^{th}$ transistor ST3-2.

The $(3-2)^{th}$ transistor ST3-2 may include a channel layer CH3-2, a gate electrode G3-2, the first electrode S3-2, and a second electrode D3-2. The channel layer CH3-2 of the $(3-2)^{th}$ transistor ST3-2 may overlap the gate electrode G3-2 of the $(3-2)^{th}$ transistor ST3-2. The gate electrode G3-2 of the $(3-2)^{th}$ transistor ST3-2 may be integrally formed with the initialization scan line GIL. The gate electrode G3-2 of the $(3-2)^{th}$ transistor ST3-2 may be a portion of the initialization scan line GIL. The first electrode S3-2 of the $(3-2)^{th}$ transistor ST3-2 may be connected to the second electrode D3-1 of the $(3-1)^{th}$ transistor ST3-1. The second electrode D3-2 of the $(3-2)^{th}$ transistor ST3-2 may be connected to the initialization voltage line VIL through a first initialization contact hole VIH1.

The fourth transistor ST4 may include a channel layer CH4, a gate electrode G4, a first electrode S4, and a second electrode D4. The channel layer CH4 of the fourth transistor ST4 may overlap the gate electrode G4 of the fourth transistor ST4. The gate electrode G4 of the fourth transistor ST4 may be integrally formed with the bias scan line GBL. The gate electrode G4 of the fourth transistor ST4 may be a portion of the bias scan line GBL. The first electrode S4 of the fourth transistor ST4 may be connected to a second connection electrode BE2 through a seventh contact hole CT7. The second electrode D4 of the fourth transistor ST4 may be connected to the initialization voltage line VIL through a second initialization contact hole VIH2.

The fifth transistor ST5 may include a channel layer CH5, a gate electrode G5, a first electrode S5, and the second electrode D5. The channel layer CH5 of the fifth transistor ST5 may overlap the gate electrode G5 of the fifth transistor ST5. The gate electrode G5 of the fifth transistor ST5 may be integrally formed with the emission line EL. The gate electrode G5 of the fifth transistor ST5 may be a portion of the emission line EL. The first electrode S5 of the fifth transistor ST5 may be connected to the first vertical voltage line VVDL through a sixth contact hole CT6. The second electrode D5 of the fifth transistor ST5 may be connected to the first electrode DTS of the driving transistor DT.

The sixth transistor ST6 may include a channel layer CH6, a gate electrode G6, the first electrode S6, and a second electrode D6. The channel layer CH6 of the sixth transistor ST6 may overlap the gate electrode G6 of the sixth transistor ST6. The gate electrode G6 of the sixth transistor ST6 may be integrally formed with the emission line EL. The gate electrode G6 of the sixth transistor ST6 may be a portion of the emission line EL. The first electrode S6 of the sixth transistor ST6 may be connected to the second electrode DTD of the driving transistor DT. The second electrode D6 of the sixth transistor ST6 may be connected to the second connection electrode BE2 through the seventh contact hole CT7.

A first electrode CAE1 of the capacitor C1 may be integrally formed with the gate electrode DTG of the driving transistor DT. The first electrode CAE1 of the capacitor C1 may be a portion of the gate electrode DTG of the driving transistor DT. A second electrode CAE2 of the capacitor C1 may be integrally formed with the first horizontal voltage line HVDL. The second electrode CAE2 of the capacitor C1 may be a portion of the first horizontal voltage line HVDL. The second electrode CAE2 of the capacitor C1 may overlap the first electrode CAE1 of the capacitor C1. The first horizontal voltage line HVDL may be connected to the first vertical voltage line WDL through a fifth contact hole CT5.

The first connection electrode BE1 may be connected to the gate electrode DTG of the driving transistor DT through the first contact hole CT1 and may be connected to the second electrode D1-2 of the $(1-2)^{th}$ transistor ST1-2 and the first electrode S3-1 of the $(3-1)^{th}$ transistor ST3-1 through the second contact hole CT2. The first connection electrode BE1 may extend in the sixth direction DR6. The first connection electrode BE1 may overlap the write scan line GWL and the first horizontal voltage line HVDL.

The second connection electrode BE2 may be connected to the second electrode D6 of the sixth transistor ST6 through the seventh contact hole CT7. The shielding electrode SHE may be connected to the first vertical voltage line WDL through a third contact hole CT3. The shielding electrode SHE may overlap the second electrode D1-1 of the $(1-1)^{th}$ transistor ST1-1 and the first electrode S1-2 of the $(1-2)^{th}$ transistor ST1-2. In one or more embodiments, the shielding electrode SHE may overlap the first electrode S3-1 of the $(3-1)^{th}$ transistor ST3-1. Therefore, due to the shielding electrode SHE, the second electrode D1-1 of the $(1-1)^{th}$ transistor ST1-1, the first electrode S1-2 of the $(1-2)^{th}$ transistor ST1-2, and the first electrode S3-1 of the $(3-1)^{th}$ transistor ST3-1 may not be affected by a voltage change of the data line DL.

The second subpixel driving unit SPDU2_1 and the third subpixel driving unit SPDU3_1 of the second pixel PX2 and the dummy pixel driving units DPU may be substantially the same as the first subpixel driving unit SPDU1_1 of the second pixel PX2 described with reference to FIG. 14. Therefore, a detailed description of the second subpixel driving unit SPDU2_1 and the third subpixel driving unit SPDU3_1 of the second pixel PX2 and the dummy pixel driving units DPU may not be provided.

Figure 15:
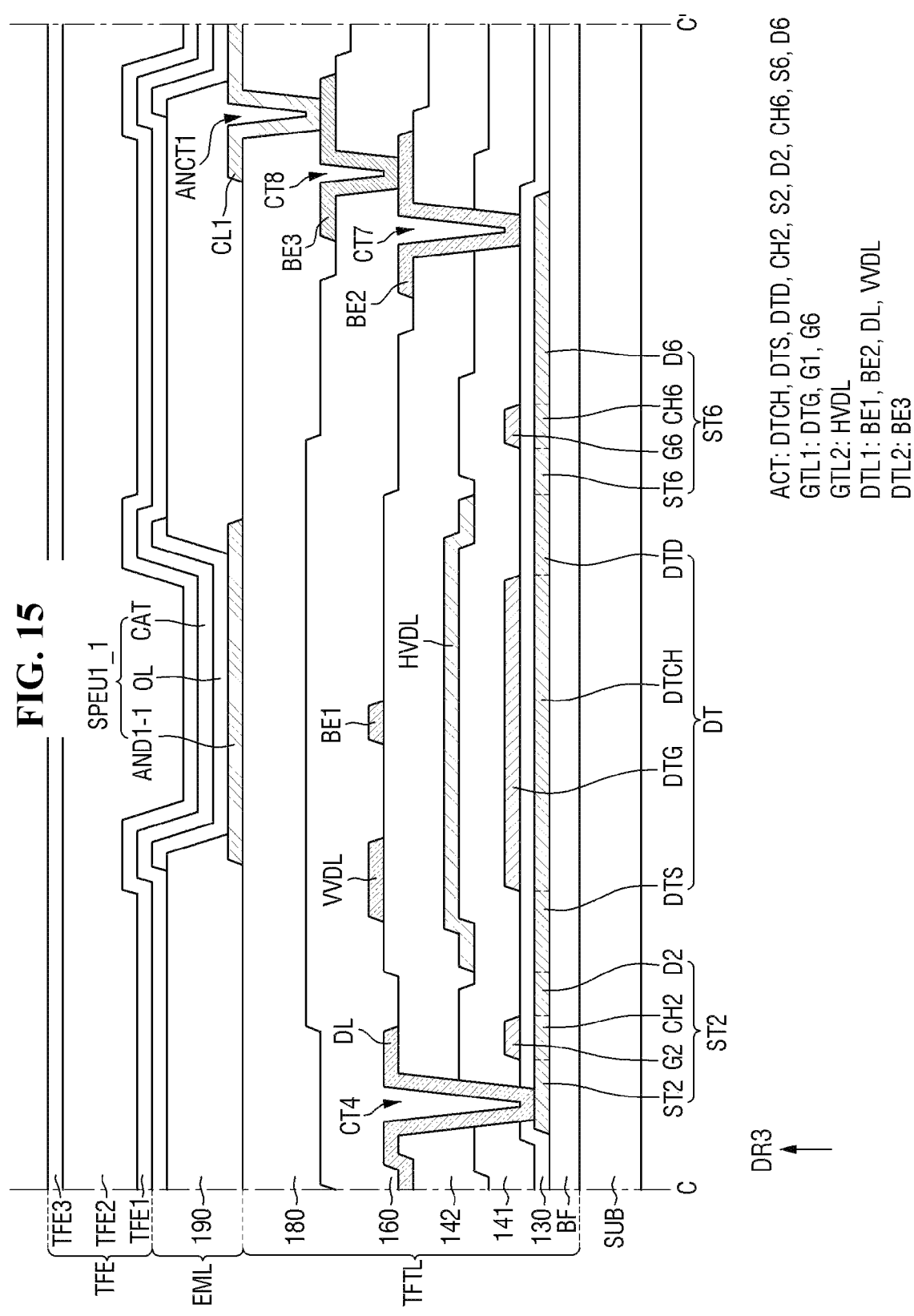
FIG. 15 is a cross-sectional view of an example of the display panel taken along the line B-B' of FIG. 14.
Figure 16:
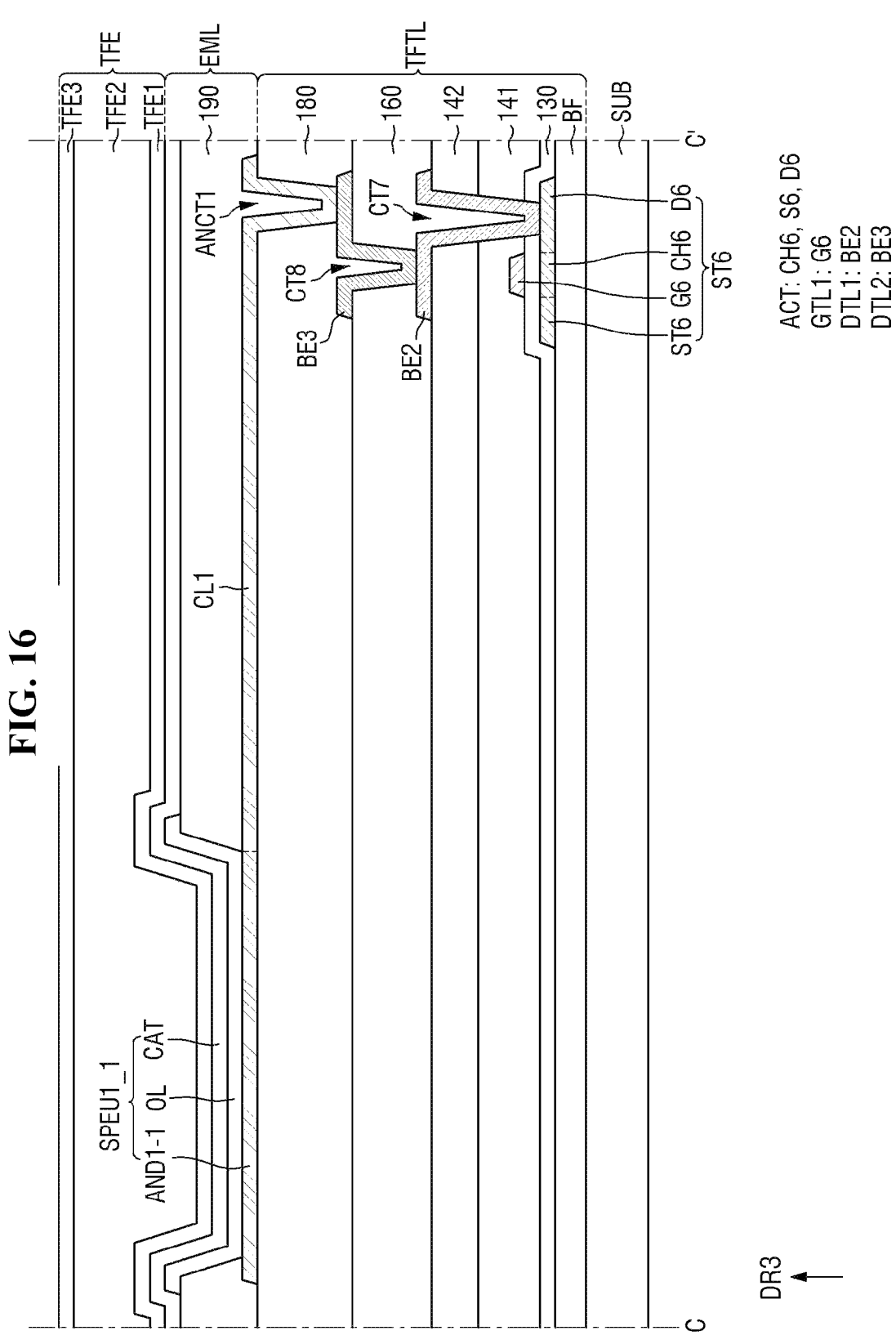
FIG. 16 is a cross-sectional view of an example of the display panel taken along the line C-C' of FIG. 13.

FIG. 15 is a cross-sectional view of an example of the display panel 100 taken along the line B-B' of FIG. 14. FIG. 16 is a cross-sectional view of an example of the display panel 100 taken along the line C-C' of FIG. 13.

Referring to FIGS. 15 and 16, the thin-film transistor layer TFTL may be disposed on the substrate SUB. The thin-film transistor layer TFTL may be a layer in which the driving transistor DT, the first through sixth transistors ST1 through ST6, and the capacitor C1 of the first subpixel driving unit SPDU1_1 are formed.

The thin-film transistor layer TFTL includes the substrate SUB, an active layer ACT, a first gate layer GTL1, a second gate layer GTL2, a first data metal layer DTL1, and a second data metal layer DTL2. In one or more embodiments, the thin-film transistor layer TFTL includes a buffer layer BF, a gate insulating layer 130, a first interlayer insulating film 141, a second interlayer insulating film 142, a first planarization layer 160, and a second planarization layer 180.

The buffer layer BF may be disposed on a surface of the substrate SUB. The buffer layer BF may be formed on the surface of the substrate SUB to protect thin-film transistors and an organic light emitting layer OL of the light emitting element layer EML from moisture introduced through the substrate SUB which is vulnerable to moisture penetration. The buffer layer BF may be composed of a plurality of inorganic layers stacked alternately. For example, the buffer layer BF may be a multilayer in which one or more inorganic layers selected from a silicon nitride layer, a silicon oxynitride layer, a silicon oxide layer, a titanium oxide layer, and an aluminum oxide layer are alternately stacked. In one or more embodiments, the buffer layer BF also may not be provided.

The active layer ACT may be disposed on the buffer layer BF. The active layer ACT may include a silicon semiconductor such as polycrystalline silicon, monocrystalline silicon, low-temperature polycrystalline silicon, and/or amorphous silicon.

The active layer ACT may include the channel layer DTCH, the first electrode DTS and the second electrode DTD of the driving transistor DT. The channel layer DTCH of the driving transistor DT may be a region overlapping the gate electrode DTG of the driving transistor DT in the third direction DR3 which is the thickness direction of the substrate SUB. The first electrode DTS of the driving transistor DT may be disposed on one side of the channel layer DTCH, and the second electrode DTD may be disposed on the other side of the channel layer DTCH. The first electrode DTS and the second electrode DTD of the driving transistor DT may be regions not overlapping the gate electrode DTG in the third direction DR3. The first electrode DTS and the second electrode DTD of the driving transistor DT may be regions formed to have conductivity (e.g., be conductive) by doping a silicon semiconductor with ions or impurities.

In one or more embodiments, the active layer ACT may further include the channel layers CH1 through CH6, the first electrodes S1 through S6 and the second electrodes D1 through D6 of the first through sixth transistors ST1 through ST6. Each of the channel layers CH1 through CH6 of the first through sixth transistors ST1 through ST6 may overlap a corresponding gate electrode among the gate electrodes G1 through G6 in the third direction DR3. The first electrodes S1 through S6 and the second electrodes D1 through D6 of the first through sixth transistors ST1 through ST6 may be regions formed to have conductivity (e.g., be conductive) by doping a silicon semiconductor with ions or impurities.

The gate insulating layer 130 may be disposed on the active layer ACT. The gate insulating layer 130 may be made of an inorganic layer, for example, a silicon nitride layer, a silicon oxynitride layer, a silicon oxide layer, a titanium oxide layer, or an aluminum oxide layer.

The first gate layer GTL1 may be disposed on the gate insulating layer 130. The first gate layer GTL1 may include the gate electrode DTG of the driving transistor DT. In one or more embodiments, the first gate layer GTL1 may further include the gate electrodes G1 through G6 of the first through sixth transistors ST1 through ST6, the first capacitor electrode CAE1, the scan write lines GWL, the control scan lines GCL, the initialization scan lines GIL, the bias scan lines GBL, and the emission lines EL. The first gate layer GTL1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first interlayer insulating film 141 may be disposed on the first gate layer GTL1. The first interlayer insulating film 141 may be made of an inorganic layer, for example, a silicon nitride layer, a silicon oxynitride layer, a silicon oxide layer, a titanium oxide layer, or an aluminum oxide layer.

The second gate layer GTL2 may be disposed on the first interlayer insulating film 141. The second gate layer GTL2 may include the second capacitor electrode CAE2, the shielding electrode SHE, the first horizontal voltage line HVDL, and the initialization voltage line VIL. The second gate layer GTL2 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The second interlayer insulating film 142 may be disposed on the second gate layer GTL2. The second interlayer insulating film 142 may be made of an inorganic layer, for example, a silicon nitride layer, a silicon oxynitride layer, a silicon oxide layer, a titanium oxide layer, or an aluminum oxide layer.

The first data metal layer DTL1 including the first connection electrode BE1, the second connection electrode BE2, the first vertical voltage line VVDL, and the data line DL may be disposed on the second interlayer insulating film 142. The first data metal layer DTL1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first connection electrode BE1 may be connected to the gate electrode DTG of the driving transistor DT through the first contact hole CT1 passing through the first interlayer insulating film 141 and the second interlayer insulating film 142. The first connection electrode BE1 may be connected to each of the second electrode D1-2 of the $(1\text{-}2)^{th}$ transistor ST1-2 and the first electrode S3-1 of the $(3\text{-}1)^{th}$ transistor ST3-1 through the second contact hole CT2 passing through the gate insulating layer 130, the first interlayer insulating film 141, and the second interlayer insulating film 142. The second connection electrode BE2 may be connected to the second electrode D6 of the sixth transistor ST6 through the seventh contact hole CT7 passing through the gate insulating layer 130, the first interlayer insulating film 141 and the second interlayer insulating film 142.

The first vertical voltage line VVDL may be connected to the shielding electrode SHE through the third contact hole CT3 passing through the second interlayer insulating film 142. The first vertical voltage line VVDL may be connected to the first horizontal voltage line HVDL through the fifth contact hole CT5 passing through the second interlayer insulating film 142. The first vertical voltage line VVDL may be connected to the first electrode S5 of the fifth transistor ST5 through the sixth contact hole CT6 passing through the gate insulating layer 130, the first interlayer insulating film 141, and the second interlayer insulating film 142. Therefore, a first power supply voltage may be applied to the shielding electrode SHE, the first horizontal voltage line HVDL, and the first electrode S5 of the fifth transistor ST5.

The first planarization layer 160 may be formed on the first data metal layer DTL1 to flatten (e.g., planarize) steps due to the active layer ACT, the first gate layer GTL1, the second gate layer GTL2, and the first data metal layer DTL1. The first planarization layer 160 may be made of an organic layer such as acryl resin, epoxy resin, phenolic resin, polyamide resin, and/or polyimide resin.

The second data metal layer DTL2 may be formed on the first planarization layer 160. The second data metal layer DTL2 may include a third connection electrode BE3. The third connection electrode BE3 may be connected to the second connection electrode BE2 through an eighth contact hole CT8 passing through the first planarization layer 160. The second data metal layer DTL2 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The second planarization layer 180 may be formed on the second data metal layer DTL2 to flatten (e.g., planarize) steps. The second planarization layer 180 may be made of an organic layer such as acryl resin, epoxy resin, phenolic resin, polyamide resin, or polyimide resin.

The light emitting element layer EML may be disposed on the second planarization layer 180. The light emitting element layer EML may include the first subpixel light emitting unit SPEU1_1, the second subpixel light emitting unit SPEU2_1, and the third subpixel light emitting unit SPEU3_1 of a second pixel PX2. In one or more embodiments, the light emitting element layer EML may further include the first subpixel light emitting unit SPEU1, the second subpixel light emitting unit SPEU2, the third subpixel light emitting unit SPEU3, and the fourth subpixel light emitting unit SPEU4 of a first pixel PX1. In one or more embodiments, the light emitting element layer EML may further include the first subpixel light emitting unit SPEU1_2, the second subpixel light emitting unit SPEU2_2, and the third subpixel light emitting unit SPEU3_2 of a third pixel PX3. The light emitting element layer EML may further include a bank 190.

In FIGS. 15 and 16, the first subpixel light emitting unit SPEU1_1 of the second pixel PX2 is illustrated. The first subpixel light emitting unit SPEU1, the second subpixel light emitting unit SPEU2, the third subpixel light emitting unit SPEU3 and the fourth subpixel light emitting unit SPEU4 of the first pixel PX1, the second subpixel light emitting unit SPEU2_1 and the third subpixel light emitting unit SPEU3_1 of the second pixel PX2, and the first subpixel light emitting unit SPEU1_2, the second subpixel light emitting unit SPEU2_2 and the third subpixel light emitting unit SPEU3_2 of the third pixel PX3 are substantially the same as the first subpixel light emitting unit SPEU1_1 of the second pixel PX2 described with reference to FIGS. 15 and 16, and thus a detailed description thereof may not be provided.

The first subpixel light emitting unit SPEU1_1 of the second pixel PX2 may include the first anode AND1_1, the organic light emitting layer OL, and a cathode CAT. The first subpixel light emitting unit SPEU1_1 of the second pixel PX2 refers to an area in which the first anode AND1_1, the organic light emitting layer OL, and the cathode CAT are sequentially stacked so that holes from the first anode AND1_1 and electrons from the cathode CAT recombine in the organic light emitting layer OL to emit light.

The first anode AND1_1 may be disposed on the second planarization layer 180. The first anode AND1_1 may be connected to the third connection electrode BE3 through the first connection line CL1. The first anode AND1_1 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The bank 190 is a pixel defining layer or a light emitting unit defining layer that defines the first subpixel light emitting unit SPEU1_1, the second subpixel light emitting unit SPEU2_1, and the third subpixel light emitting unit SPEU3_1 of the second pixel PX2. The bank 190 may separate the first subpixel light emitting unit SPEU1_1, the second subpixel light emitting unit SPEU2_1, and the third subpixel light emitting unit SPEU3_1 of the second pixel PX2 from each other.

The bank 190 may be formed to cover edges of the first anode AND1_1 of each light emitting element 170. The bank 190 may be made of an organic layer such as acryl resin, epoxy resin, phenolic resin, polyamide resin, and/or polyimide resin.

The organic light emitting layer OL may be disposed on the first anode AND1_1. The organic light emitting layer OL may include an organic material to emit light of a set color (e.g., a predetermined color). For example, the organic light emitting layer OL may include a hole transporting layer, an organic material layer, and an electron transporting layer.

The cathode CAT may be disposed on the organic light emitting layer OL and the bank 190. The cathode CAT may be formed to cover the organic light emitting layer OL. The cathode CAT may be disposed commonly in the first subpixel light emitting unit SPEU1_1, the second subpixel light emitting unit SPEU2_1, and the third subpixel light emitting unit SPEU3_1 of the second pixel PX2. In one or more embodiments, the first subpixel light emitting unit SPEU1_1, the second subpixel light emitting unit SPEU2_1, and the third subpixel light emitting unit SPEU3_1 of the second pixel PX2 may share the cathode CAT. A capping layer may be disposed on the cathode CAT.

In a top emission structure, the cathode CAT may be made of a transparent conductive material (TCO) capable of transmitting light, such as indium tin oxide (ITO) or indium zinc oxide (IZO), or a semi-transmissive conductive material such as magnesium (Mg), silver (Ag) or an alloy of magnesium (Mg) and silver (Ag). When the cathode CAT is made of a semi-transmissive conductive material, the light output efficiency of each of the light emitting units SPEU1_1 through SPEU3_1 may be increased by a microcavity.

The encapsulation layer TFE may be formed on the light emitting element layer EML. The encapsulation layer TFE may include at least one inorganic layer to prevent or substantially prevent oxygen or moisture from permeating into the light emitting element layer EML. In one or more embodiments, the encapsulation layer TFE may include at least one organic layer to protect the light emitting element layer EML from foreign substances such as dust.

The light emitting element layer EML may further include the first connection line CL1. The first connection line CL1 may be disposed on the second planarization layer 180. The first connection line CL1 connects the first anode AND1_1 to the third connection electrode BE3. The first connection line CL1 may be connected to the first anode AND1_1 and may be connected to the third connection electrode BE3 through the first anode contact hole ANCT1 passing through the second planarization layer 180. The first connection line CL1 may be integrally formed with the first anode AND1_1. For example, the first connection line CL1 and the first anode AND1_1 may be formed as a monolithic structure. The first connection line CL1 may be made of the same material as the first anode AND1_1. For example, the first connection line CL1 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The second connection line CL2 and the third connection line CL3 may be substantially the same as the first connection line CL1 described with reference to FIG. 16, and thus a detailed description thereof may not be provided.

Figure 17:
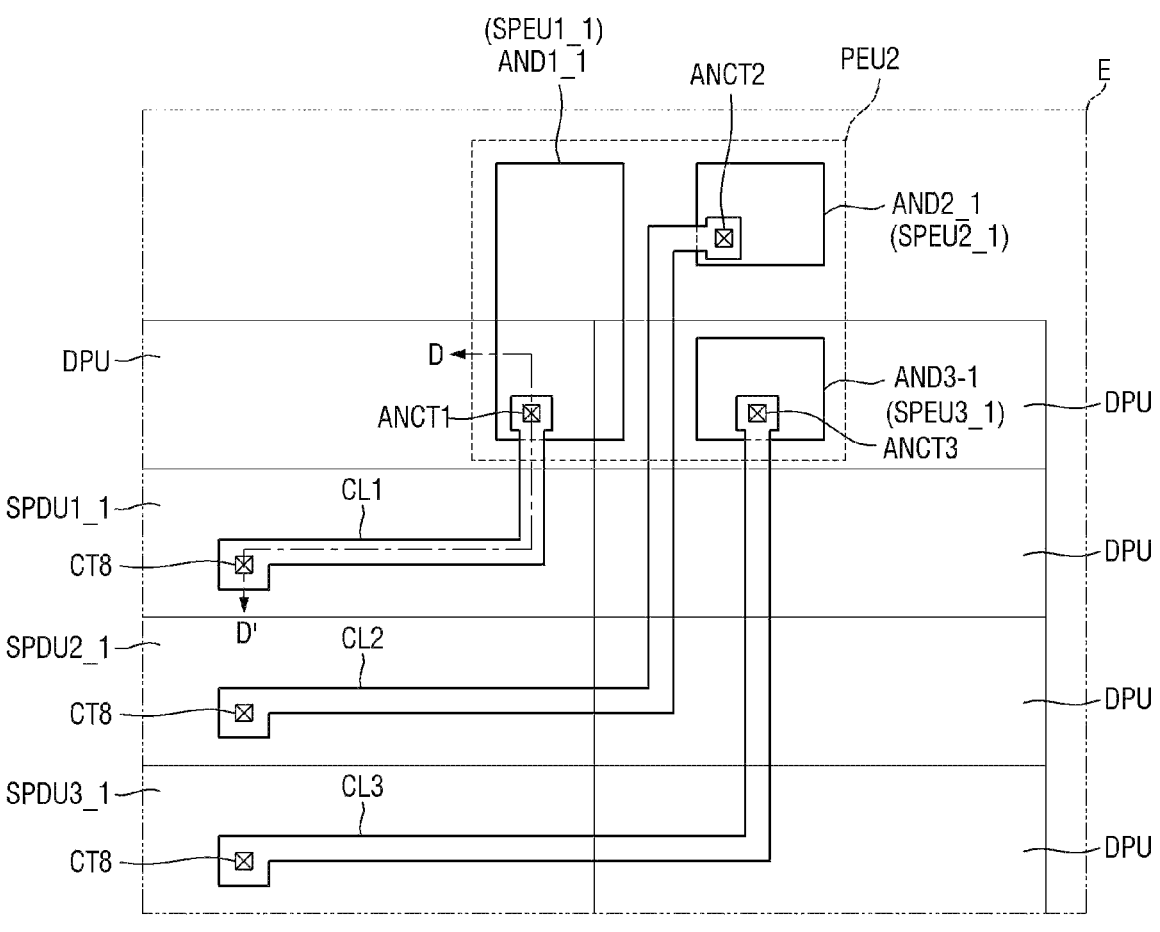
FIG. 17 is a layout view illustrating an example of a second pixel and the dummy pixel driving units of FIG. 7 in more detail.
Figure 17:
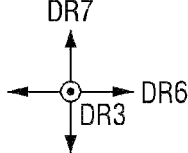
Figure 18:
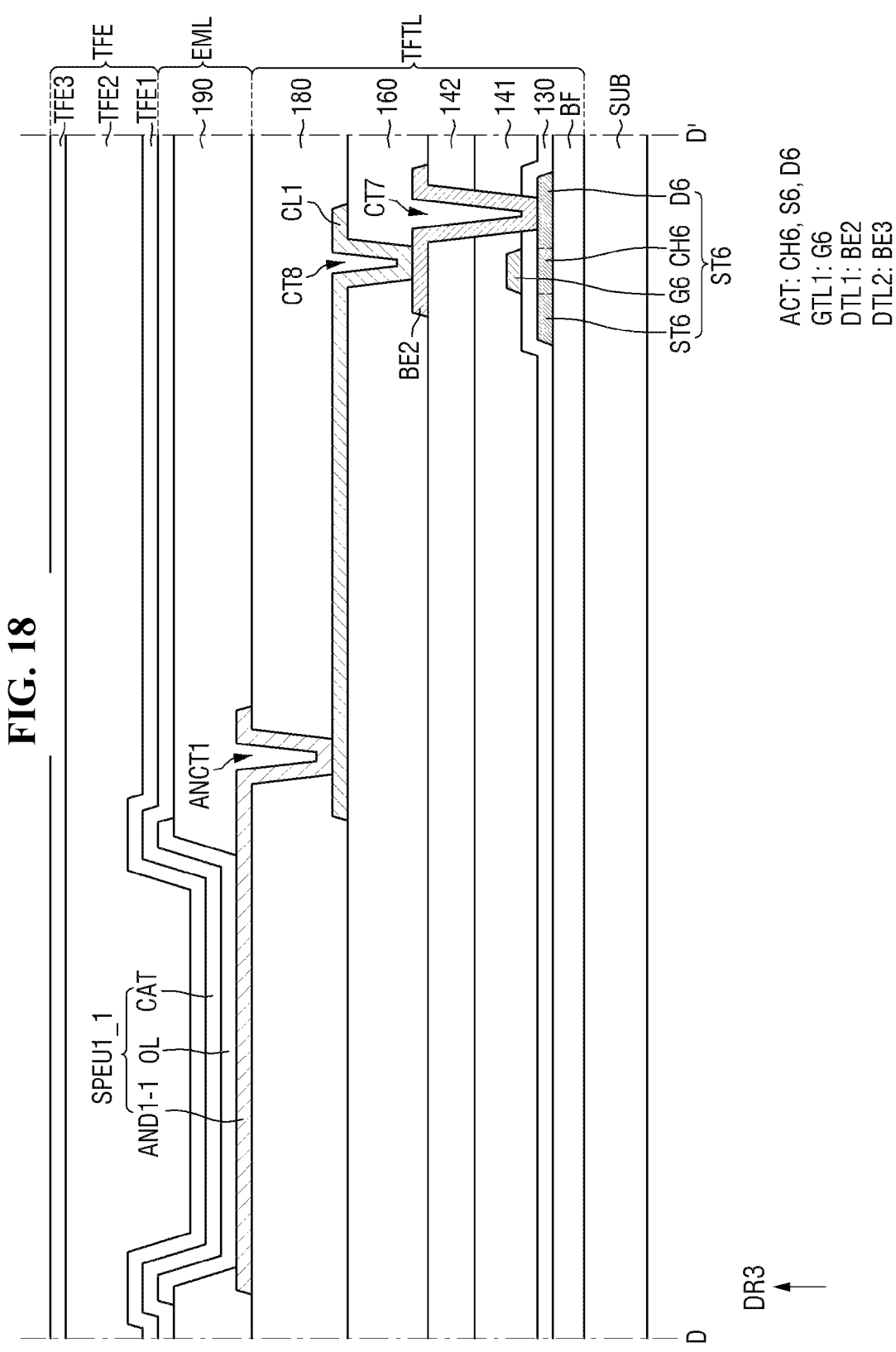
FIG. 18 is a cross-sectional view of an example of the display panel taken along the line D-D' of FIG. 17.

FIG. 17 is a layout view illustrating an example of a second pixel PX2 and the dummy pixel driving units DPU of FIG. 7 in more detail. FIG. 18 is a cross-sectional view of an example of the display panel 100 taken along the line D-D' of FIG. 17.

The embodiment of FIGS. 17 and 18 is different from the embodiment of FIGS. 13 and 16 in that a first connection line CL1, a second connection line CL2, and a third connection line CL3 are not disposed on or at the same layer as a first anode AND1_1 and that a third connection electrode BE3 is omitted. In FIGS. 17 and 18, a detailed description similar to or the same as that of the embodiment of FIGS. 13 and 16 may not be provided.

Referring to FIGS. 17 and 18, the first connection line CL1 may be connected to a first subpixel driving unit SPDU1_1 through an eighth contact hole CT8. The second connection line CL2 may be connected to a second subpixel driving unit SPDU2_1 through an eighth contact hole CT8. The third connection line CL3 may be connected to a third subpixel driving unit SPDU3_1 through an eighth contact hole CT8.

The first anode AND1_1 may be connected to the first connection line CL1 through a first anode contact hole ANCT1. A second anode AND2_1 may be connected to the second connection line CL2 through a second anode contact hole ANCT2. A third anode AND3_1 may be connected to the third connection line CL3 through a third anode contact hole ANCT3.

A second data metal layer DTL2 may include the first connection line CL1. The first connection line CL1 may be disposed on a first planarization layer 160. The first connection line CL1 connects the first anode AND1_1 to a second connection electrode BE2. The first connection line CL1 may be connected to the second connection electrode BE2 through the eighth contact hole CT8 passing through the first planarization layer 160. The first anode AND1_1 may be connected to the first connection line CL1 through the first anode contact hole ANCT1 passing through a second planarization layer 180.

The second connection line CL2 and the third connection line CL3 may be substantially the same as the first connection line CL1 described with reference to FIG. 18, and thus a detailed description thereof may not be provided.

Figure 19:
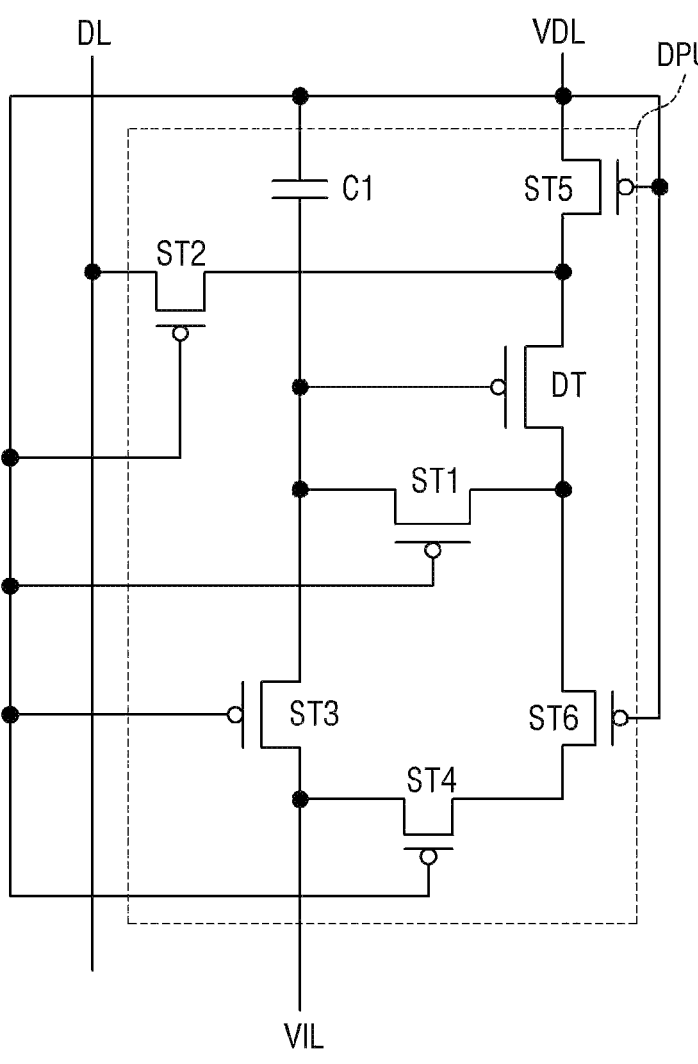
FIG. 19 is a circuit diagram of a dummy pixel driving unit according to an embodiment.
Figure 20:
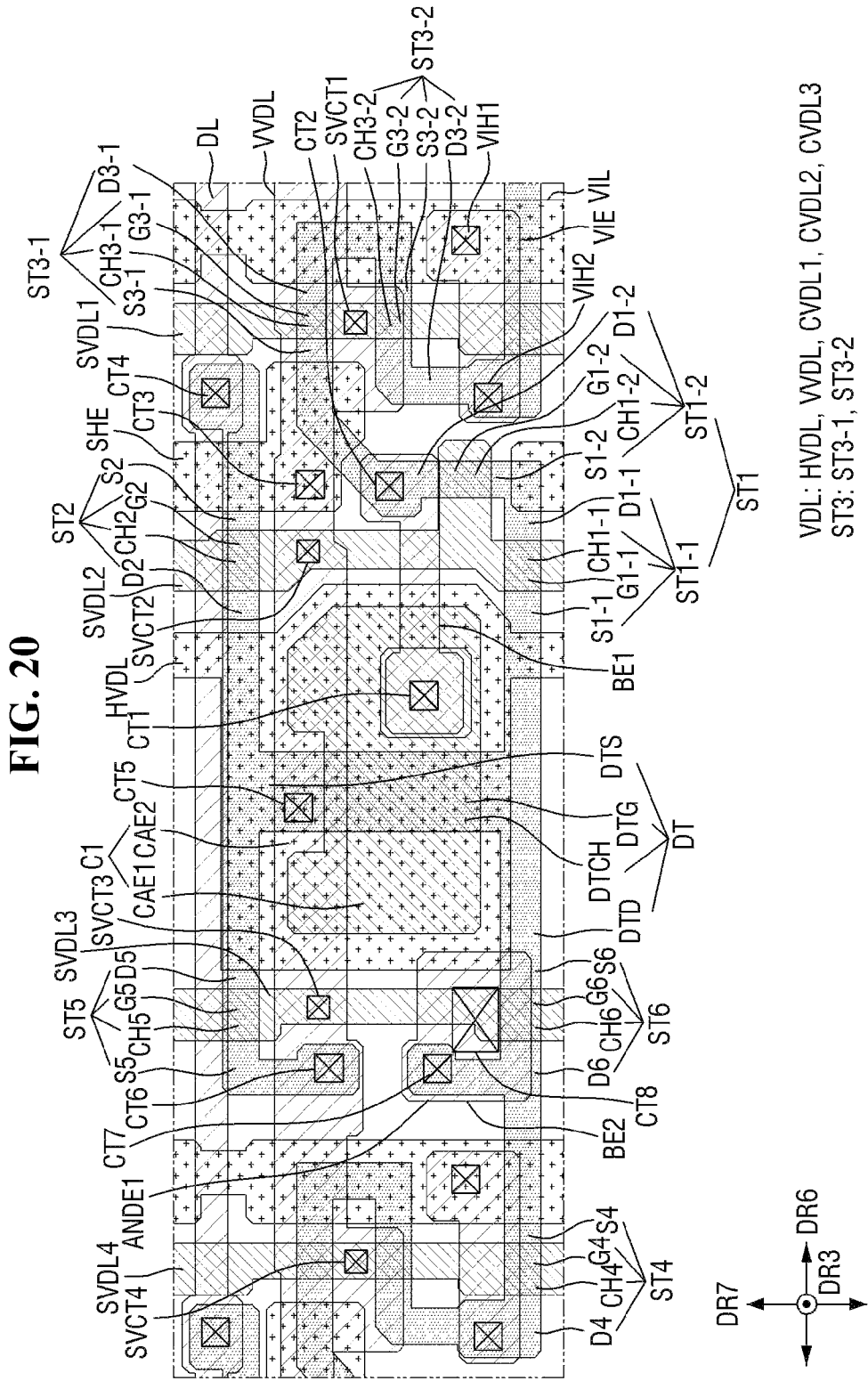
FIG. 20 is a detailed layout view of an example of a dummy pixel driving unit of FIG. 19.

FIG. 19 is a circuit diagram of a dummy pixel driving unit DPU according to an embodiment. FIG. 20 is a detailed layout view of an example of the dummy pixel driving unit DPU of FIG. 19.

The embodiment of FIGS. 19 and 20 is different from the embodiment of FIGS. 10 and 13 in that a write scan line GWL, a control scan line GCL, an initialization scan line GIL, a bias scan line GBL, and an emission line EL of the dummy pixel driving unit DPU are replaced with a first power supply line VDL. Regarding FIGS. 19 and 20, a detailed description similar to or the same as that of FIGS. 10 and 13 may not be provided.

Referring to FIGS. 19 and 20, a gate electrode of a first transistor ST1, a gate electrode of a second transistor ST2, a gate electrode of a third transistor ST3, a gate electrode of a fourth transistor ST4, a gate electrode of a fifth transistor ST5, and a gate electrode of a sixth transistor ST6 of the dummy pixel driving unit DPU may be connected to the first power line VDL. A first power supply voltage applied to the first power line VDL may have a higher voltage level than a gate-on voltage for turning on the first transistor ST1, the second transistor ST2, the third transistor ST3, the fourth transistor ST4, the fifth transistor ST5, and the sixth transistor ST6 of the dummy pixel driving unit DPU. Accordingly, the first transistor ST1, the second transistor ST2, the third transistor ST3, the fourth transistor ST4, the fifth transistor ST5, and the sixth transistor ST6 of the dummy pixel driving unit DPU may be turned off while a second pixel PX2 is driven. Therefore, due to the first transistor ST1, the second transistor ST2, the third transistor ST3, the fourth transistor ST4, the fifth transistor ST5, and the sixth transistor ST6 of the dummy pixel driving unit DPU, it is possible to prevent or substantially prevent the second pixel PX2 from being affected by the dummy pixel driving unit DPU.

The gate electrode of the third transistor ST3 may be connected to a first sub-power line SVDL1 of the first power line VDL instead of the write initialization line GIL. The first sub-power line SVDL1 may be connected to a first vertical voltage line WDL through a first sub-power contact hole SVCT1. In one or more embodiments, the first sub-power line SVDL1 may be connected to a first horizontal power line HVDL or the first vertical power line VVDL in an area other than a first pixel driving area PDA1.

A gate electrode of a (1-1)$^{th}$ transistor ST1-1 and a gate electrode of a (1-2)$^{th}$ transistor ST1-2 may be connected to a second sub-power line SVDL2 of the first power line VDL instead of the control scan line GCL, and the gate electrode of the second transistor ST2 may be connected to the second sub-power line SVDL2 instead of the write scan line GWL. The second sub-power line SVDL2 may be connected to the first vertical voltage line WDL through a second sub-power contact hole SVCT2. In one or more embodiments, the second sub-power line SVDL2 may be connected to the first horizontal power line HVDL or the first vertical power line WDL in an area other than the first pixel driving area PDA1.

The gate electrode of the fifth transistor ST5 and the gate electrode of the sixth transistor ST6 may be connected to a third sub-power line SVDL3 instead of the emission line EL. The third sub-power line SVDL3 may be connected to the first vertical voltage line VVDL through a third sub-power contact hole SVCT3. In one or more embodiments, the third sub-power line SVDL3 may be connected to the first horizontal power line HVDL or the first vertical power line WDL in an area other than the first pixel driving area PDA1.

The gate electrode of the fourth transistor ST4 may be connected to a fourth sub-power line SVDL4 instead of the bias scan line GBL. The fourth sub-power line SVDL4 may be connected to the first vertical voltage line VVDL through a fourth sub-power contact hole SVCT4. In one or more embodiments, the fourth sub-power line SVDL4 may be connected to the first horizontal power line HVDL or the first vertical power line WDL in an area other than the first pixel driving area PDA1.

In FIGS. 19 and 20, the write scan line GWL, the control scan line GCL, the initialization scan line GIL, the bias scan line GBL, and the emission line EL are replaced with the first power line VDL. However, the present disclosure is not limited thereto. For example, at least one of the write scan line GWL, the control scan line GCL, the initialization scan line GIL, the bias scan line GBL, and the emission line EL may be replaced with the first power line VDL, and the rest may not be replaced with the first power line VDL.

Figure 21:
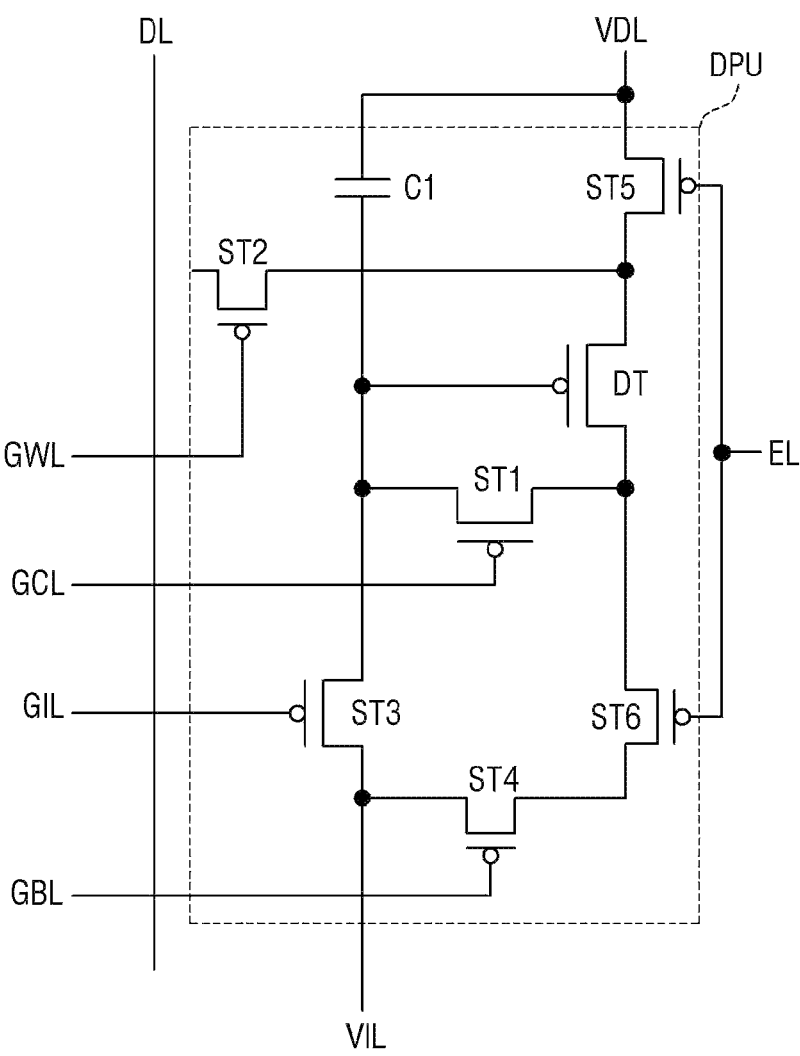
FIG. 21 is a circuit diagram of a dummy pixel driving unit according to an embodiment.
Figure 22:
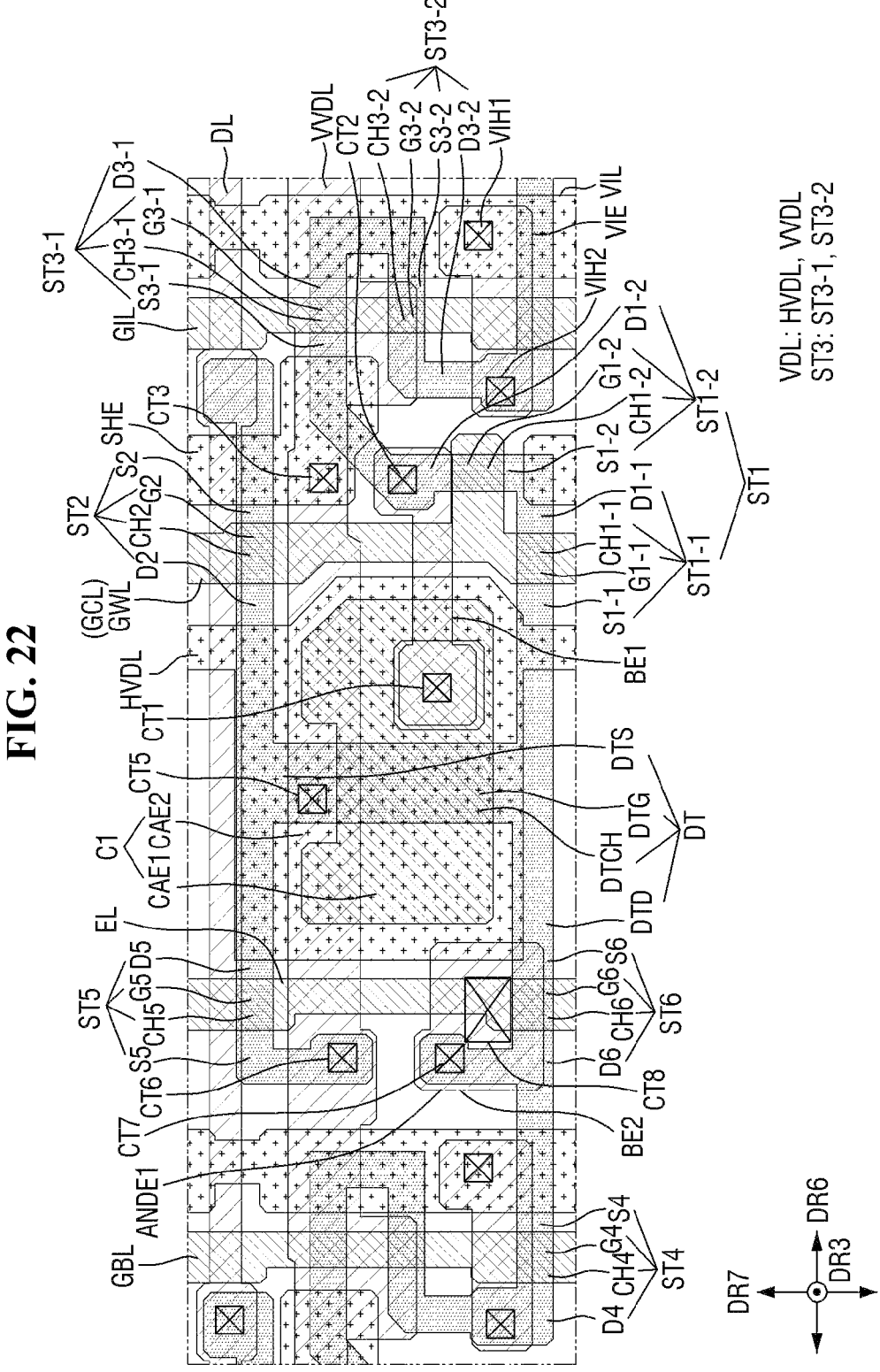
FIG. 22 is a detailed layout view of an example of a dummy pixel driving unit of FIG. 21.

FIG. 21 is a circuit diagram of a dummy pixel driving unit DPU according to an embodiment. FIG. 22 is a detailed layout view of an example of the dummy pixel driving unit DPU of FIG. 21.

The embodiment of FIGS. 21 and 22 is different from the embodiment of FIGS. 10 and 13 in that a first electrode of a second transistor ST2 of the dummy pixel driving unit DPU is not connected to a data line DL. Regarding FIGS. 21 and 22, a detailed description similar to or the same as that of FIGS. 10 and 13 may not be provided.

Referring to FIGS. 21 and 22, the first electrode of the second transistor ST2 of the dummy pixel driving unit DPU is not connected to the data line DL. For example, a fourth contact hole CT4 connecting the data line DL and the first electrode of the second transistor ST2 may not be provided from the dummy pixel driving unit DPU. Accordingly, even when the second transistor ST2 of the dummy pixel driving unit DPU is turned on, a data voltage of the data line DL is not supplied. Therefore, the dummy pixel driving unit DPU may be driven without depending on the data voltage. For example, because all dummy pixel driving units DPU are operated by an initialization voltage, even if second pixels PX2 are affected by the dummy pixel driving units DPU, a deviation between the second pixels PX2 due to the effect can be minimized or reduced.

Figure 23:
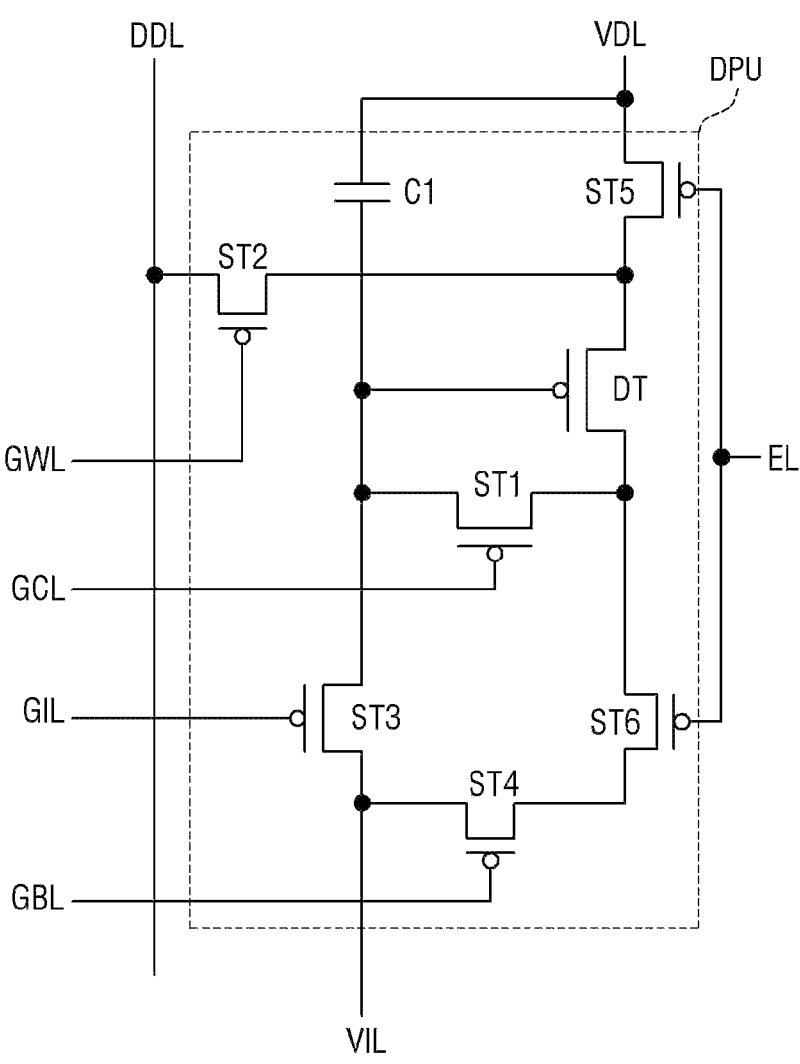
FIG. 23 is a circuit diagram of a dummy pixel driving unit according to an embodiment.
Figure 24:
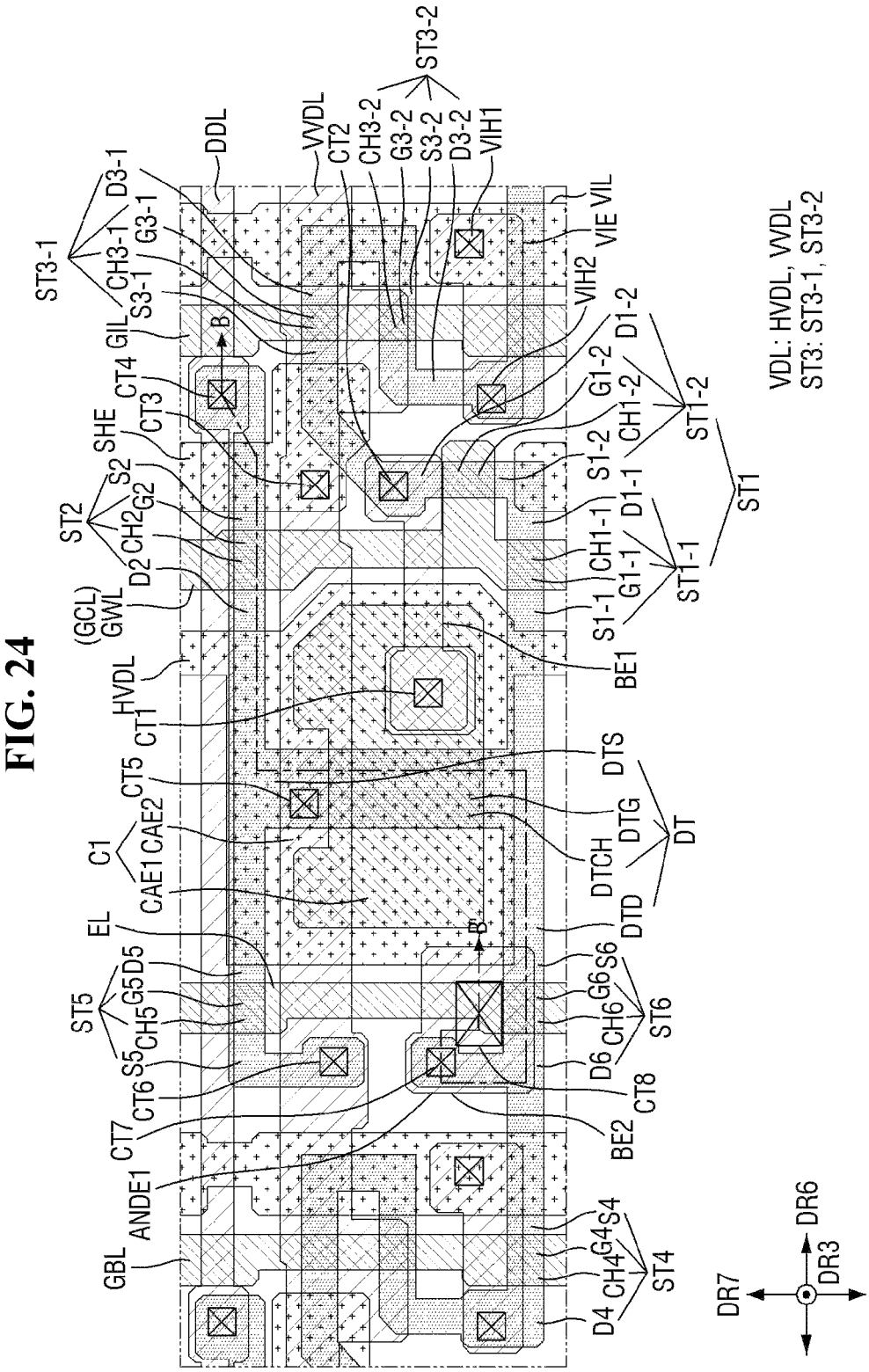
FIG. 24 is a detailed layout view of an example of a dummy pixel driving unit of FIG. 23.

FIG. 23 is a circuit diagram of a dummy pixel driving unit DPU according to an embodiment. FIG. 24 is a detailed layout view of an example of the dummy pixel driving unit DPU of FIG. 23.

The embodiment of FIGS. 23 and 24 is different from the embodiment of FIGS. 10 and 13 in that a first electrode of a second transistor ST2 of the dummy pixel driving unit DPU is connected to a dummy data line DDL instead of a data line DL. Regarding FIGS. 23 and 24, a detailed description similar to or the same as that of FIGS. 10 and 13 may not be provided.

Referring to FIGS. 23 and 24, no voltage including a data voltage may be applied to the dummy data line DDL. For example, the dummy data line DDL may be in a floating state. The dummy data line DDL may connect a fourth contact hole CT4 to the first electrode of the second transistor ST2.

When the first electrode of the second transistor ST2 of the dummy pixel driving unit DPU is connected to the dummy data line DDL, the data voltage may not be applied to the dummy pixel driving unit DPU even when the second transistor ST2 is turned on. Accordingly, even when the second transistor ST2 of the dummy pixel driving unit DPU is turned on, the data voltage of the data line DL is not supplied. Therefore, the dummy pixel driving unit DPU may be driven without depending on the data voltage. For example, because all dummy pixel driving units DPU are operated by an initialization voltage, even if second pixels PX2 are affected by the dummy pixel driving units DPU, a deviation between the second pixels PX2 due to the effect can be minimized or reduced.

Figure 25:
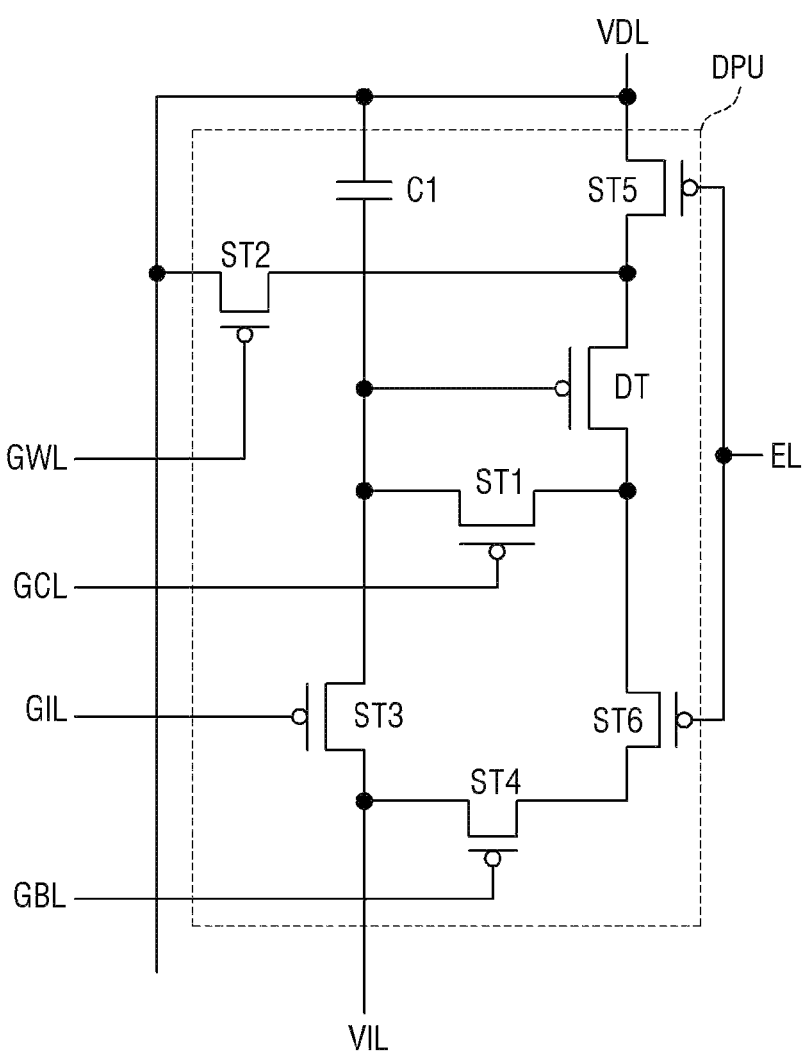
FIG. 25 is a circuit diagram of a dummy pixel driving unit according to an embodiment.
Figure 26:
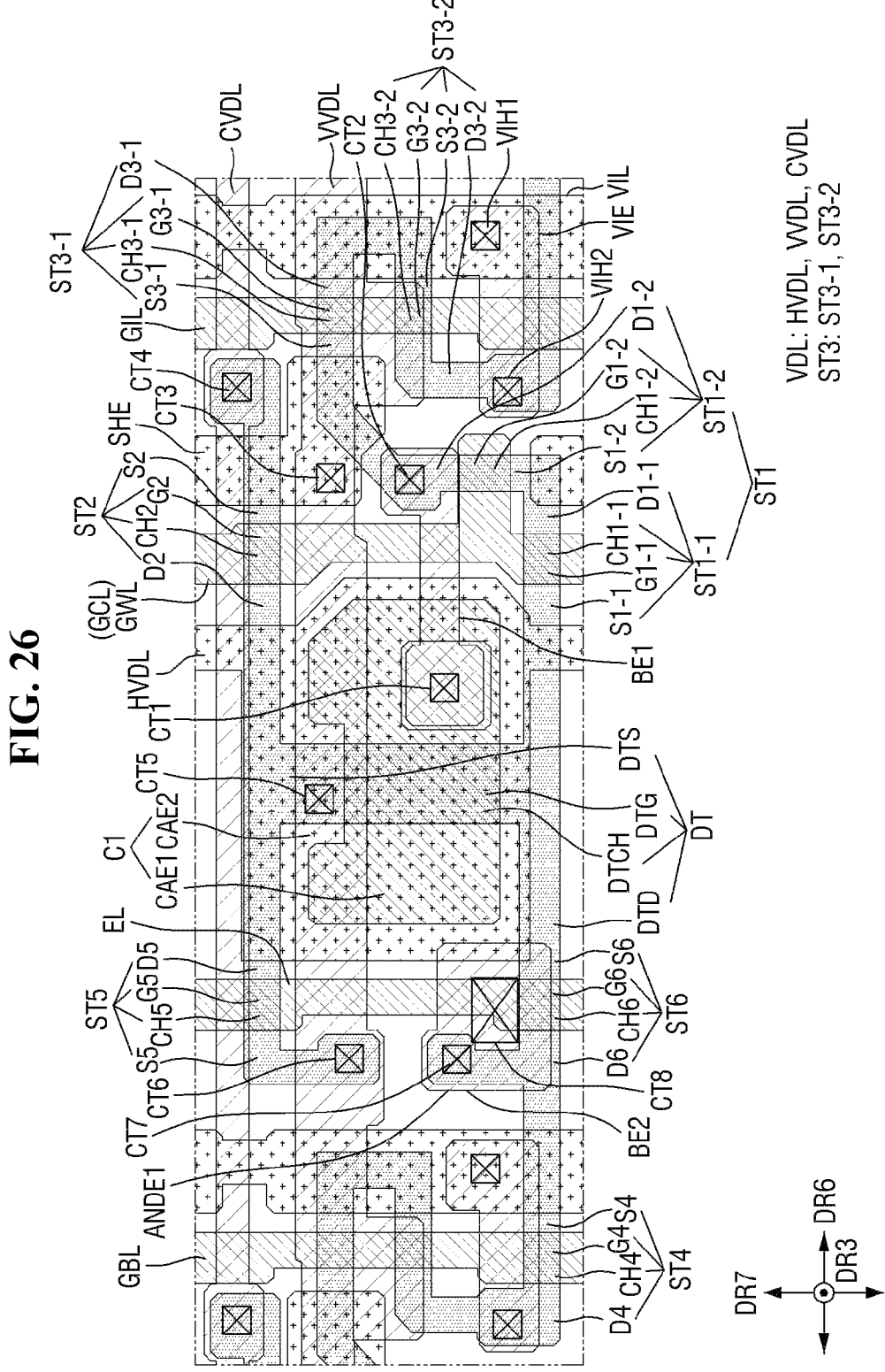
FIG. 26 is a detailed layout view of an example of a dummy pixel driving unit of FIG. 25.

FIG. 25 is a circuit diagram of a dummy pixel driving unit DPU according to an embodiment. FIG. 26 is a detailed layout view of an example of the dummy pixel driving unit DPU of FIG. 25.

The embodiment of FIGS. 25 and 26 is different from the embodiment of FIGS. 10 and 13 in that a first electrode of a second transistor ST2 of the dummy pixel driving unit DPU is connected to a first power line VDL instead of a data line DL. Regarding FIGS. 25 and 26, a detailed description similar to or the same as that of FIGS. 10 and 13 may not be provided.

Referring to FIGS. 25 and 26, a second vertical power line CVDL of the first power line VDL may be connected to the first electrode of the second transistor ST2 through a fourth contact hole CT4. When the second transistor ST2 of the dummy pixel driving unit DPU is turned on, a first power supply voltage may be applied to the dummy pixel driving unit DPU. All dummy pixel driving units DPU may receive the first power supply voltage. For example, the dummy pixel driving units DPU may be driven without depending on a data voltage. Therefore, even if second pixels PX2 are affected by the dummy pixel driving units DPU, a deviation between the second pixels PX2 due to the effect can be minimized or reduced.

Figure 27:
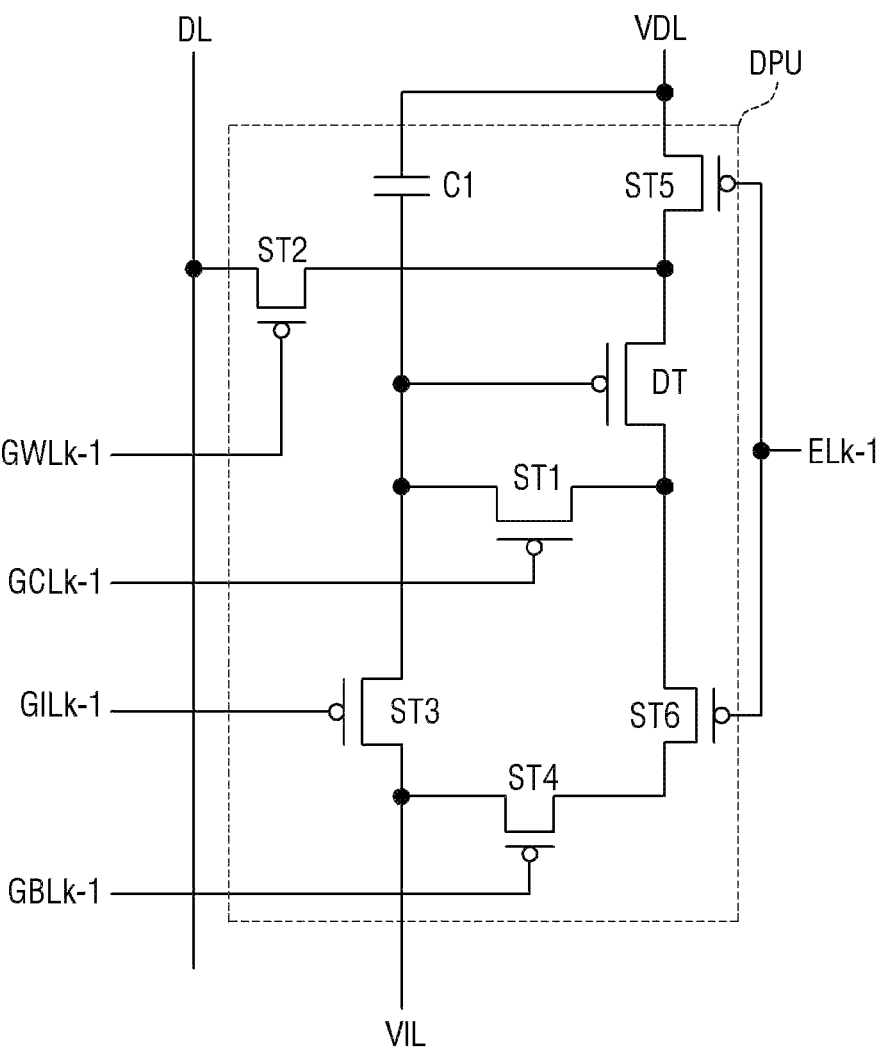
FIG. 27 is a circuit diagram of a dummy pixel driving unit according to an embodiment.
Figure 28:
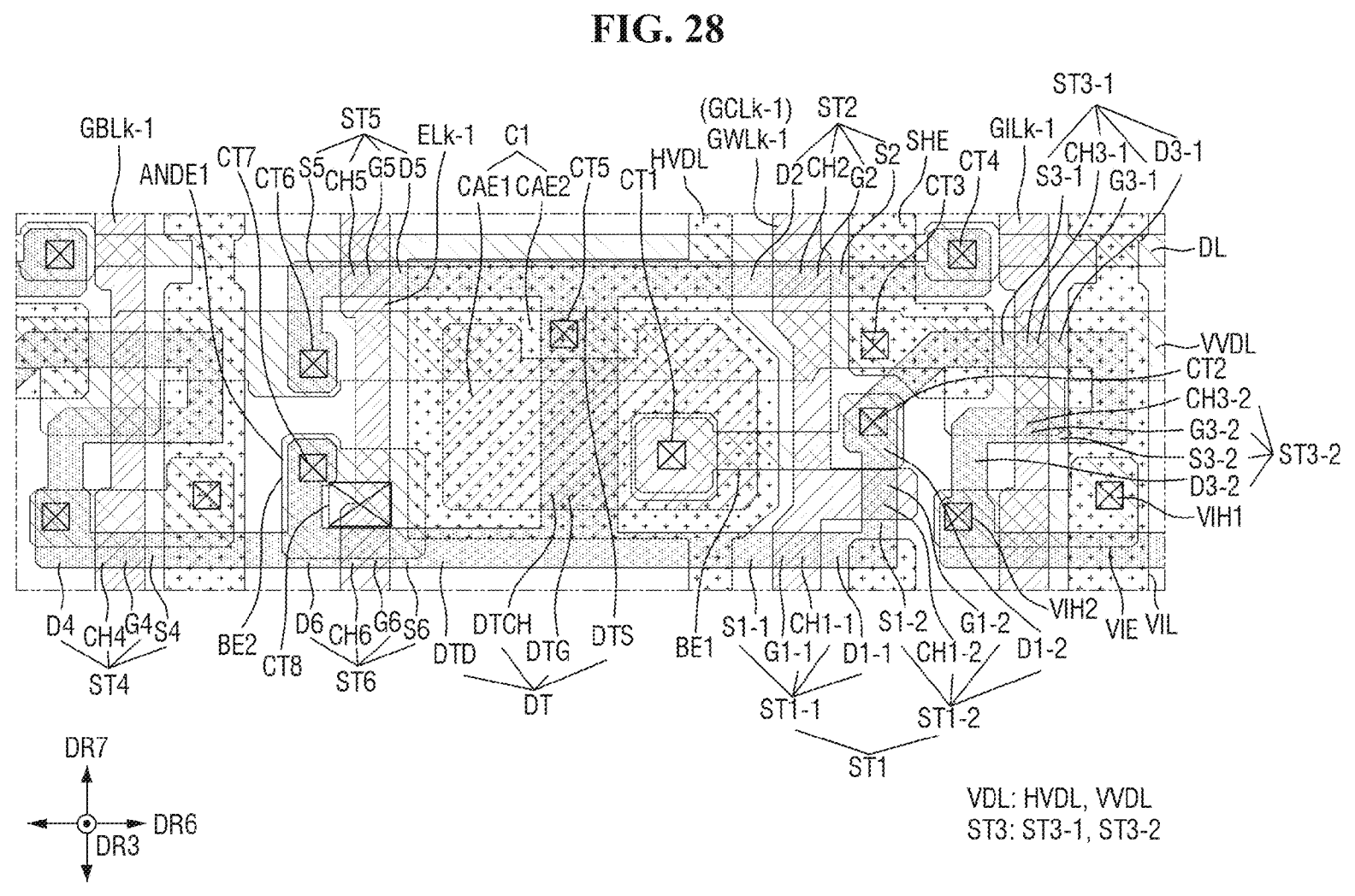

FIG. 27 is a circuit diagram of a dummy pixel driving unit DPU according to an embodiment. FIG. 28 is a detailed layout view of an example of the dummy pixel driving unit DPU of FIG. 27.

The embodiment of FIGS. 27 and 28 is different from the embodiment of FIGS. 10 and 13 in that the dummy pixel driving unit DPU disposed in a $k^{th}$ column is connected to a $(k-1)^{th}$ write scan line GWLk−1 instead of a $k^{th}$ write scan line GWL, connected to a $(k-1)^{th}$ initialization scan line GILk−1 instead of a $k^{th}$ initialization scan line GIL, connected to a $(k-1)^{th}$ control scan line GCLk−1 instead of a $k^{th}$ control scan line GCL, connected to a $(k-1)^{th}$ bias scan line GBLk−1 instead of a $k^{th}$ bias scan line GBL, and connected to a $(k-1)^{th}$ emission line ELk−1 instead of a $k^{th}$ emission line EL. Regarding FIGS. 27 and 28, a detailed description similar to or the same as that of FIGS. 10 and 13 may not be provided.

Referring to FIGS. 27 and 28, a first subpixel driving unit SPDU1_1, a second subpixel driving unit SPDU2_1, and a third subpixel driving unit SPDU3_1 disposed in the $k^{th}$ column are connected to the $k^{th}$ write scan line GWL, the $k^{th}$ initialization scan line GIL, the $k^{th}$ control scan line GCL, the $k^{th}$ bias scan line GBL, and the $k^{th}$ emission line EL. On the other hand, the dummy pixel driving unit DPU disposed in the $k^{th}$ column is connected to the $(k-1)^{th}$ write scan line GWLk−1, the $(k-1)^{th}$ initialization scan line GILk−1, the $(k-1)^{th}$ control scan line GCLk−1, the $(k-1)^{th}$ bias scan line GBLk−1, and the $(k-1)^{th}$ emission line ELk−1. Accordingly, while a data voltage is applied to and a threshold voltage is sensed in the first subpixel driving unit SPDU1_1, the second subpixel driving unit SPDU2_1, and the third subpixel driving unit SPDU3_1 disposed in the $k^{th}$ column, a data voltage may not be applied to the dummy pixel driving unit DPU disposed in the $k^{th}$ column. Therefore, the effect of the dummy pixel driving unit DPU on a second pixel PX2 can be minimized or reduced.

A gate electrode of a first transistor ST1 of the dummy pixel driving unit DPU may be connected to the $(k-1)^{th}$ control scan line GCLk−1. A gate electrode G1-1 of a $(1-1)^{th}$ transistor ST1-1 and a gate electrode G1-2 of a $(1-2)^{th}$ transistor ST1-2 of the dummy pixel driving unit DPU may be connected to the $(k-1)^{th}$ control scan line GCLk−1.

A gate electrode of a second transistor ST2 may be connected to the $(k-1)^{th}$ write scan line GWLk−1. A gate electrode of a third transistor ST3 of the dummy pixel driving unit DPU may be connected to the $(k-1)^{th}$ initialization scan line GILk−1. For example, a gate electrode G3-1 of a $(3-1)^{th}$ transistor ST3-1 and a gate electrode G3-2 of a $(3-2)^{th}$ transistor ST3-2 of the dummy pixel driving unit DPU may be connected to the $(k-1)^{th}$ initialization scan line GILk−1.

A gate electrode of a fourth transistor ST4 may be connected to the $(k-1)^{th}$ bias scan line GBLk−1. In one or more embodiments, a gate electrode of a fifth transistor ST5 and a gate electrode of a sixth transistor ST6 of the dummy pixel driving unit DPU may be connected to the $(k-1)^{th}$ emission line ELk−1.

In FIGS. 27 and 28, the dummy pixel driving unit DPU disposed in the $k^{th}$ column are connected to the $(k-1)^{th}$ write scan line GWLk−1, the $(k-1)^{th}$ initialization scan line GILk−1, the $(k-1)^{th}$ control scan line GCLk−1, the $(k-1)^{th}$ bias scan line GBLk−1, and the $(k-1)^{th}$ emission line ELk−1. However, the present disclosure is not limited thereto. For example, the dummy pixel driving unit DPU disposed in the $k^{th}$ column also may be connected to a $(k+1)^{th}$ write scan line, a $(k+1)^{th}$ initialization scan line, a $(k+1)^{th}$ control scan line, a $(k+1)^{th}$ bias scan line, and a $(k+1)^{th}$ emission line. In one or more embodiments, the dummy pixel driving unit DPU disposed in the $k^{th}$ column may be connected to a $(k-x)^{th}$ (x is an integer of 2 or more) write scan line, a $(k-x)^{th}$ initialization scan line, a $(k-x)^{th}$ control scan line, a $(k-x)^{th}$ bias scan line, and a $(k-x)^{th}$ emission line. In one or more embodiments, the dummy pixel driving unit DPU disposed in the $k^{th}$ column may be connected to a $(k+x)^{th}$ write scan line, a $(k+x)^{th}$ initialization scan line, a $(k+x)^{th}$ control scan line, a $(k+x)^{th}$ bias scan line, and a $(k+x)^{th}$ emission line.

Figure 31:
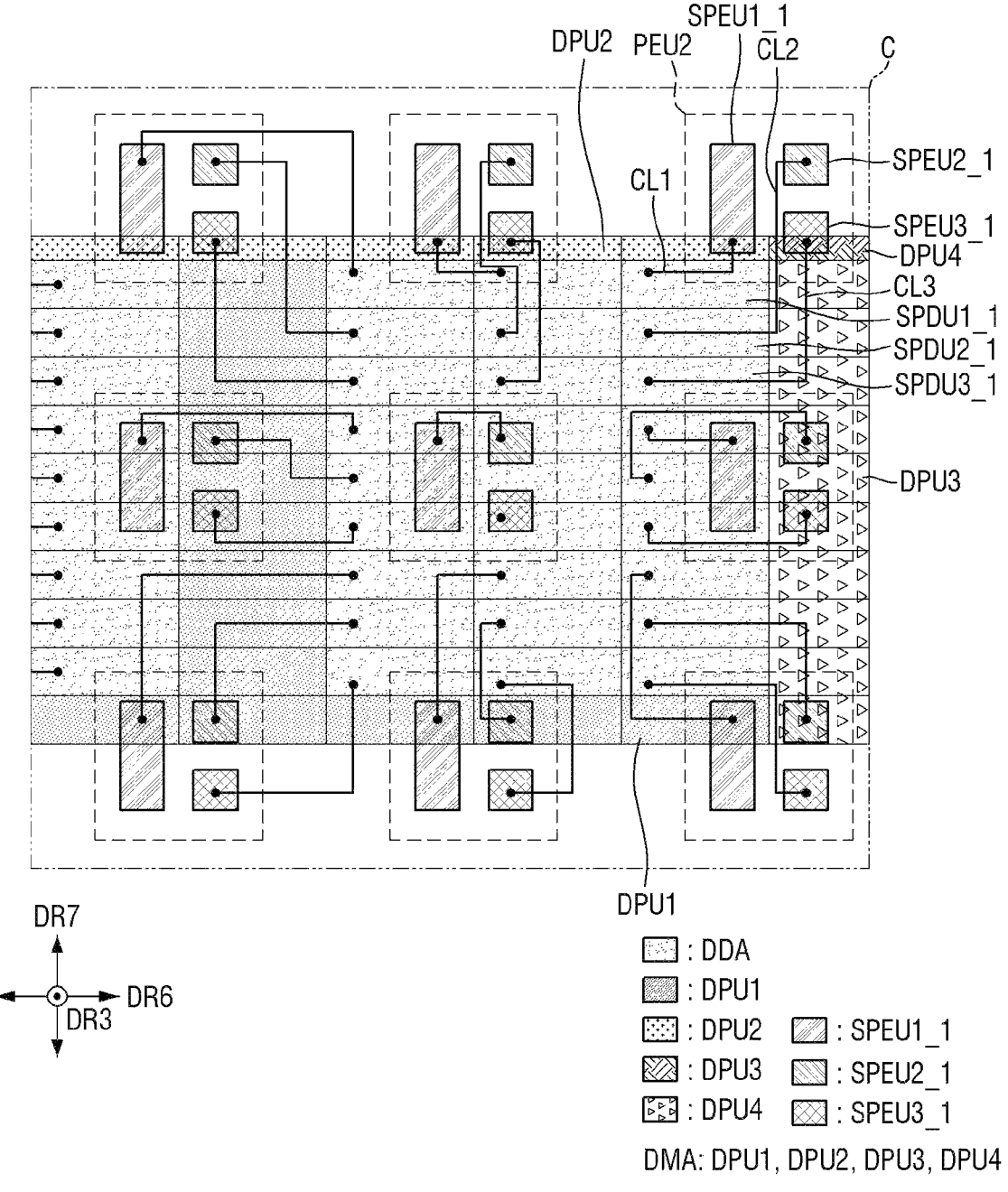
FIG. 31 is a detailed layout view of an example of the second display area of FIG. 6.
Figure 32:
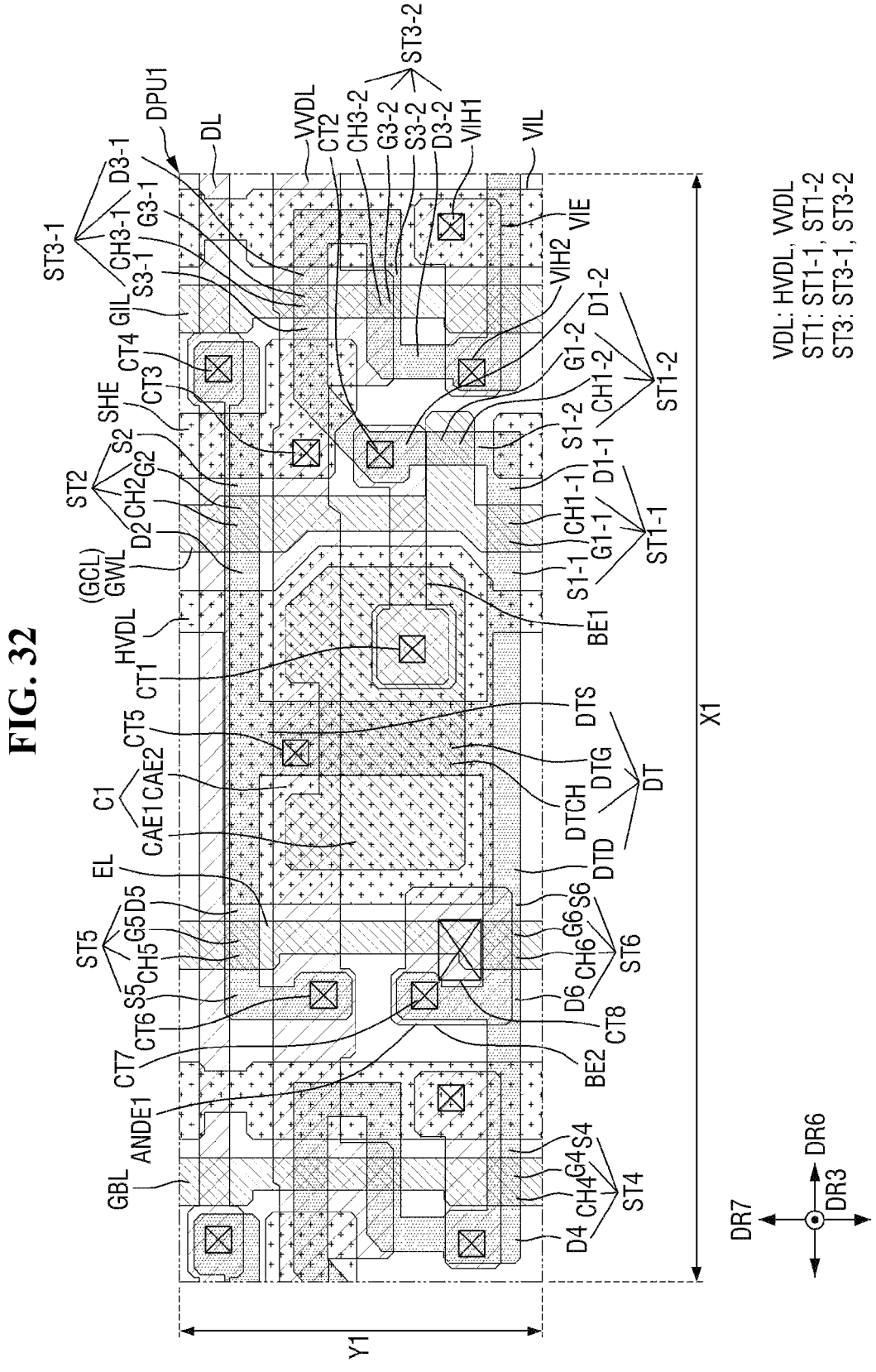
FIGS. 32 through 35 are example views illustrating a first dummy pixel driving unit, a second dummy pixel driving unit, a third dummy pixel driving unit, and a fourth dummy pixel driving unit of FIG. 31.

FIG. 31 is a layout view of an example of the second display area DA2 of FIG. 6. FIGS. 32 through 35 are example views illustrating a first dummy pixel driving unit DPU1, a second dummy pixel driving unit DPU2, a third dummy pixel driving unit DPU3, and a fourth dummy pixel driving unit DPU4 of FIG. 31.

The embodiment of FIGS. 31 through 35 is different from the embodiment of FIG. 7 in that a dummy area DMA includes first dummy pixel driving units DPU1, second dummy pixel driving units DPU2, third dummy pixel driving units DPU3, and a fourth dummy pixel driving unit DPU4. Regarding FIGS. 31 through 35, a detailed description similar to or the same as that of the embodiment of FIG. 7 may not be provided.

Referring to FIGS. 31 through 35, the first dummy pixel driving units DPU1 may be disposed on a lower side of the dummy area DMA, the second dummy pixel driving units DPU2 may be disposed on an upper side of the dummy area DMA, the third dummy pixel driving units DPU3 may be disposed on a right side of the dummy area DMA, and the fourth dummy pixel driving unit DPU4 may be disposed at a corner where the upper side and the right side of the dummy area DMA meet.

In a cutout pattern CP, when a space on the upper side of the dummy area DMA is insufficient, the area of each of the second dummy pixel driving units DPU2 disposed on the upper side of the dummy area DMA may be different from the area of each of the first dummy pixel driving units DPU1 disposed on the lower side of the dummy area DMA. When the space on the upper side of the dummy area DMA is insufficient in the cutout pattern CP, the area of each of the second dummy pixel driving units DPU2 disposed on the upper side of the dummy area DMA may be smaller than the area of each of the first dummy pixel driving units DPU1 disposed on the lower side of the dummy area DMA. For example, a length X1 of each first dummy pixel driving unit DPU1 in the sixth direction DR6 may be substantially the same as a length X2 of each second dummy pixel driving unit DPU2 in the sixth direction DR6, but a length Y1 of each first dummy pixel driving unit DPU1 in the seventh direction DR7 may be longer than a length Y2 of each second dummy pixel driving unit DPU2 in the seventh direction DR7.

Figure 33:
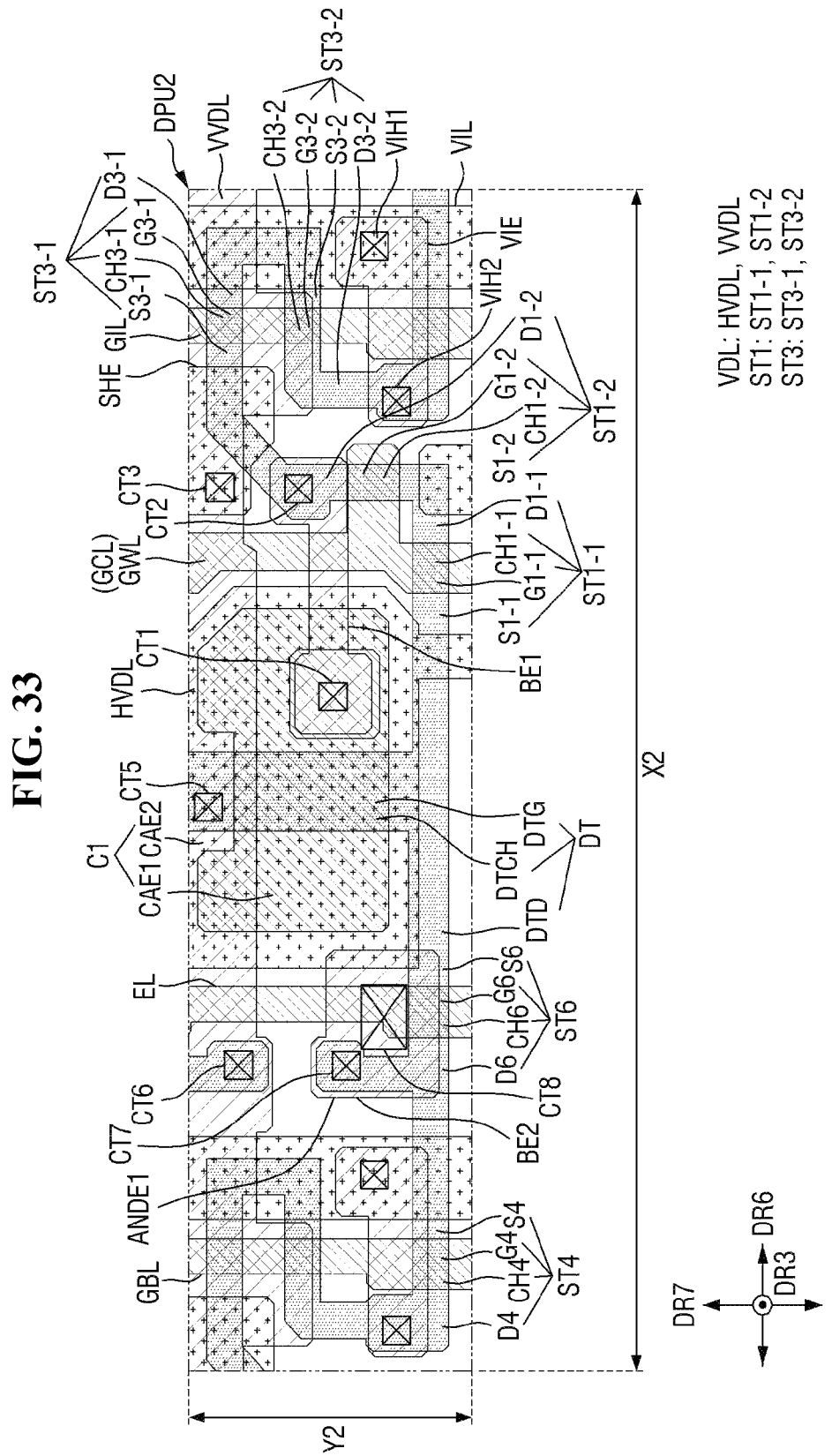

When the space on the upper side of the dummy area DMA is insufficient in the cutout pattern CP, an upper portion of each of the second dummy pixel driving units DPU2 may not be provided. For example, as illustrated in FIG. 33, each of the second dummy pixel driving units DPU2 may not include a second transistor ST2 and a fifth transistor ST5.

In one or more embodiments, when a space on the right side of the dummy area DMA is insufficient in the cutout pattern CP, the area of each of the third dummy pixel driving units DPU3 disposed on the right side of the dummy area DMA may be different from the area of each of the first dummy pixel driving units DPU1 disposed on the lower side of the dummy area DMA. When the space on the right side of the dummy area DMA is insufficient in the cutout pattern CP, the area of each of the third dummy pixel driving units DPU3 disposed on the right side of the dummy area DMA may be smaller than the area of each of the first dummy pixel driving units DPU1 disposed on the lower side of the dummy area DMA. For example, the length Y1 of each first dummy pixel driving unit DPU1 in the seventh direction DR7 may be substantially the same as a length Y3 of each third dummy pixel driving unit DPU3 in the seventh direction DR7, but the length X1 of each first dummy pixel driving unit DPU1 in the sixth direction DR6 may be longer than a length X3 of each third dummy pixel driving unit DPU3 in the sixth direction DR6.

Figure 34:
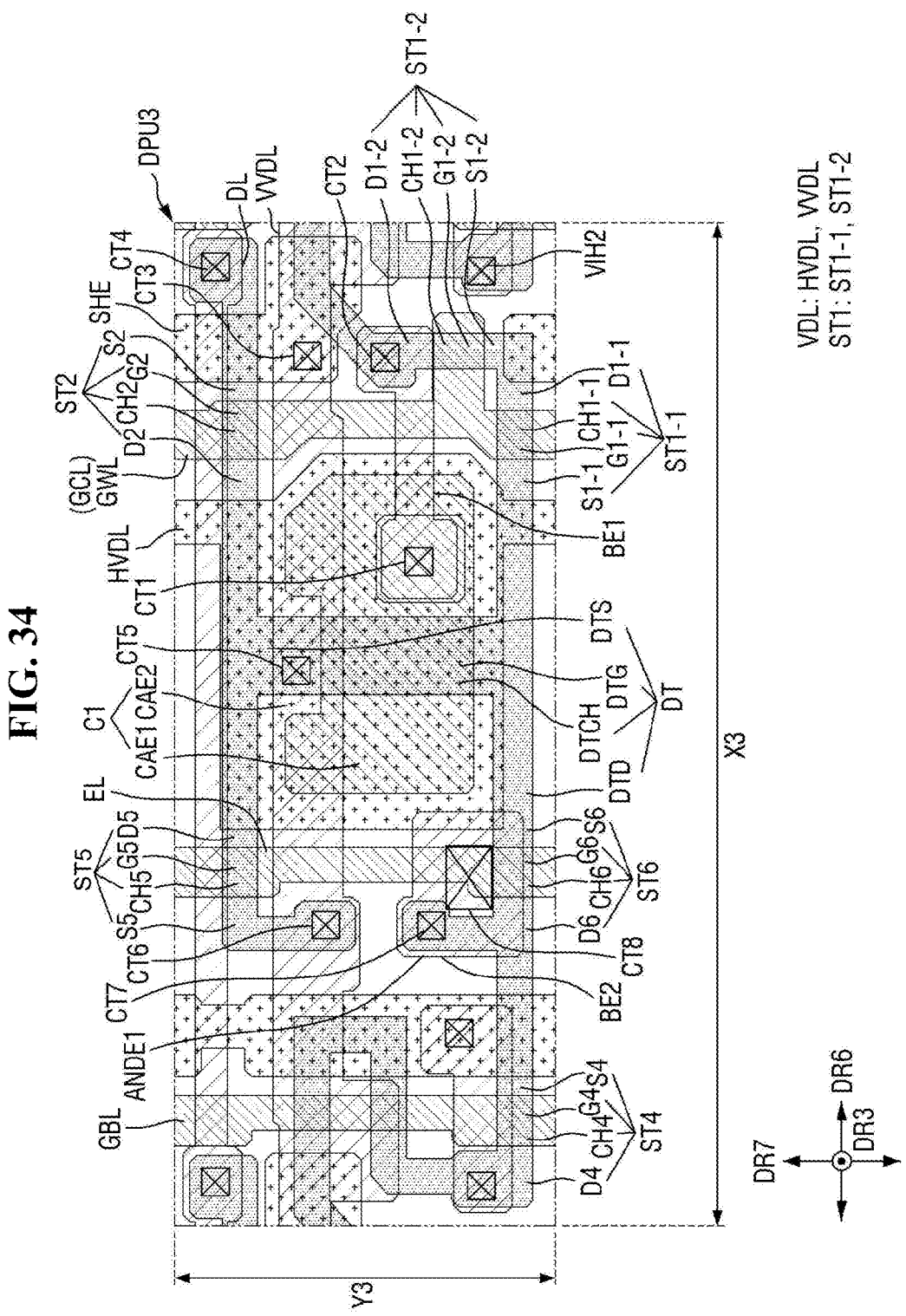

When the space on the right side of the dummy area DMA is insufficient in the cutout pattern CP, a right portion of each of the third dummy pixel driving units DPU3 may not be provided. For example, as illustrated in FIG. 34, each of the third dummy pixel driving units DPU3 may not include a third transistor ST3.

In one or more embodiments, when the space on both the upper and right sides of the dummy area DMA is insufficient in the cutout pattern CP, the area of the fourth dummy pixel driving unit DPU4 disposed at the corner where the upper side and the right side of the dummy area DMA meet may be different from the area of each of the first dummy pixel driving units DPU1 disposed on the lower side of the dummy area DMA. When the space on both the upper and right sides of the dummy area DMA is insufficient in the cutout pattern CP, the area of the fourth dummy pixel driving unit DPU4 disposed at the corner where the upper side and the right side of the dummy area DMA meet may be smaller than the area of each of the first dummy pixel driving units DPU1 disposed on the lower side of the area DMA. For example, the length X1 of each of the first dummy pixel driving units DPU1 in the sixth direction DR6 may be longer than a length X4 of the fourth dummy pixel driving unit DPU4 in the sixth direction DR6, and the length Y1 of each of the first dummy pixel driving units DPU1 in the seventh direction DR7 may be longer than a length Y4 of the fourth dummy pixel driving unit DPU4 in the seventh direction DR7.

The length X4 of the fourth dummy pixel driving unit DPU4 in the sixth direction DR6 may be substantially the same as the length X3 of each of the third dummy pixel driving units DPU3 in the sixth direction DR6. In one or more embodiments, the length Y4 of the fourth dummy pixel driving unit DPU4 in the seventh direction DR7 may be substantially the same as the length Y2 of each of the second dummy pixel driving units DPU2 in the seventh direction DR7.

Figure 35:
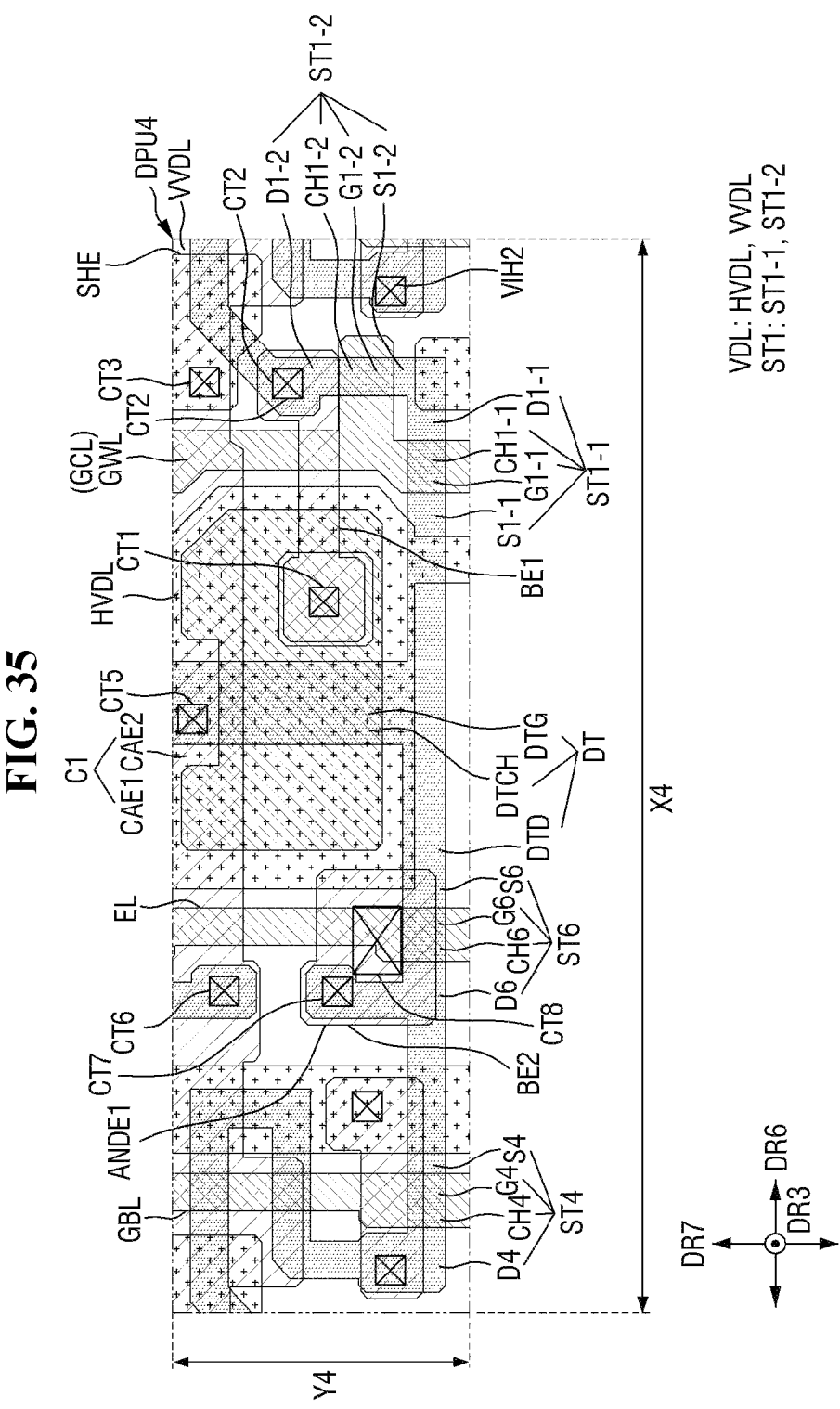

When the space on both the upper and right sides of the dummy area DMA is insufficient in the cutout pattern CP, an upper portion and a right portion of the fourth dummy pixel driving unit DPU4 may not be provided. For example, as illustrated in FIG. 35, the fourth dummy pixel driving unit DPU4 may not include a second transistor ST2, a third transistor ST3, and a fifth transistor ST5.

It will be understood by those of ordinary skill in the art that the aspects of the present disclosure are not restricted to the ones set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:
a substrate comprising a front portion, a first side portion extending from a first side of the front portion, a second side portion extending from a second side of the front portion, and a corner portion between the first side portion and the second side portion and having a cutout pattern;

a first display area comprising first pixels in the front portion; and a second display area comprising second pixels and dummy pixel drivers in the cutout pattern of the corner portion, wherein each of the second pixels comprises a subpixel light-emitting unit for emitting light and a subpixel driver connected to the subpixel light-emitting unit, and wherein any one of the dummy pixel drivers is closer to an edge of the cutout pattern than the subpixel driver of any one of the second pixels is to the edge of the cutout pattern, such that the any one of the dummy pixel drivers is between the subpixel driver of the any one of the second pixels and the first display area in plan view.

2. The display device of claim 1, wherein the second display area comprises a driving area in which the subpixel drivers of the second pixels are located and a dummy area in which the dummy pixel drivers are located, wherein the dummy area surrounds the driving area.

3. The display device of claim 1, further comprising a connection line connecting the subpixel light-emitting unit and the subpixel driver.

4. The display device of claim 3, wherein the connection line overlaps one or more of the dummy pixel drivers.

5. The display device of claim 1, wherein each of the dummy pixel drivers comprises:

a driving transistor;

a first transistor connected to a first electrode of the driving transistor;

a second transistor between a gate electrode and a second electrode of the driving transistor;

a third transistor between the gate electrode of the driving transistor and an initialization voltage line to which an initialization voltage is applied;

a fourth transistor between the second electrode of the driving transistor and the initialization voltage line; and a fifth transistor between the first electrode of the driving transistor and a first power line to which a first power supply voltage is applied.

6. The display device of claim 5, wherein at least one of a gate electrode of the first transistor, a gate electrode of the second transistor, a gate electrode of the third transistor, a gate electrode of the fourth transistor, and a gate electrode of the fifth transistor is connected to the first power line.

7. The display device of claim 5, wherein the gate electrode of the first transistor, the gate electrode of the second transistor, the gate electrode of the third transistor, the gate electrode of the fourth transistor, and the gate electrode of the fifth transistor are connected to the first power line.

8. The display device of claim 7, wherein a first electrode of the first transistor is connected to a data line to which a data voltage is applied.

9. The display device of claim 5, wherein the first electrode of the first transistor is connected to a dummy data line to which no voltage is applied.

10. The display device of claim 9, wherein the first electrode of the first transistor is connected to the first power line.

11. The display device of claim 1, wherein a length of the subpixel driver in one direction is the same as a length of any one of the dummy pixel drivers in the one direction.

12. The display device of claim 11, wherein a length of the subpixel driver in another direction is the same as a length of any one of the dummy pixel drivers in the other direction, and wherein the other direction is orthogonal to the one direction.

13. A display device comprising:

a substrate comprising a front portion, a first side portion extending from a first side of the front portion, a second side portion extending from a second side of the front portion, and a corner portion between the first side portion and the second side portion and having a cutout pattern;

a first display area comprising first pixels in the front portion; and a second display area comprising second pixels and dummy pixel drivers in the cutout pattern of the corner portion, wherein each of the second pixels comprises a subpixel light-emitting unit for emitting light and a subpixel driver connected to the subpixel light-emitting unit, and wherein any one of the dummy pixel drivers is closer to an edge of the cutout pattern than the subpixel driver of any one of the second pixels is to the edge of the cutout pattern, and wherein the dummy pixel drivers overlap the subpixel light-emitting unit.

14. A display device comprising:

a substrate comprising a front portion, a first side portion extending from a first side of the front portion, a second side portion extending from a second side of the front portion, and a corner portion between the first side portion and the second side portion and having a cutout pattern;

a first display area comprising first pixels in the front portion; and a second display area comprising second pixels and dummy pixel drivers in the cutout pattern of the corner portion, wherein each of the second pixels comprises a subpixel light-emitting unit for emitting light and a subpixel driver connected to the subpixel light-emitting unit, and wherein any one of the dummy pixel drivers is closer to an edge of the cutout pattern than the subpixel driver of any one of the second pixels is to the edge of the cutout pattern, and wherein an area of the subpixel driver is the same as an area of any one of the dummy pixel drivers.

* * * * *